(12) United States Patent
Chang et al.

(10) Patent No.: US 11,489,057 B2
(45) Date of Patent: Nov. 1, 2022

(54) CONTACT STRUCTURES IN SEMICONDUCTOR DEVICES

(71) Applicant: Taiwan Semiconductor Manufacturing Co., Ltd., Hsinchu (TW)

(72) Inventors: Hsu-Kai Chang, Hsinchu (TW); Jhih-Rong Huang, Hsinchu (TW); Yen-Tien Tung, Hsinchu (TW); Chia-Hung Chu, Taipei (TW); Shuen-Shin Liang, Hsinchu (TW); Tzer-Min Shen, Hsinchu (TW); Pinyen Lin, Rochester, NY (US); Sung-Li Wang, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/143,771

(22) Filed: Jan. 7, 2021

(65) Prior Publication Data

US 2022/0045188 A1 Feb. 10, 2022

Related U.S. Application Data

(60) Provisional application No. 63/062,821, filed on Aug. 7, 2020.

(51) Int. Cl.
*H01L 29/45* (2006.01)
*H01L 27/092* (2006.01)
(Continued)

(52) U.S. Cl.
CPC ........ *H01L 29/45* (2013.01); *H01L 21/28518* (2013.01); *H01L 21/823814* (2013.01);
(Continued)

(58) Field of Classification Search
CPC ............... H01L 29/45; H01L 21/28518; H01L 21/823814; H01L 21/823821;
(Continued)

(56) References Cited

U.S. PATENT DOCUMENTS 5,856,237 A   1/1999  Ku
6,204,170 B1  3/2001  Taguwa
(Continued)

FOREIGN PATENT DOCUMENTS

KR   20000000869 A   1/2000
KR      100538806 B1  12/2005
(Continued)

OTHER PUBLICATIONS

U.S. Appl. No. 16/354,259, "Selective Dual Silicide Formation," to Chu et al., filed Mar. 2019.
(Continued)

*Primary Examiner* — Karen Kusumakar
*Assistant Examiner* — Adam S Bowen
(74) *Attorney, Agent, or Firm* — Sterne, Kessler, Goldstein & Fox P.L.L.C.

(57) ABSTRACT

A semiconductor device with different configurations of contact structures and a method of fabricating the same are disclosed. The semiconductor device includes first and second gate structures disposed on first and second fin structures, first and second source/drain (S/D) regions disposed on the first and second fin structures, first and second contact structures disposed on the first and second S/D regions, and a dipole layer disposed at an interface between the first nWFM silicide layer and the first S/D region. The first contact structure includes a first nWFM silicide layer disposed on the first S/D region and a first contact plug disposed on the first nWFM silicide layer. The second contact structure includes a pWFM silicide layer disposed
(Continued)

on the second S/D region, a second nWFM silicide layer disposed on the pWFM silicide layer, and a second contact plug disposed on the pWFM silicide layer.

20 Claims, 47 Drawing Sheets

(51) Int. Cl.
*H01L 29/08* (2006.01)
*H01L 29/417* (2006.01)
*H01L 29/66* (2006.01)
*H01L 21/285* (2006.01)
*H01L 21/8238* (2006.01)
*H01L 29/78* (2006.01)

(52) U.S. Cl.
CPC ........... *H01L 21/823821* (2013.01); *H01L 21/823871* (2013.01); *H01L 27/0924* (2013.01); *H01L 29/0847* (2013.01); *H01L 29/41791* (2013.01); *H01L 29/66795* (2013.01); *H01L 29/7851* (2013.01)

(58) Field of Classification Search
CPC ......... H01L 21/823871; H01L 27/0924; H01L 29/0847; H01L 29/41791; H01L 29/66795; H01L 29/7851
See application file for complete search history.

(56) References Cited

U.S. PATENT DOCUMENTS

| | | |
|---|---|---|
| 6,461,960 B2 | 10/2002 | Lee |
| 7,868,458 B2 | 1/2011 | Lee et al. |
| 8,772,109 B2 | 7/2014 | Colinge |
| 8,785,285 B2 | 7/2014 | Tsai et al. |
| 8,796,666 B1 | 8/2014 | Huang et al. |
| 8,815,712 B2 | 8/2014 | Wan et al. |
| 8,816,444 B2 | 8/2014 | Wann et al. |
| 8,823,065 B2 | 9/2014 | Wang et al. |
| 8,860,148 B2 | 10/2014 | Hu et al. |
| 8,963,258 B2 | 2/2015 | Yu et al. |
| 9,093,530 B2 | 7/2015 | Huang et al. |
| 9,105,490 B2 | 8/2015 | Wang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,303 B2 | 1/2017 | Lee et al. |
| 9,548,366 B1 | 1/2017 | Ho et al. |
| 9,564,489 B2 | 2/2017 | Yeo et al. |
| 9,576,814 B2 | 2/2017 | Wu et al. |
| 9,595,592 B1* | 3/2017 | Ok .................. H01L 29/456 |
| 9,601,342 B2 | 3/2017 | Lee et al. |
| 9,608,116 B2 | 3/2017 | Ching et al. |
| 9,831,183 B2 | 11/2017 | Lin et al. |
| 9,837,510 B2 | 12/2017 | Chang et al. |
| 9,859,386 B2 | 1/2018 | Ho et al. |
| 9,876,112 B2 | 1/2018 | Huang et al. |
| 10,079,210 B2 | 9/2018 | Lee et al. |
| 10,428,421 B2 | 10/2019 | Haukka et al. |
| 10,998,241 B2 | 5/2021 | Khaderbad et al. |
| 2015/0132939 A1 | 5/2015 | Hasegawa et al. |
| 2016/0365446 A1 | 12/2016 | Chang et al. |
| 2018/0130704 A1* | 5/2018 | Li .................. H01L 21/823835 |
| 2019/0067013 A1 | 2/2019 | Wang et al. |
| 2019/0115451 A1* | 4/2019 | Lee .................. H01L 21/02532 |

FOREIGN PATENT DOCUMENTS

| | | |
|---|---|---|
| KR | 20160062717 A | 6/2016 |
| KR | 20160100181 A | 8/2016 |
| KR | 20170042938 A | 4/2017 |
| KR | 20200033738 A | 3/2020 |
| TW | 201712140 A | 4/2017 |
| TW | 201724273 A | 7/2017 |
| WO | WO-2017052610 A1 | 3/2017 |

OTHER PUBLICATIONS

Office action directed to related Korean patent application KR20210030044, dated Jun. 18, 2022; 8 pages.

* cited by examiner

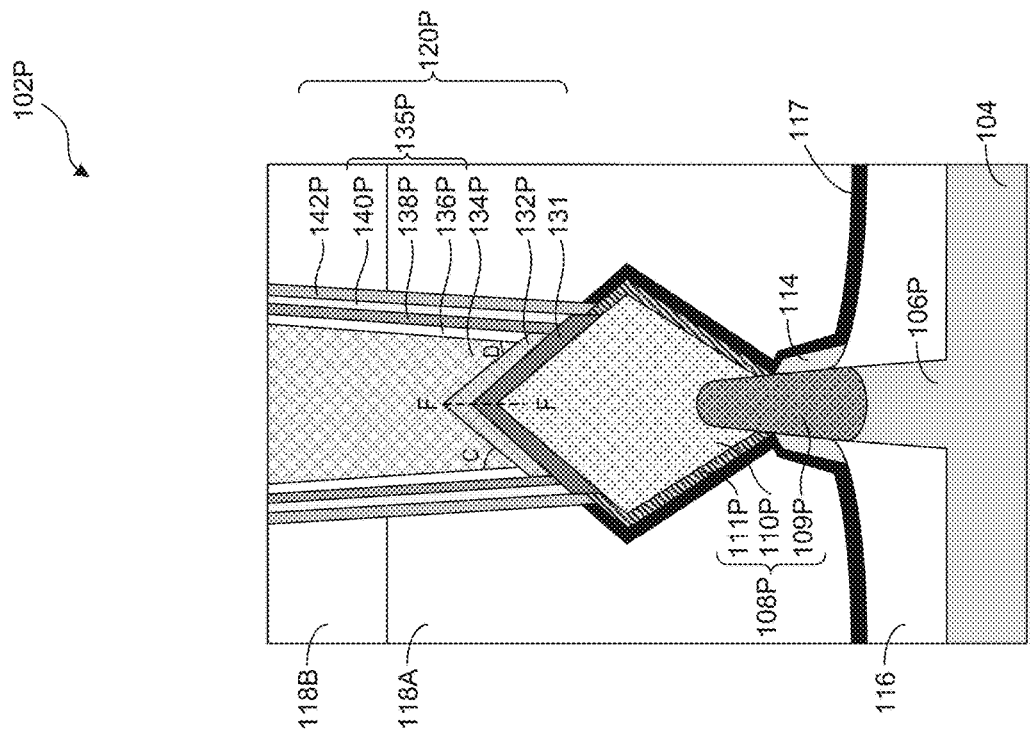
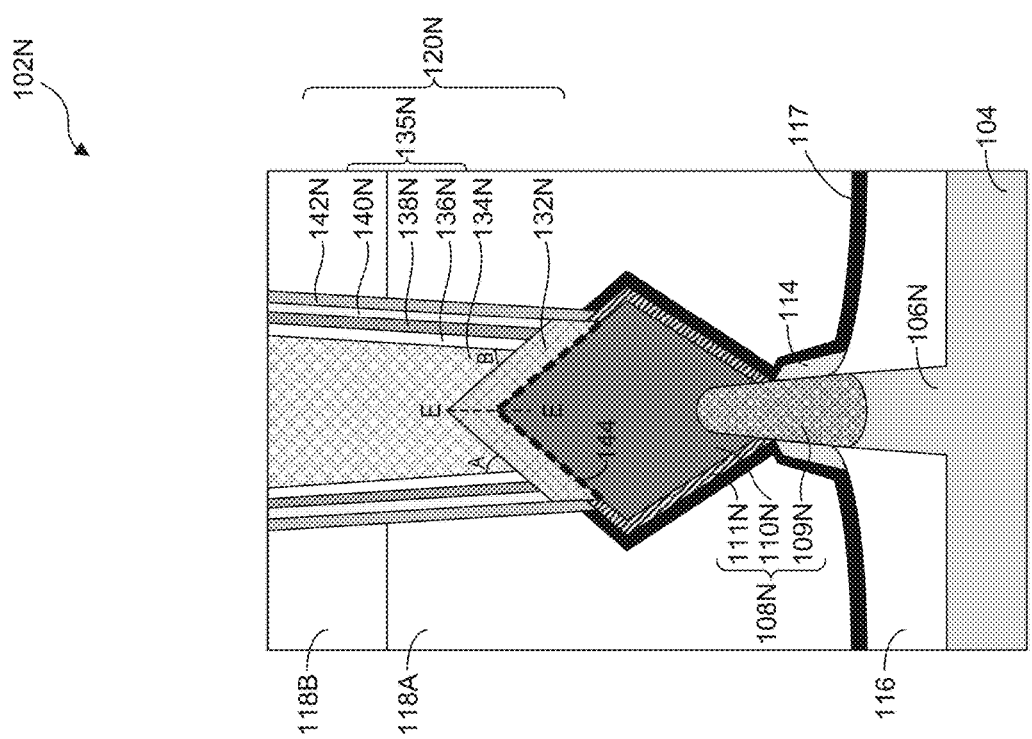
Fig. 2C
Fig. 2D

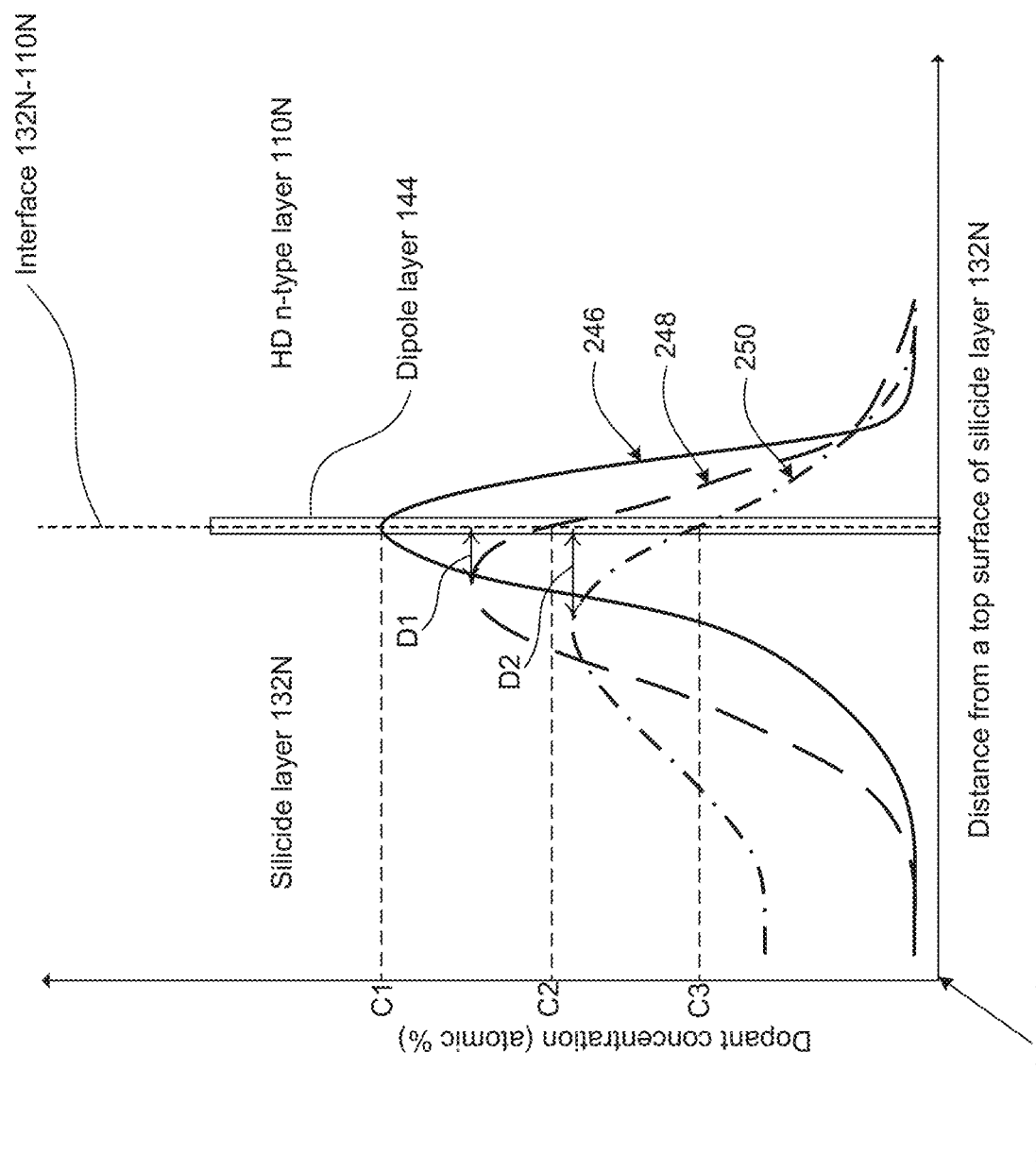

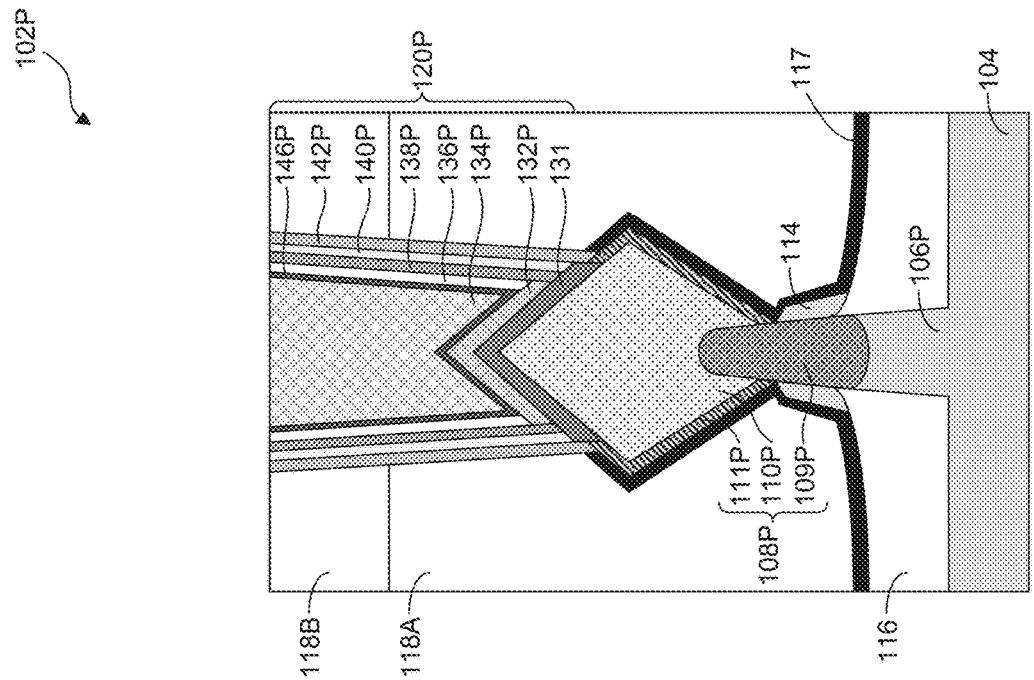
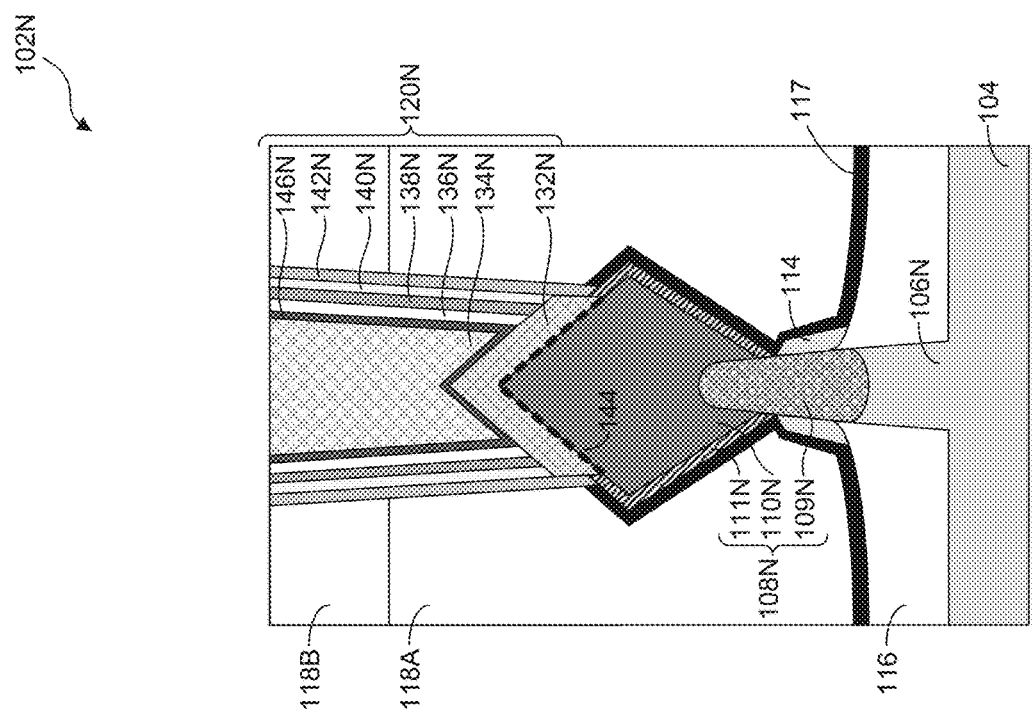
Fig. 4C
Fig. 4D

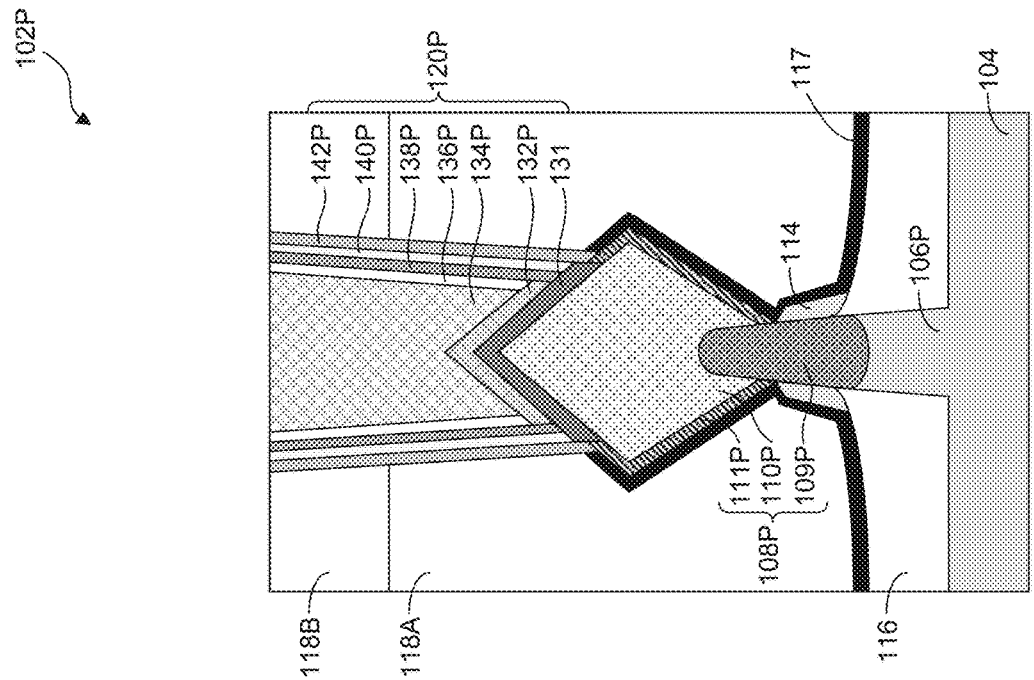
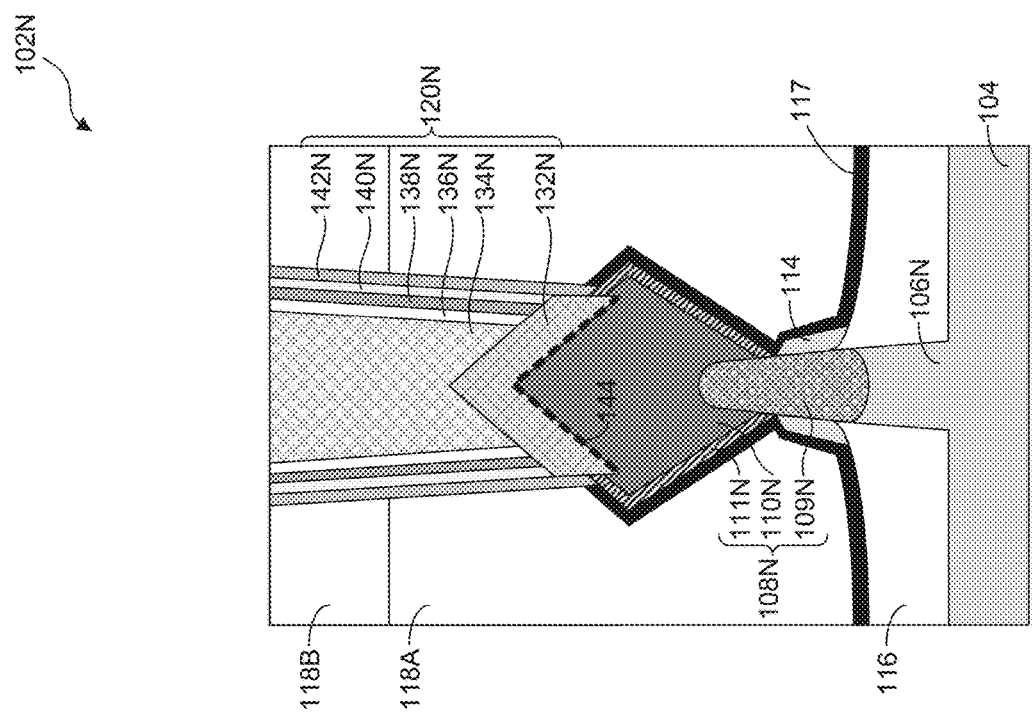
Fig. 5C
Fig. 5D

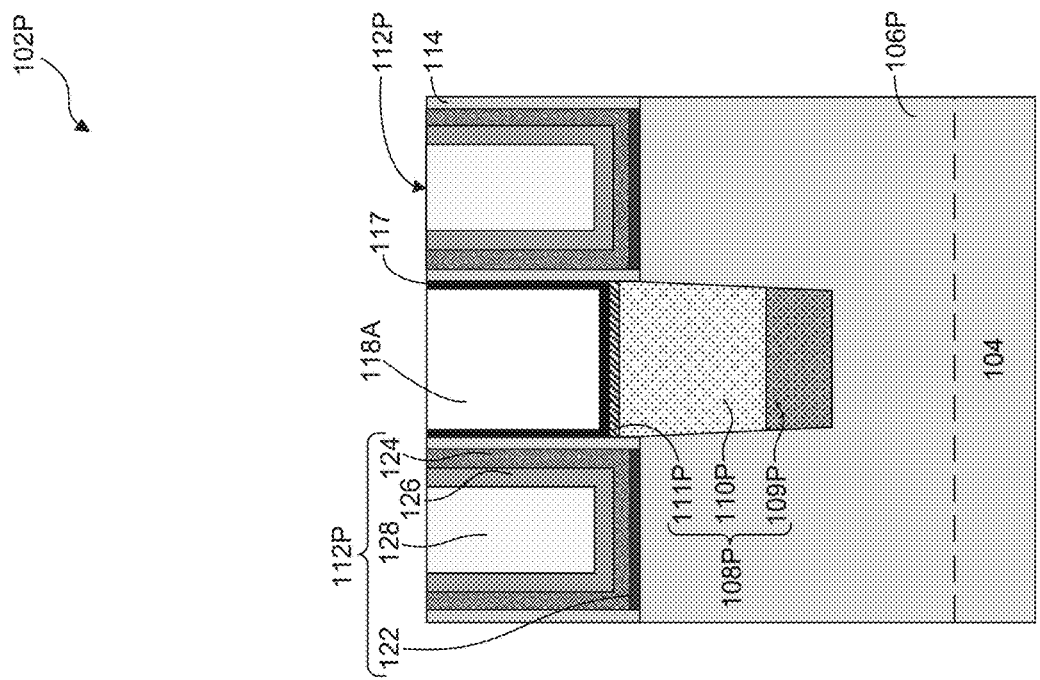
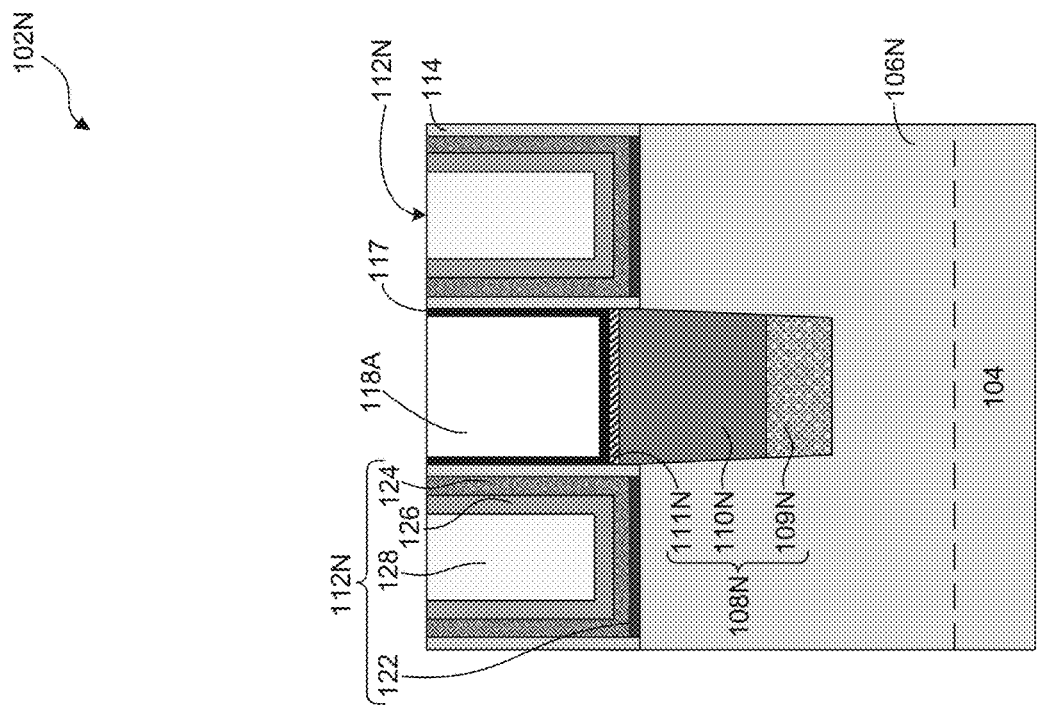
Fig. 8A
Fig. 8B

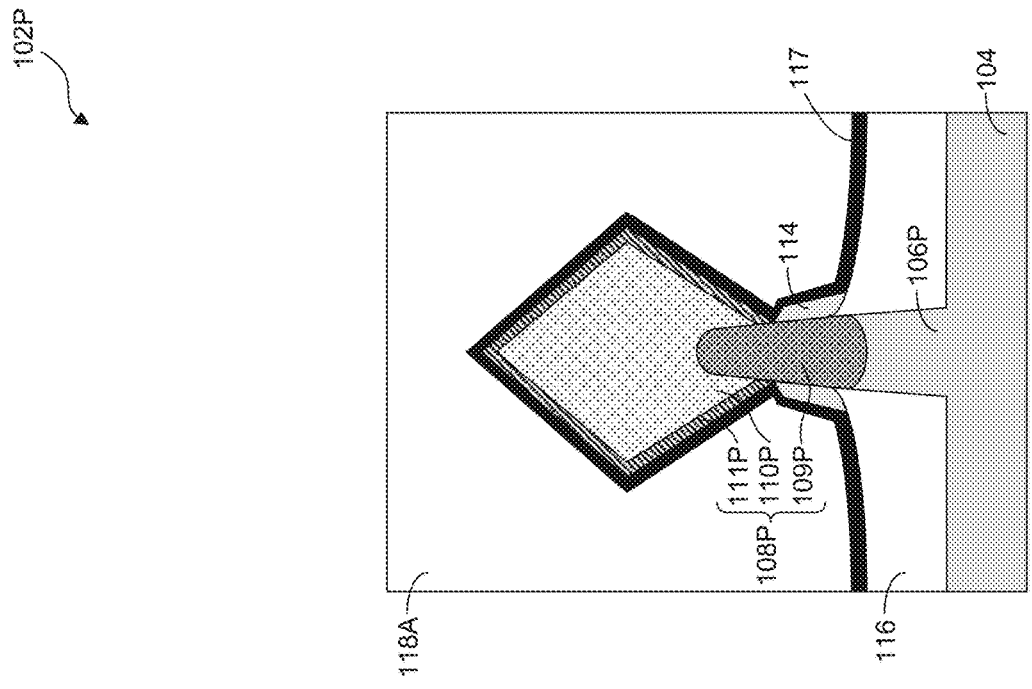
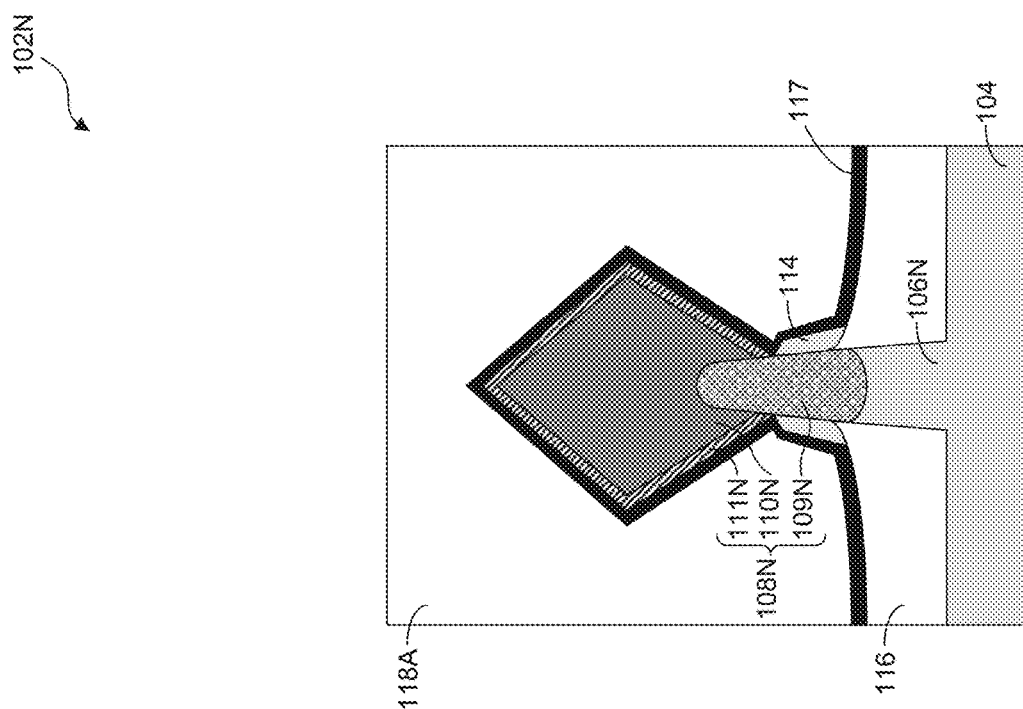

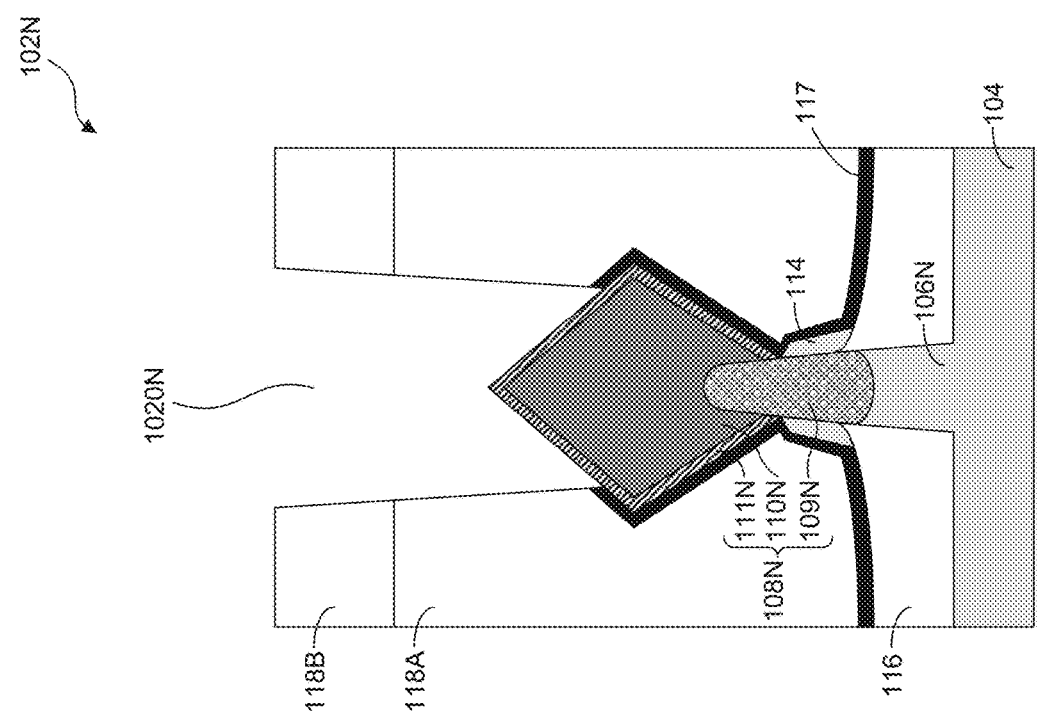
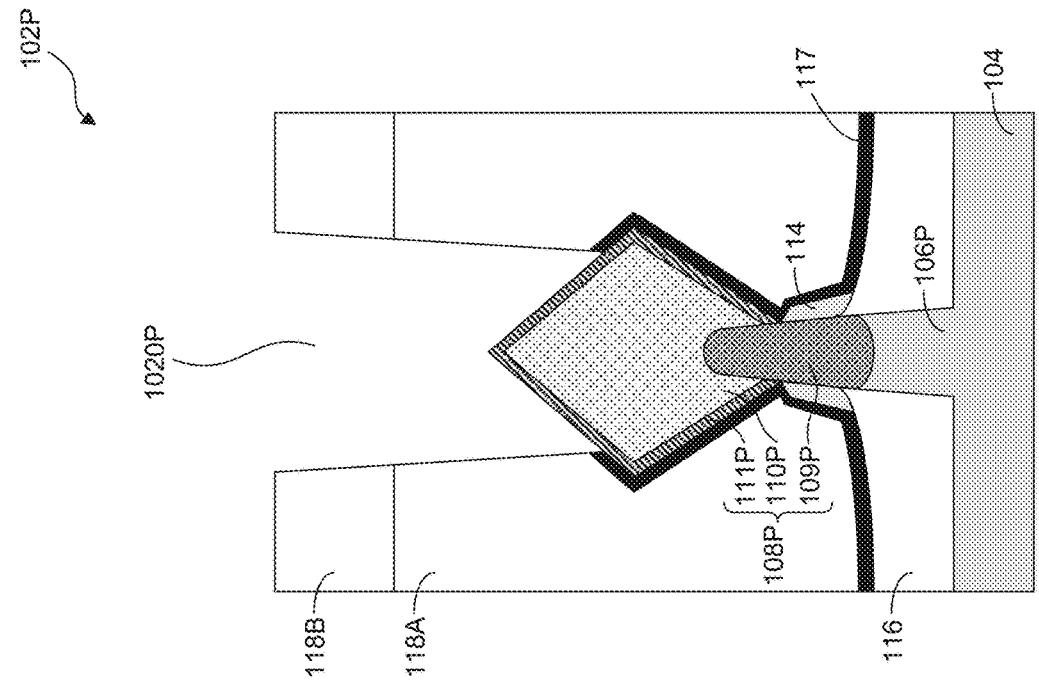
Fig. 10C
Fig. 10D

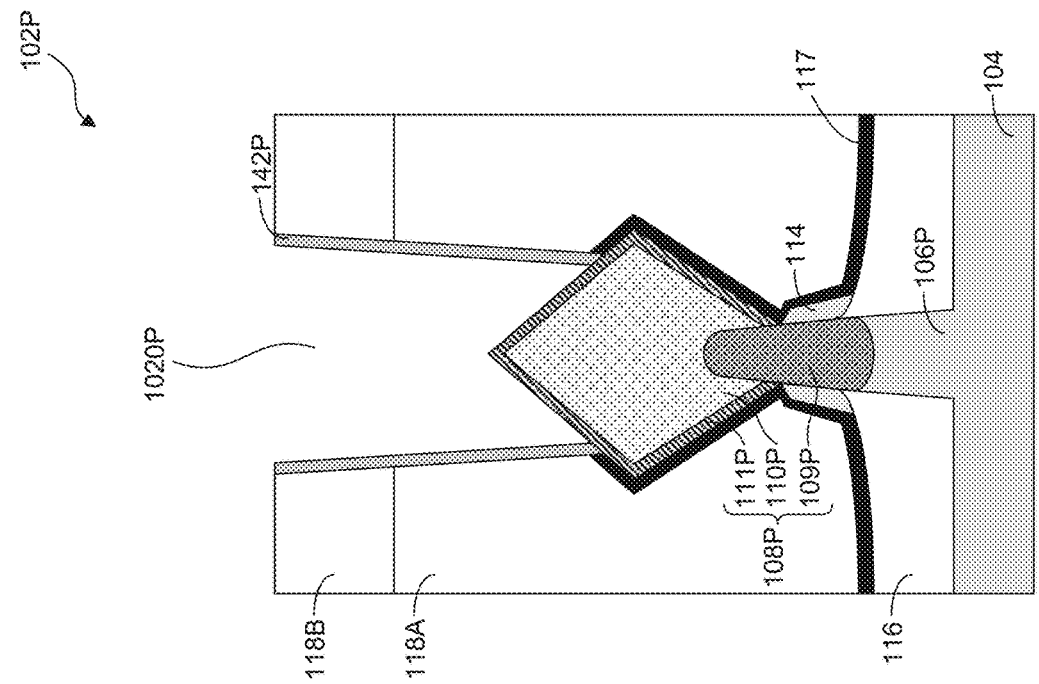
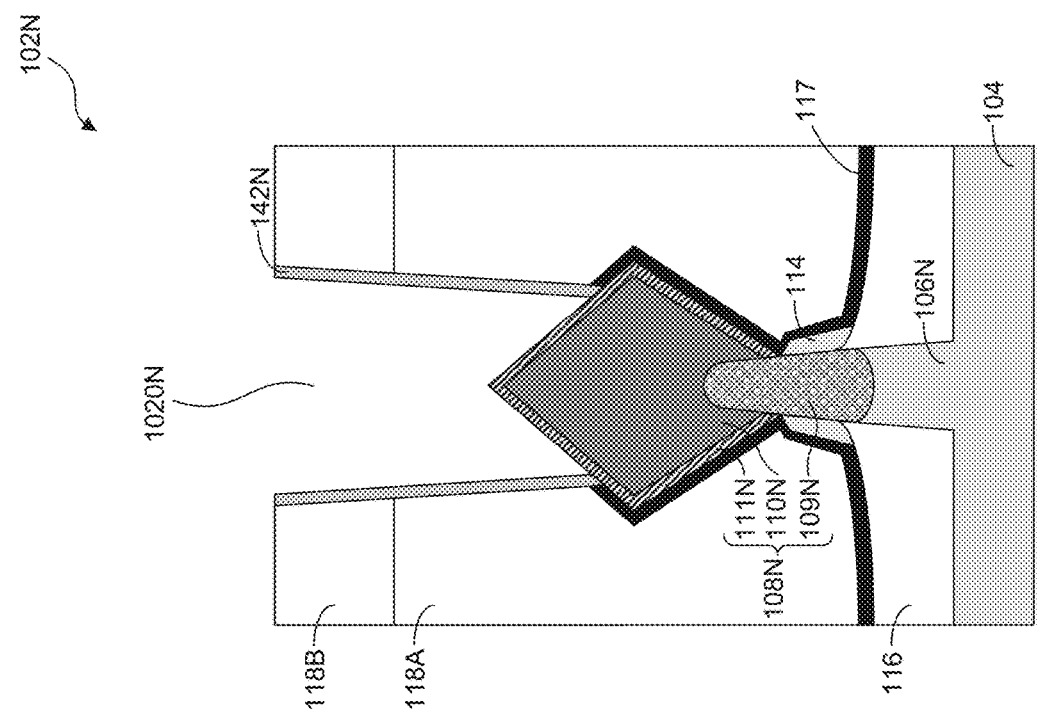
Fig. 12C
Fig. 12D

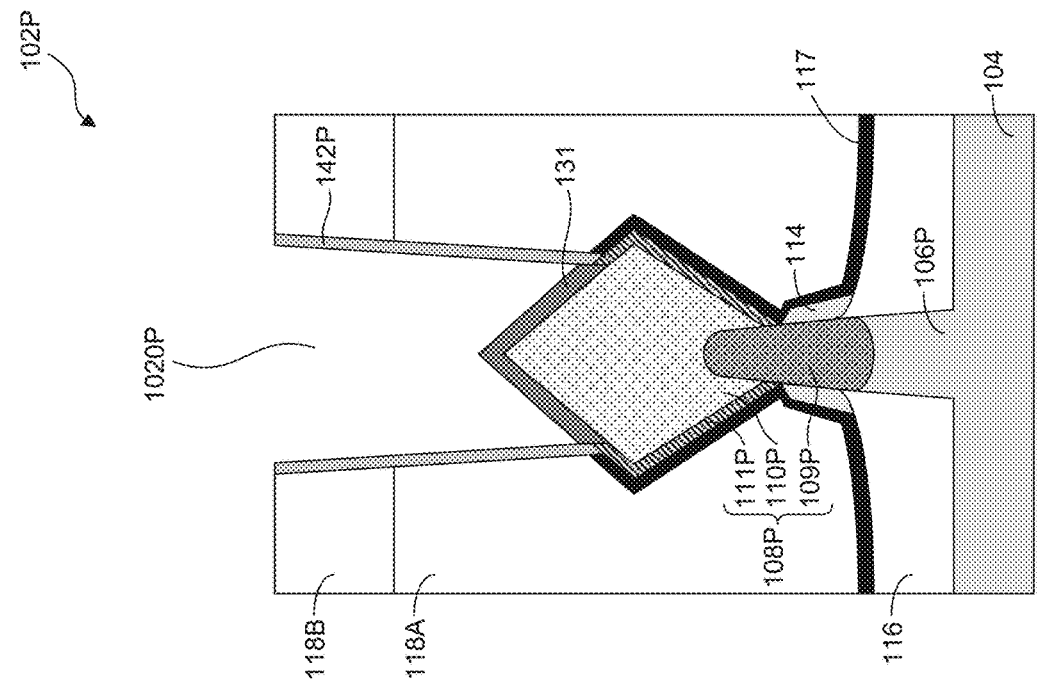
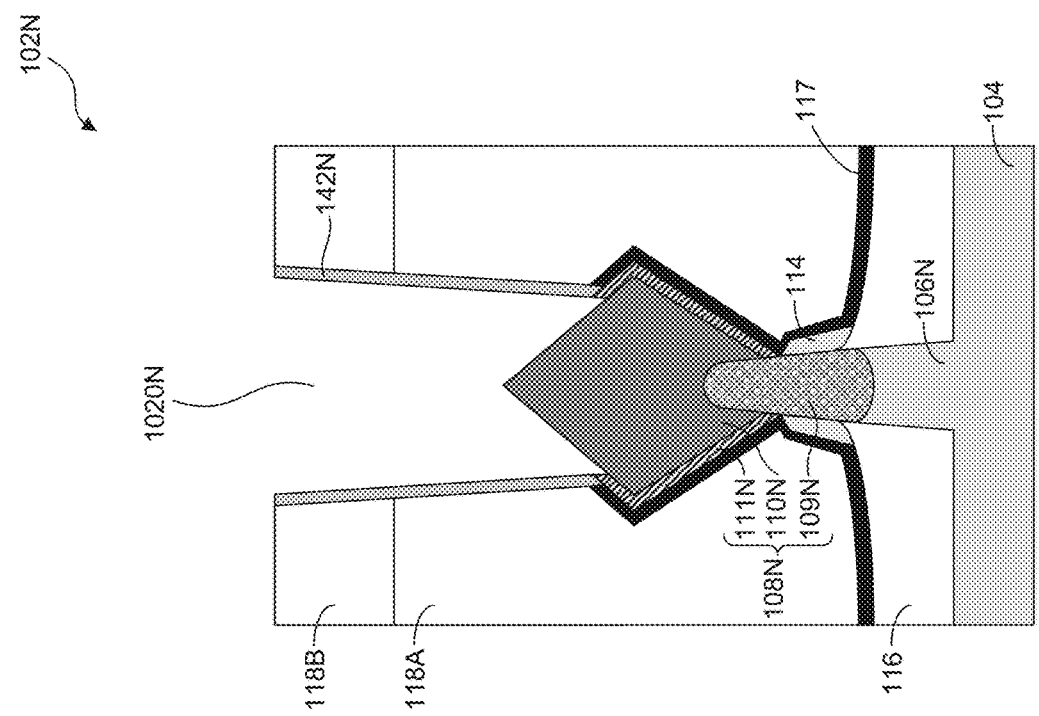
Fig. 15C
Fig. 15D

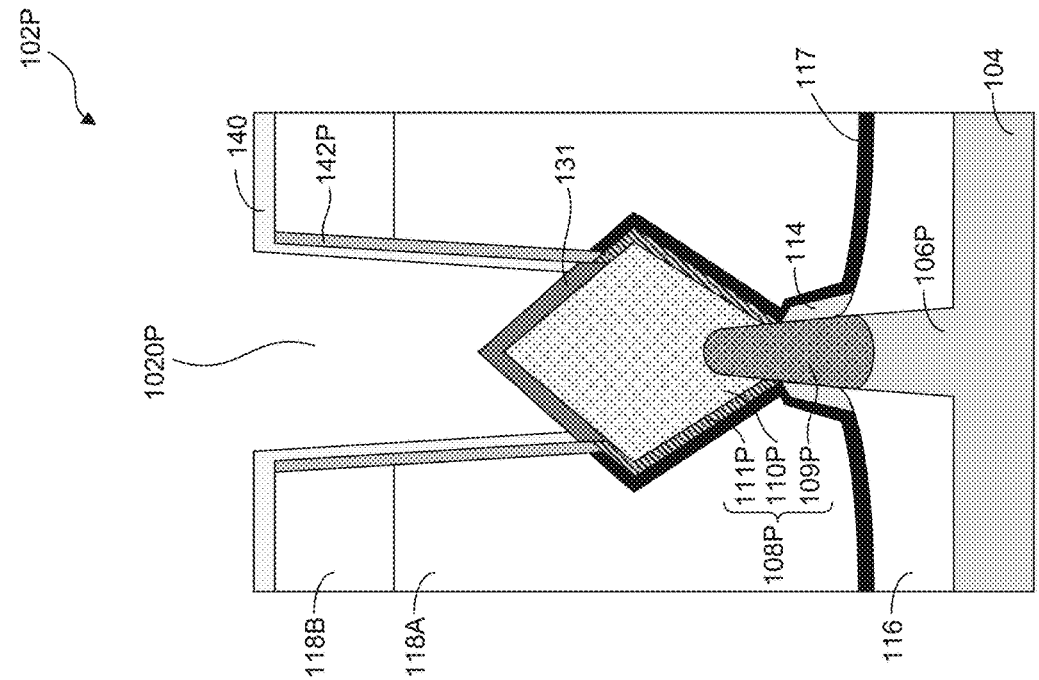
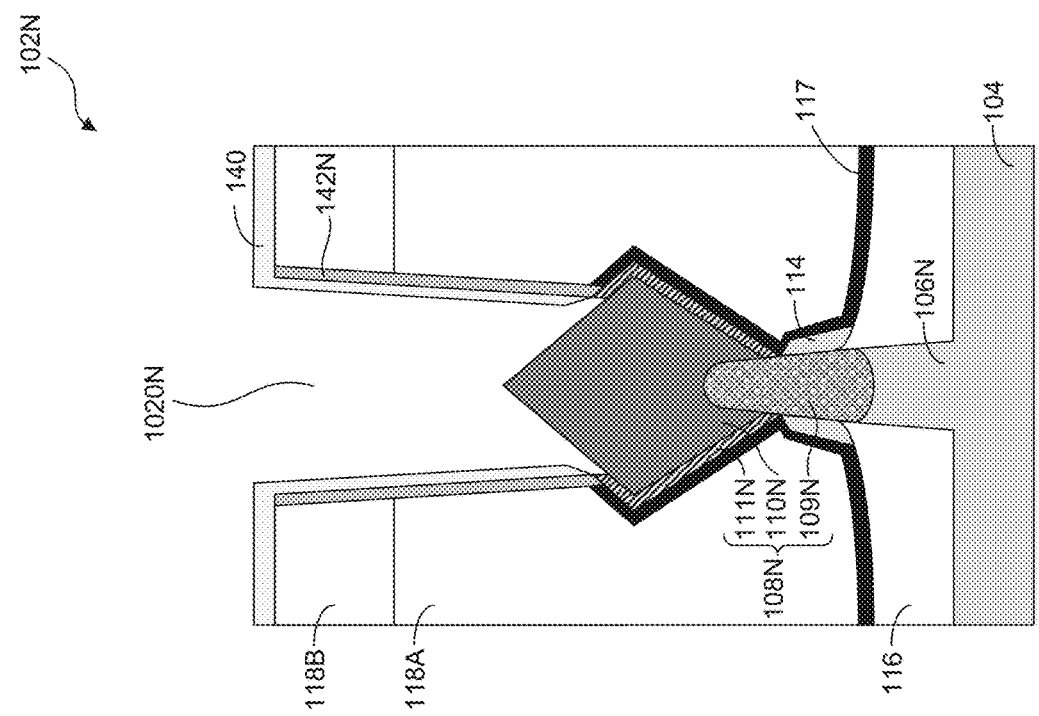
Fig. 16C
Fig. 16D

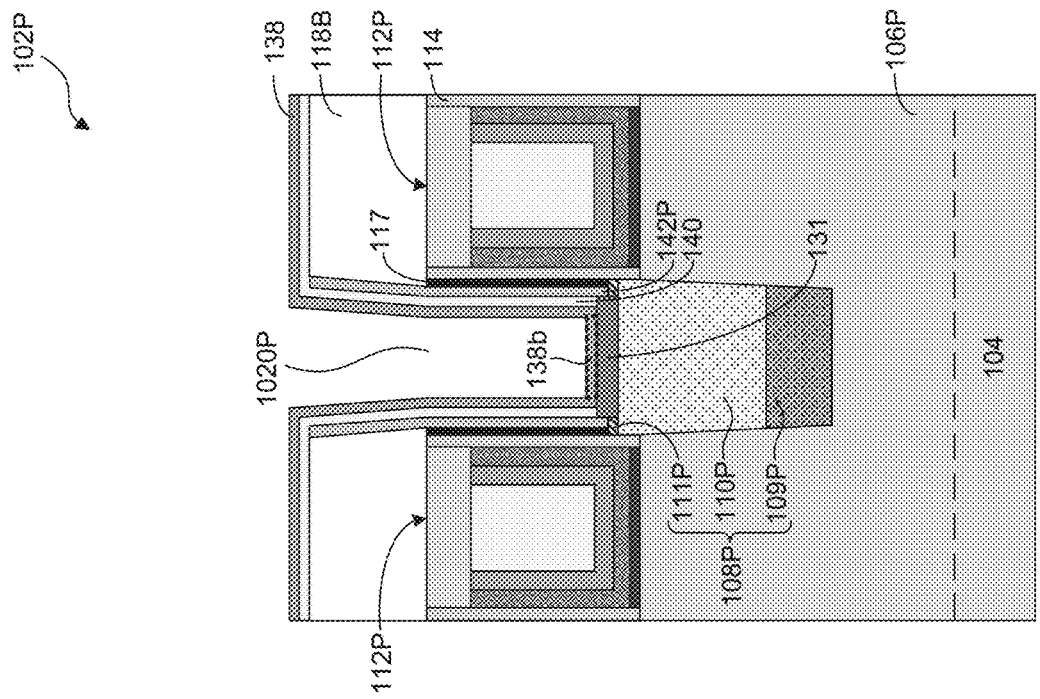
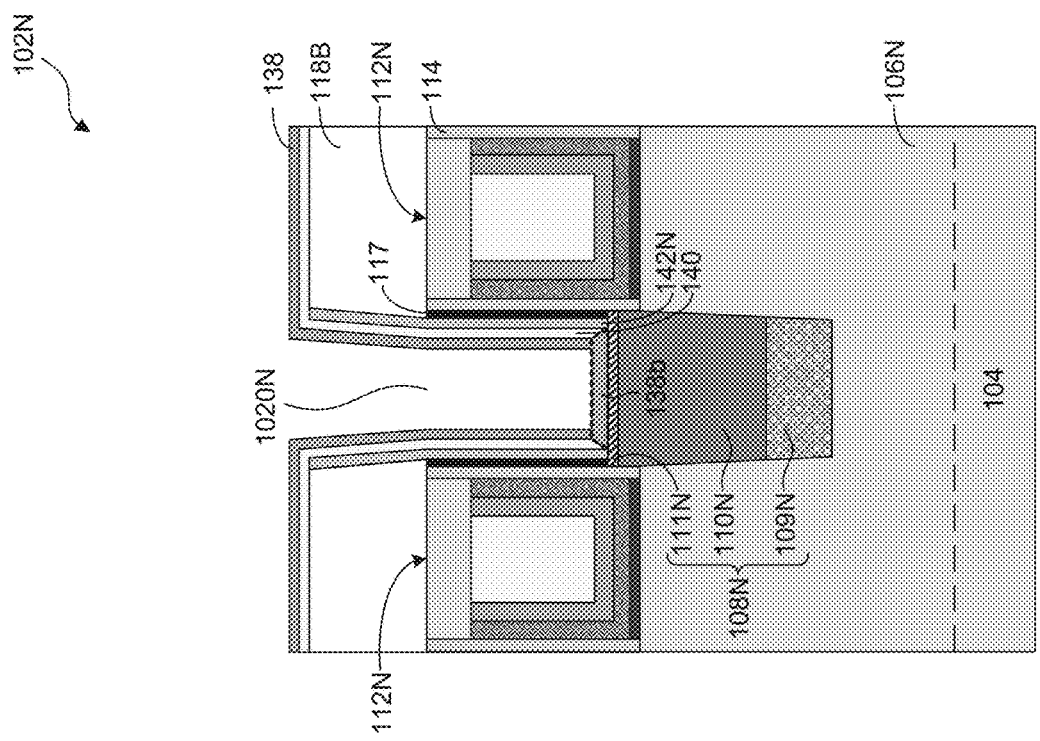
FIG. 17B
FIG. 17A

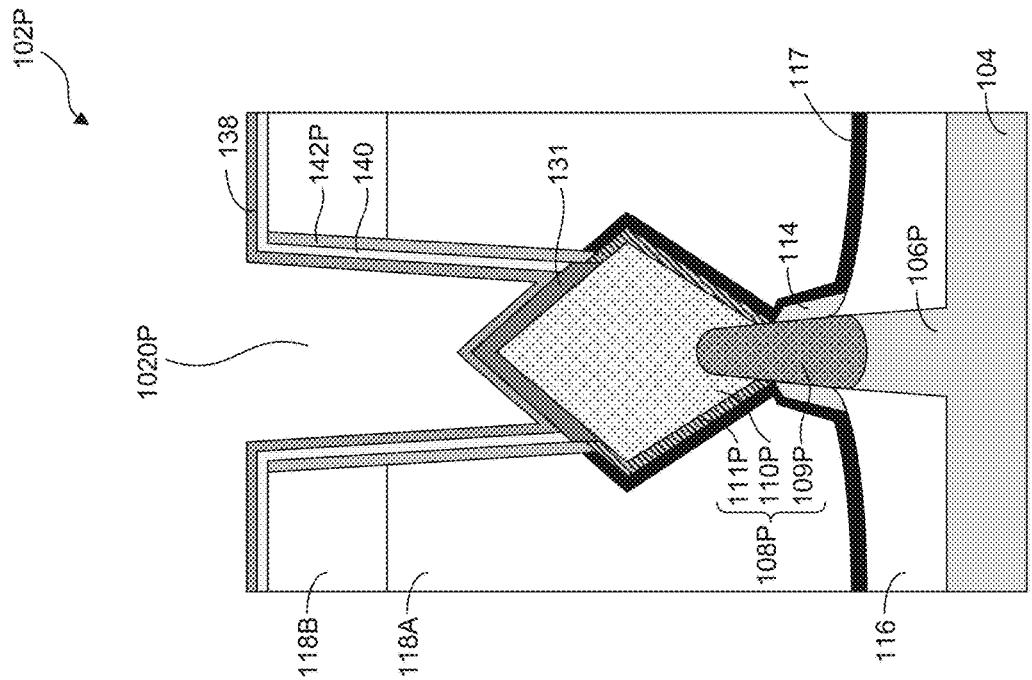
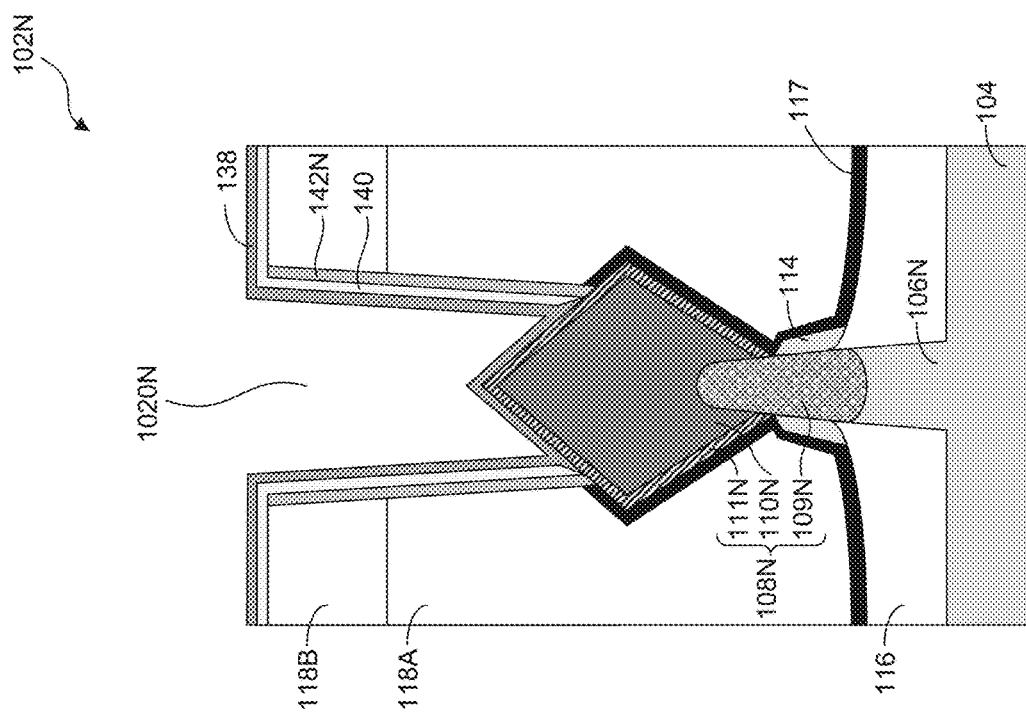
Fig. 17C
Fig. 17D

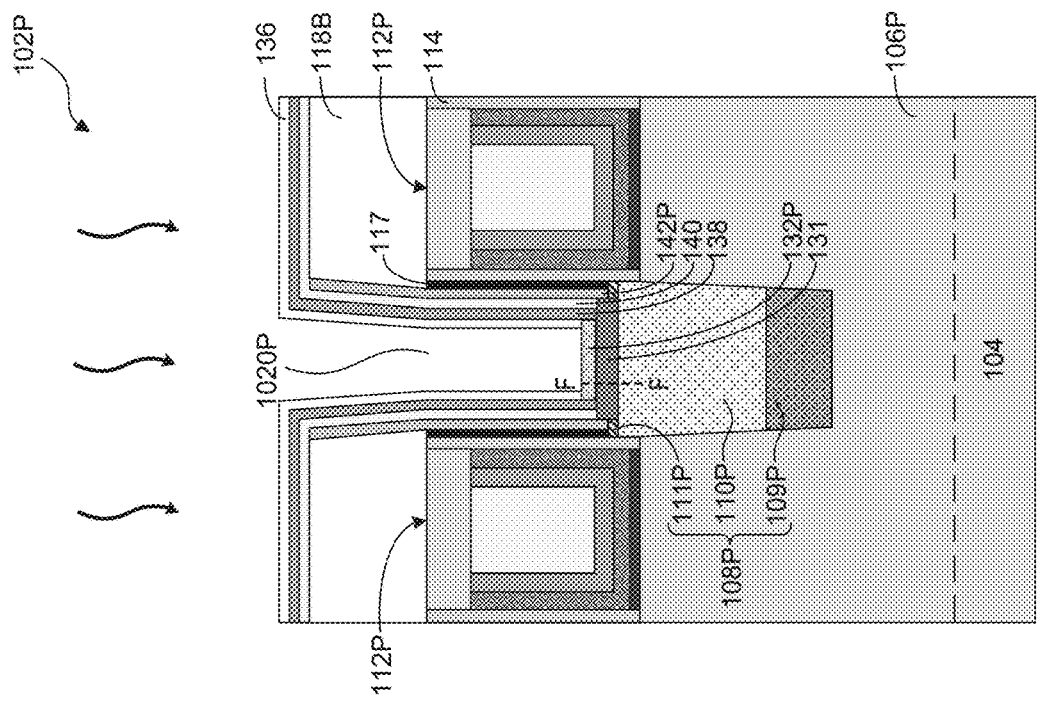
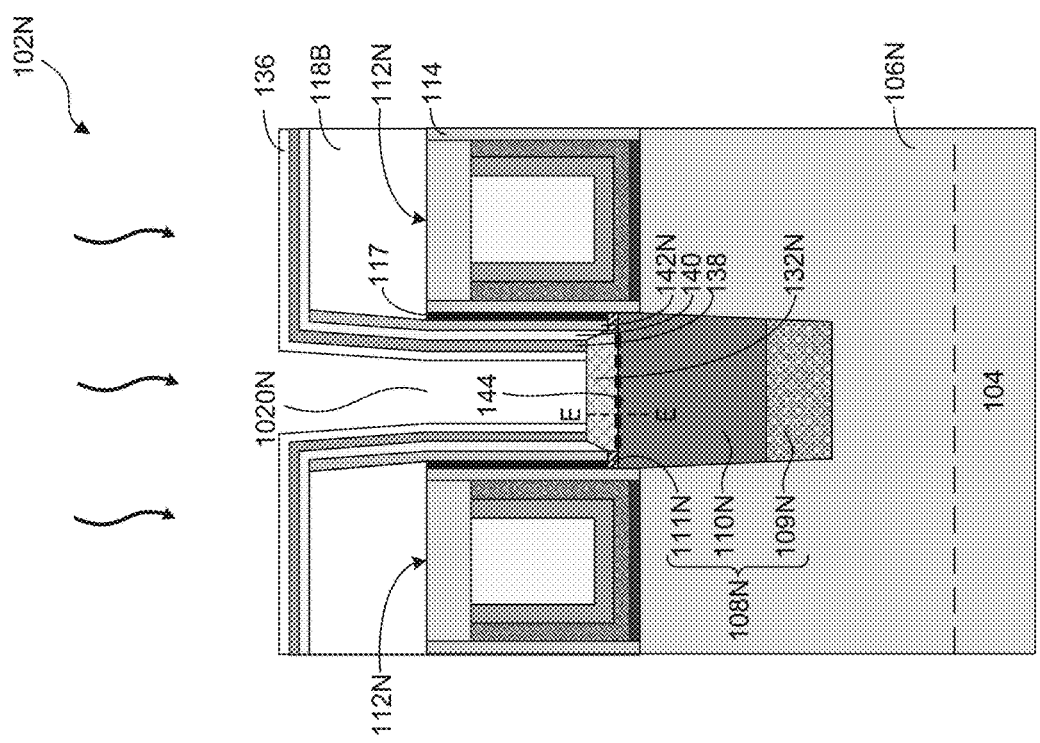
FIG. 19B
FIG. 19A

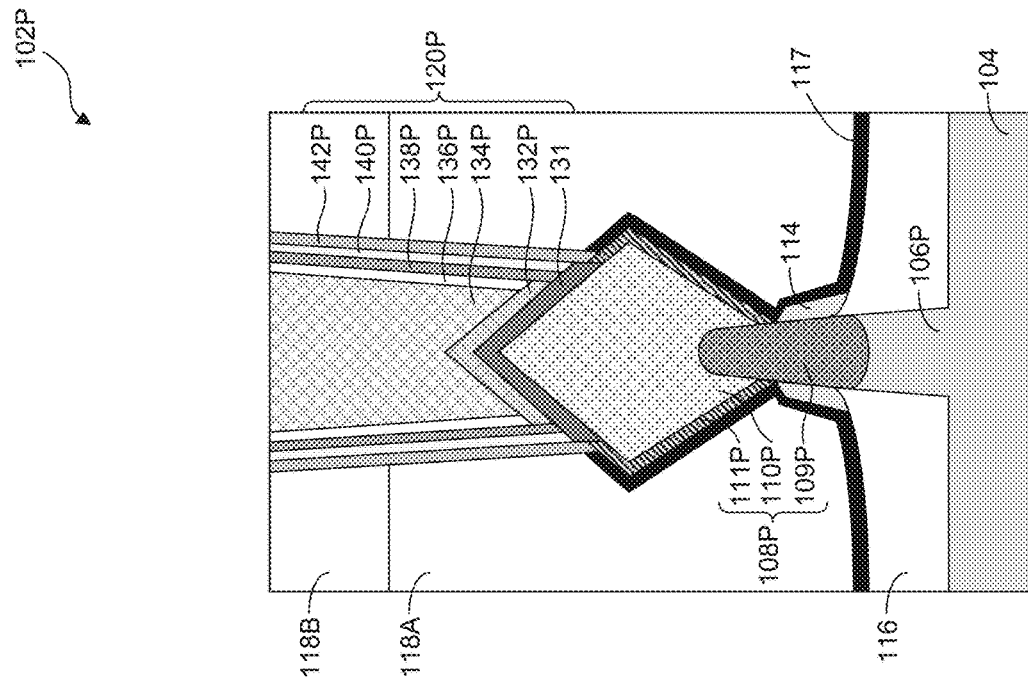
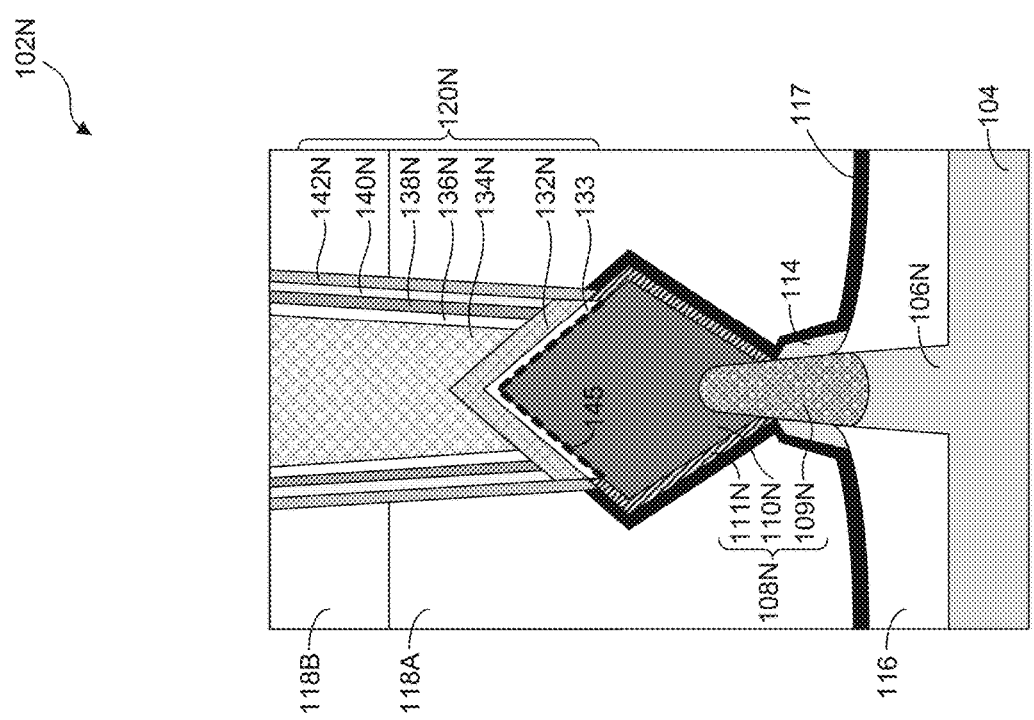
Fig. 22C
Fig. 22D

CONTACT STRUCTURES IN SEMICONDUCTOR DEVICES

CROSS-REFERENCE TO RELATED APPLICATIONS

This application claims the benefit of U.S. Provisional Patent Application No. 63/062,821, titled "Semiconductor Structure and Method for Manufacturing the Same," filed Aug. 7, 2020, the disclosure of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures.

FIGS. 2A-2D, 3A-3D, 4A-4D, and 5A-5D illustrate cross-sectional views of a semiconductor device with different contact structures, in accordance with some embodiments.

FIGS. 2E-2F and 3E illustrate device characteristics of a semiconductor device with different contact structures, in accordance with some embodiments.

FIGS. 7A-23D illustrate cross-sectional views of a semiconductor device with different contact structures at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1:
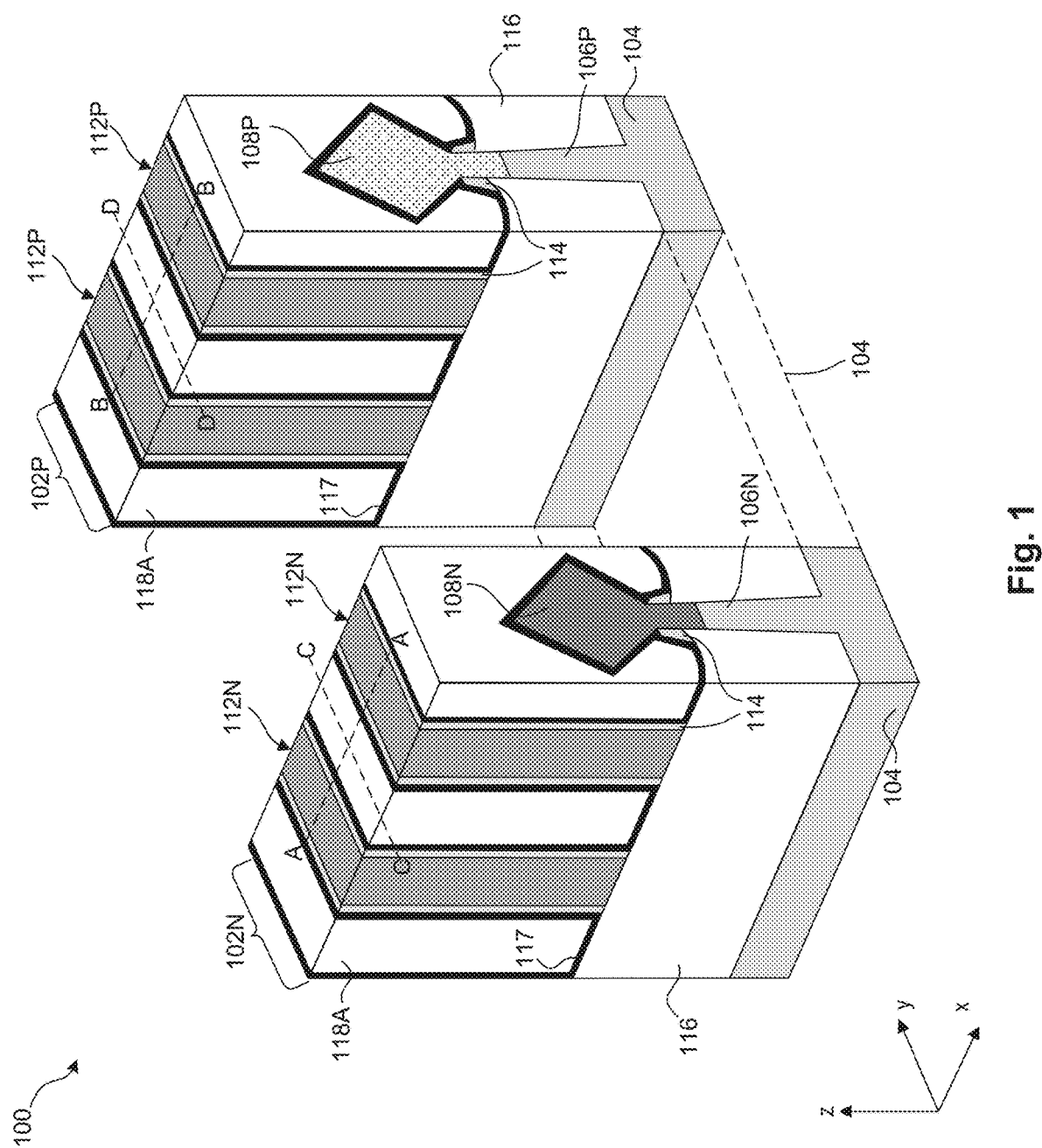
FIG. 1 illustrates an isometric view of a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides example semiconductor devices with FETs (e.g., finFETs) having source/drain (S/D) contact structures different from each other and provides example methods of forming such FETs on the same substrate with reduced contact resistance between S/D regions and S/D contact structures. The example method forms arrays of n- and p-type S/D regions on fin structures of n-type FETs (NFETs) and p-type FETs (PFETs), respectively, of the semiconductor device. In some embodiments, S/D contact structures on n-type S/D regions have silicide layers different from silicide layers of p-type S/D contact structures on p-type S/D regions.

The contact resistances between the S/D regions and the S/D contact structures are directly proportional to the Schottky barrier heights (SBHs) between the materials of the S/D regions and the silicide layers of the S/D contact structures. For n-type S/D regions, reducing the difference between the work function value of the silicide layers and the conduction band energy of the n-type material of the S/D regions can reduce the SBH between the n-type S/D regions and the S/D contact structures. In contrast, for p-type S/D regions, reducing the difference between the work function value of the silicide layers and the valence band energy of the p-type material of the S/D regions can reduce the SBH between the p-type S/D regions and the S/D contact structures. In some embodiments, since the S/D regions of NFETs and PFETs are formed with respective n-type and p-type materials, the S/D contact structures of NFETs and PFETs are formed with silicide layers different from each other to reduce the contact resistances between the S/D contact structures and the different materials of the S/D regions.

In some embodiments, the NFET S/D contact structures are formed with n-type work function metal (nWFM) silicide layers (e.g., titanium silicide) that have a work function value closer to a conduction band energy than a valence band energy of the n-type S/D regions. In contrast, the PFET S/D contact structures are formed with p-type WFM (pWFM) silicide layers (e.g., nickel silicide or cobalt silicide) that have a work function value closer to a valence band energy than a conduction band energy of the p-type S/D regions. The nWFM silicide layers can be formed from a silicidation reaction between the n-type S/D regions and an nWFM layer disposed on the n-type S/D regions. The pWFM silicide layers can be formed from a silicidation reaction between the p-type S/D regions and a pWFM layer disposed on the p-type S/D regions.

In some embodiments, dipole layers can be formed at interfaces between the S/D regions and the silicide layers of NFETs to further reduce the SBHs between the n-type S/D regions and the S/D contact structures. The dipole layers can be formed by doping the silicide layers with metals having electronegativity values lower than the metals of the silicide layers. The metal dopants can induce the formation of dipoles between the metal dopants and the semiconductor elements of the n-type S/D regions. Such selective formation of silicide layers in NFETs and PFETs can reduce the contact resistances of the semiconductor devices by about 50% to about 70% compared to NFETs and PFETs with similar silicide layers, and consequently improve the performance of the semiconductor devices.

FIG. 1 illustrates an isometric view of a semiconductor device 100 with NFET 102N and PFET 102P, according to some embodiments. NFET 102N and PFET 102P can have different cross-sectional views, as illustrated in FIGS. 2A-2D, 3A-3D, 4A-4D, and 5A-5D, according to various embodiments. FIGS. 2A-5A and 2C-5C illustrate cross-sectional views of NFET 102N along respective lines A-A and C-C of FIG. 1. FIGS. 2B-5B and 2D-5D illustrate cross-sectional views of PFET 102P along respective lines B-B and D-D of FIG. 1. FIGS. 2A-2D, 3A-3D, 4A-4D, and 5A-5D illustrate cross-sectional views of semiconductor device 100 with additional structures that are not shown in FIG. 1 for simplicity. The discussion of elements of NFET 102N and PFET 102P with the same annotations applies to each other, unless mentioned otherwise.

Referring to FIG. 1, NFET 102N can include an array of gate structures 112N disposed on fin structure 106N, and PFET 102P can include an array of gate structures 112P disposed on fin structure 106P. NFET 102N can further include an array of S/D regions 108N (one of S/D regions 108N visible in FIG. 1) disposed on portions of fin structure 106N that are not covered by gate structures 112N. Similarly, PFET 102P can further include an array of epitaxial S/D regions 108P (one of S/D regions 108P visible in FIG. 1) disposed on portions of fin structure 106P that are not covered by gate structures 112P.

Semiconductor device 100 can further include gate spacers 114, shallow trench isolation (STI) regions 116, etch stop layer (ESL) 117, and interlayer dielectric (ILD) layers 118A-118B (ILD layer 118B not shown in FIG. 1 for simplicity; shown in FIGS. 2A-2D, 3A-3D, 4A-4D, and 5A-5D). ILD layer 118A can be disposed on ESL 117. ESL 117 can be configured to protect gate structures 112N and 112P and/or S/D regions 108N and 108P. In some embodiments, gate spacers 114, STI regions 116, ESL 117, and ILD layers 118A-118B can include an insulating material, such as silicon oxide, silicon nitride (SiN), silicon carbon nitride (SiCN), silicon oxycarbon nitride (SiOCN), and silicon germanium oxide. In some embodiments, gate spacers 114 can have a thickness of about 2 nm to about 9 nm for adequate electrical isolation of gate structures 112N and 112P from adjacent structures.

Semiconductor device 100 can be formed on a substrate 104 with NFET 102N and PFET 102P formed on different regions of substrate 104. There may be other FETs and/or structures (e.g., isolation structures) formed between NFET 102N and PFET 102P on substrate 104. Substrate 104 can be a semiconductor material, such as silicon, germanium (Ge), silicon germanium (SiGe), a silicon-on-insulator (SOI) structure, and a combination thereof. Further, substrate 104 can be doped with p-type dopants (e.g., boron, indium, aluminum, or gallium) or n-type dopants (e.g., phosphorus or arsenic). In some embodiments, fin structures 106N-106P can include a material similar to substrate 104 and extend along an X-axis.

Referring to FIGS. 2A-2D, NFET-PFET 102N-102P can include gate structures 112N-112P, S/D regions 108N-108P, and S/D contact structures 120N-120P disposed on S/D regions 108N-108P. Gate structures 112N-112P can be multi-layered structures. Each of gate structures 112N-112P can include an interfacial oxide (IO) layer 122, a high-k (HK) gate dielectric layer 124 disposed on IO layer 122, a work function metal (WFM) layer 126 disposed on HK gate dielectric layer 124, a gate metal fill layer 128 disposed on WFM layer 126, and a gate capping layer 130 disposed on HK gate dielectric layer 124, WFM layer 126, and gate metal fill layer 128.

IO layers 122 can include silicon oxide ($SiO_2$), silicon germanium oxide ($SiGeO_x$), or germanium oxide ($GeO_x$). HK gate dielectric layers 124 can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$). WFM layers 126 of gate structures 112N can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, a combination thereof, or other suitable Al-based materials. WFM layers 126 of gate structures 112P can include substantially Al-free (e.g., with no Al) Ti-based or Ta-based nitrides or alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, tantalum copper (Ta—Cu), and a combination thereof. Gate metal fill layers 128 can include a suitable conductive material, such as tungsten (W), Ti, silver (Ag), ruthenium (Ru), molybdenum (Mo), copper (Cu), cobalt (Co), Al, iridium (Ir), nickel (Ni), metal alloys, and a combination thereof. In some embodiments, gate structures 112N-112P can be electrically isolated from overlying interconnect structures (not shown) by gate capping layers 130, which can include nitride layers.

Each of S/D regions 108N can include a stack of epitaxial layers—a lightly doped (LD) n-type layer 109N epitaxially grown on fin structure 106N, a heavily doped (HD) n-type layer 110N epitaxially grown on LD n-type layer 109N, and a p-type capping layer 111N epitaxially grown on HD n-type layer 110N. In some embodiments, LD and HD n-type layers 109N-110N can include epitaxially-grown semiconductor material, such as silicon, and n-type dopants, such as phosphorus and other suitable n-type dopants. LD n-type layers 109N can include a doping concentration ranging from about $10^{15}$ atoms/cm$^3$ to about $10^{18}$ atoms/cm$^3$, which is lower than a doping concentration of HD n-type layers 110N, which can range from about $10^{19}$ atoms/cm$^3$ to about $10^{23}$ atoms/cm$^3$. In some embodiments, HD n-type layer 110N is thicker than LD n-type layer 109N.

Similarly, each of S/D regions 108P can include a stack of epitaxial layers—a LD p-type layer 109P epitaxially grown on fin structure 106P, a HD p-type layer 110P epitaxially grown on LD p-type layer 109P, and an n-type capping layer 111P epitaxially grown on HD p-type layer 110P. In some embodiments, LD and HD p-type layers 109P-110P can include epitaxially-grown semiconductor material, such as SiGe, and p-type dopants, such as boron and other suitable p-type dopants. LD p-type layers 109P can include a doping concentration ranging from about $10^{15}$ atoms/cm$^3$ to about $10^{18}$ atoms/cm$^3$, which is lower than a doping concentration of HD p-type layers 110P, which can range from about $10^{19}$ atoms/cm$^3$ to about $10^{23}$ atoms/cm$^3$. In some embodiments, LD p-type layers 109P can include a Ge concentration ranging from about 5 atomic percent to about 45 atomic percent, which is lower than a Ge concentration of HD p-type layers 110P, which can range from about 50 atomic percent to about 80 atomic percent. In some embodiments, HD p-type layer 110P is thicker than LD p-type layer 109P.

P-type capping layers 111N include a material and dopants similar to HD p-type layers 110P and n-type capping layers 111P include a material and dopants similar to HD n-type layers 110N. In some embodiments, p- and n-type capping layers 111N-111P can include doping concentrations ranging from about $10^{19}$ atoms/cm$^3$ to about $10^{23}$ atoms/cm$^3$. P- and n-type capping layers 111N-111P are referred to as reverse capping layers 111N-111P because these layers are disposed on oppositely conductive HD n- and p-type layers 110N-110P, respectively. These reverse capping layers 111N-111P are used in the selective formation of silicide layers 131 and 132N in respective S/D regions 108P and 108N, which are described in detail below. In some embodiments, the thicknesses of p- and n-type capping layers 111N-111P along a Z-axis can range from about 1 nm to about 3 nm. The thicknesses below this range may not form a continuous layer, and may be inadequate for the selective formation of silicide layers 131 and 132N. On the other hand, if the thicknesses are above this range, the processing time (e.g., epitaxial growth time) increases, and consequently increase device manufacturing cost.

Figure 2B:
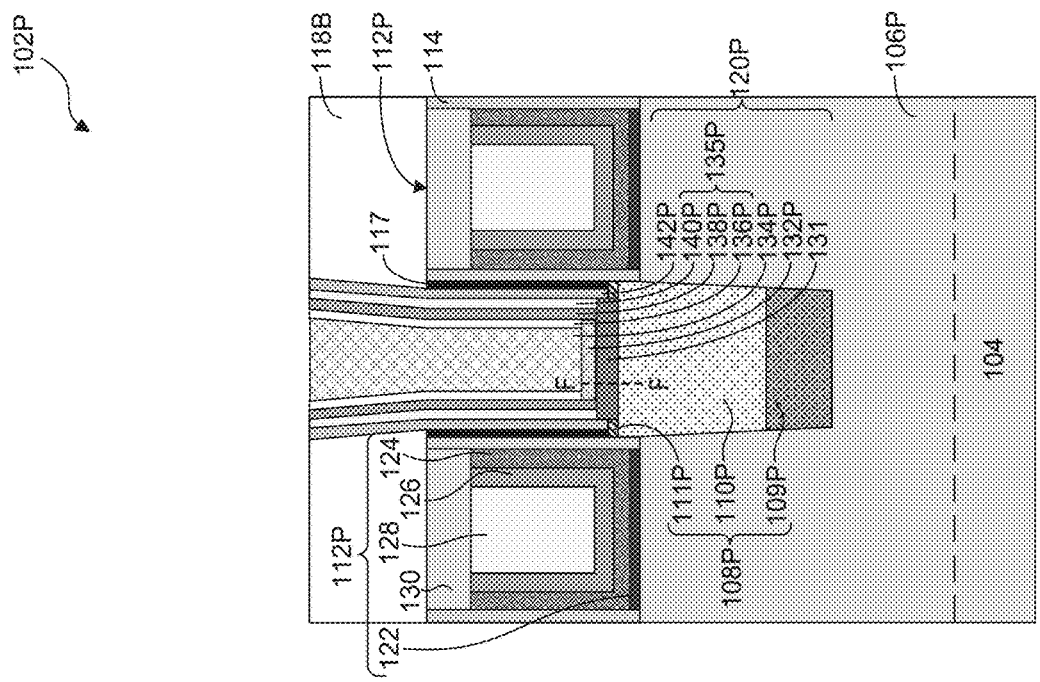
Figure 2A:
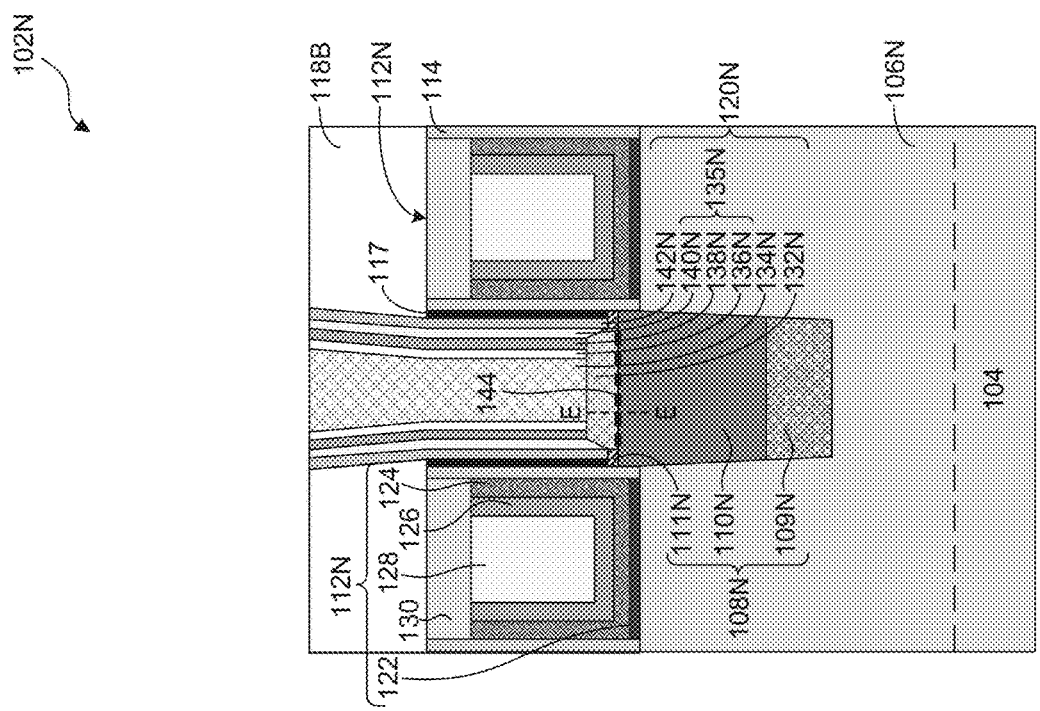

Referring to FIGS. 2A and 2C, S/D contact structure 120N is disposed on S/D region 108N. In some embodiments, S/D contact structure 120N can include (i) an nWFM silicide layer 132N disposed on HD n-type layer 110N, (ii) a contact plug 134N disposed on nWFM silicide layer 132N, (iii) a stack of metal-based liners 135N disposed on sidewalls of contact plug 134N, and (iv) a barrier layer 142N disposed on stack of metal-based liners 135N. NFET 102N can further include a dipole layer 144 at an interface ("interface 132N-110N") between nWFM silicide layer 132N and HD n-type layer 110N. In some embodiments, interface 132N-110N can be within S/D region 108N and below top surface of S/D region 108N.

In some embodiments, top surface of nWFM silicide layer 132N can be above top surface of S/D region 108N (shown in FIGS. 2A and 2C) or can be substantially coplanar with top surface of S/D region 108N (not shown). In some embodiments, nWFM silicide layer 132N can form angles A and B with the stack of metal-based liners 135N, as shown in FIG. 2C. Angles A and B can be similar or different from each other and can range from about 45 degrees to about 60 degrees. In some embodiments, nWFM silicide layer 132N can include a metal or a metal silicide with a work function value closer to a conduction band-edge energy than a valence band-edge energy of the material of HD n-type layer 110N. For example, the metal or the metal silicide can have a work function value less than 4.5 eV (e.g., about 3.5 eV to about 4.4 eV), which can be closer to the conduction band energy (e.g., 4.1 eV of Si or 3.8 eV of SiGe) than the valence band energy (e.g., 5.2 eV of Si or 4.8 eV of SiGe) of Si-based or SiGe-based material of HD n-type layer 110N. In some embodiments, the metal silicide of nWFM silicide layer 132N can include titanium silicide ($Ti_xSi_y$), tantalum silicide ($Ta_xSi_y$), molybdenum silicide ($Mo_xSi_y$), zirconium silicide ($Zr_xSi_y$), hafnium silicide ($Hf_xSi_y$), scandium silicide ($Sc_xSi_y$), yttrium silicide ($Y_xSi_y$), terbium silicide ($Tb_xSi_y$), lutetium silicide ($Lu_xSi_y$), erbium silicide ($Er_xSi_y$), ybtterbium silicide ($Yb_xSi_y$), europium silicide ($Eu_xSi_y$), thorium silicide ($Th_xSi_y$), or a combination thereof.

In some embodiments, nWFM silicide layer 132N can further include dopants of a transition metal, which has an electronegativity value smaller than the electronegativity value of the metal of the metal silicide included in nWFM silicide layer 132N. For example, dopants can include a transition metal, such as zirconium (Zr), hafnium (Hf), ybtterbium (Yb), yttrium (Y), erbium (Er), cerium (Ce), scandium (Sc), and a combination thereof. In some embodiments, some dopants can diffuse into HD n-type layer 110N. The dopants can induce the formation of charged dipoles in dipole layer 144 at interface 132N-110N. Dipole layer 144 can include charged dipoles of silicon ions from HD n-type layer 110N and transition metal ions from the dopants in nWFM silicide layer 132N. For example, dipole layer 144 can include Zr—Si, Hf—Si, Yb—Si, Y—Si, Er—Si, Ce—Si, or Sc—Si dipoles when nWFM silicide layer 132N includes Zr, Hf, Yb, Y, Er, Ce, or Sc dopants, respectively.

The electric fields generated at interface 132N-110N by dipoles in dipole layer 144 can reduce the SBH between nWFM silicide layer 132N and HD n-type layer 110N, and consequently reduce the contact resistance between S/D contact structure 120N and S/D region 108N. Based on the type and concentration of dipoles in dipole layer 144 at interface 132N-110N, the SBH between nWFM silicide layer 132N and HD n-type layer 110N can be reduced by about 35% to about 70% compared to the SBH between nWFM silicide layer 132N and HD n-type layer 110N without dipole layer 144. The concentration of dipoles at interface 132N-110N is directly proportional to the concentration of dopants in nWFM silicide layer 132N and/or interface 132N-110N. The concentration of dopants in nWFM silicide layer 132N and/or interface 132N-110N can range from about 1 atomic percent to about 10 atomic percent. The dopant concentration below this range may not induce the formation of dipoles in dipole layer 144. On the other hand, if the dopant concentration is above this range, the duration and complexity of the doping process increases, and consequently increase device manufacturing cost.

The dopant concentration can have profiles 246, 248, and/or 250 across nWFM silicide layer 132N and HD n-type layer 110N along lines E-E of FIGS. 2A and 2C, as shown in FIG. 2E, according to various embodiments. The dopant concentration can have profile 246 with a peak dopant concentration C1 at interface 132N-110N when nWFM silicide layer 132N is doped with a transition metal (e.g., Zr, Hf, etc.) in a doping process that does not include a high temperature (e.g., temperature greater than 500° C.) annealing process, as described in detail below. The dopant concentration can have profile 248 when nWFM silicide layer 132N is doped with a non-Zr-based transition metal (e.g., Hf, Ce, Er, etc.) in a doping process that does not include a high temperature annealing process. The non-Zr-based transition dopants can have a lower thermodynamic stability at interface 132N-110N than Zr dopants, which can cause a larger number of the non-Zr-based transition dopants to diffuse away from interface 132N-110N and into nWFM silicide layer 132N. As a result, as shown in FIG. 2E, the peak dopant concentration of profile 248 can be a distance D1 (e.g., about 0.1 nm to about 0.5 nm) away from interface 132N-110N and can have a dopant concentration C2 at interface 132N-110N, which is smaller than peak dopant concentration C1.

In some embodiments, when the doping of nWFM silicide layer 132N includes a high temperature annealing process, the non-Zr-based dopants can diffuse further into nWFM silicide layer 132N due to their lower thermodynamic stability at interface 132N-110N and can have a dopant concentration profile 250, as shown in FIG. 2E. The peak dopant concentration of profile 250 can be a distance D2 (e.g., about 0.2 nm to about 0.8 nm) away from interface 132N-110N, which is greater than distance D1, and can have a dopant concentration C3 at interface 132N-110N, which is smaller than dopant concentration C2. As the concentration of dopants at interface 132N-110N is directly proportional to the concentration of dipoles at interface 132N-110N, dipole concentration in dipole layer 144 can be greater for profile 246 than for profiles 248 and 250, and dipole concentration in dipole layer 144 for profile 248 can be greater than for profile 250. As a result, the SBH between nWFM silicide layer 132N and HD n-type layer 110N can be lower for profile 246 than for profiles 248 and 250, and the SBH between nWFM silicide layer 132N and HD n-type layer 110N can be lower for profile 248 than for profile 250. In some embodiments, dopant concentration across along lines E-E of FIGS. 2A and 2C can have profiles 246 and 248 or can have profiles 246 and 250 when nWFM silicide layer 132N is doped with a combination of Zr metal and one or more non-Zr-based transition metals.

Figure 23B:
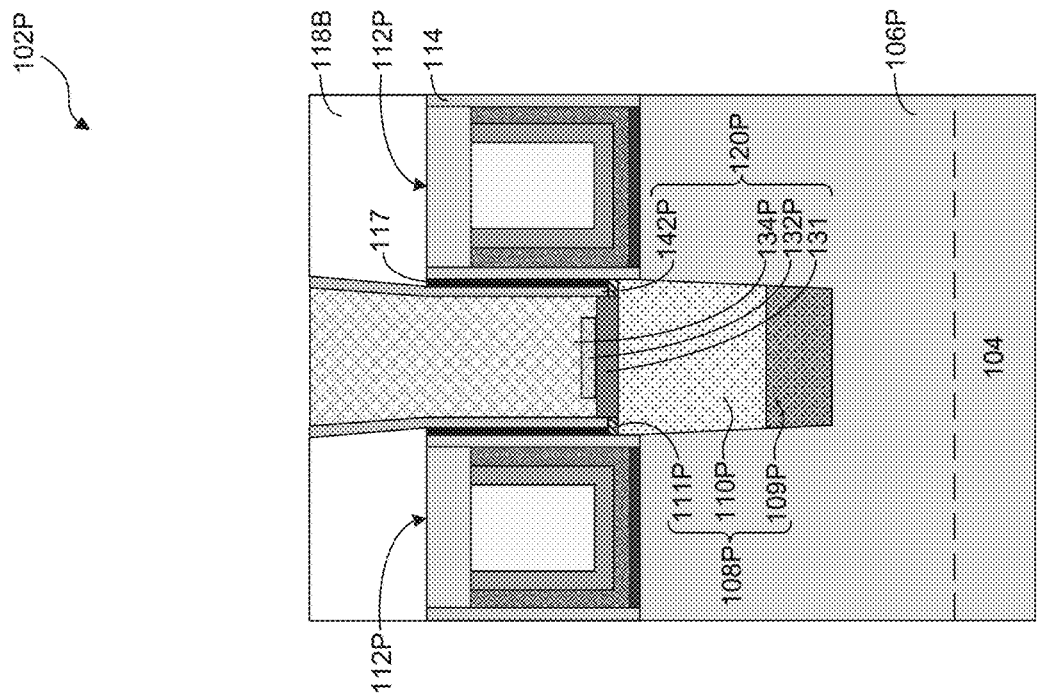
Figure 23A:
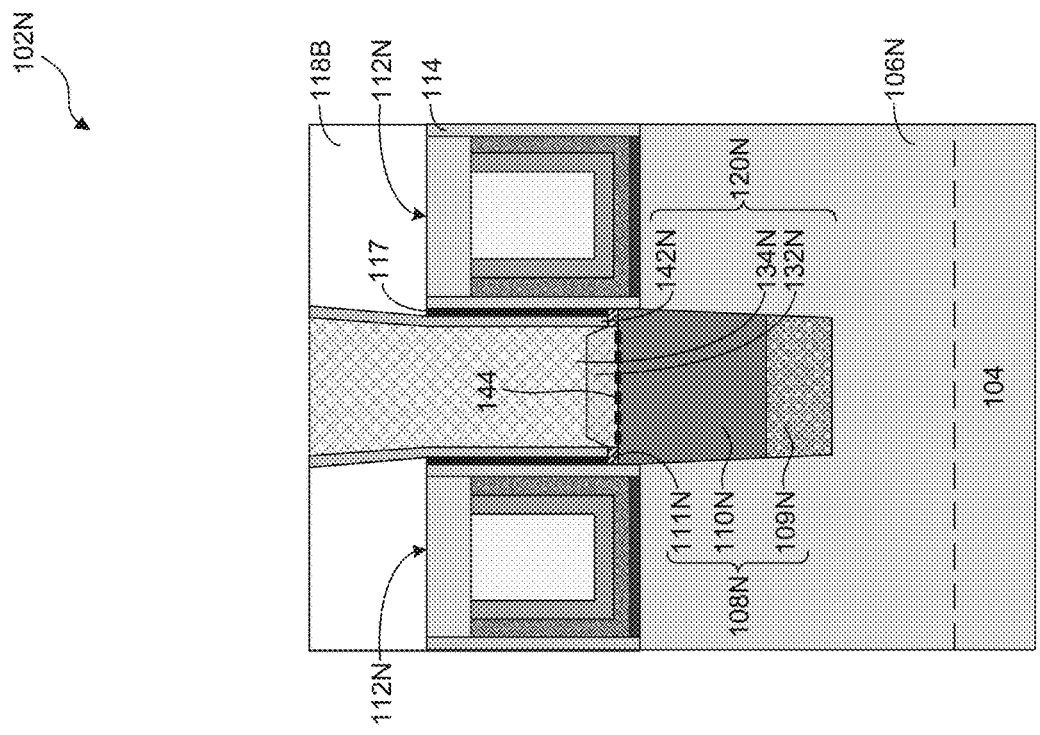
Figure 23D:
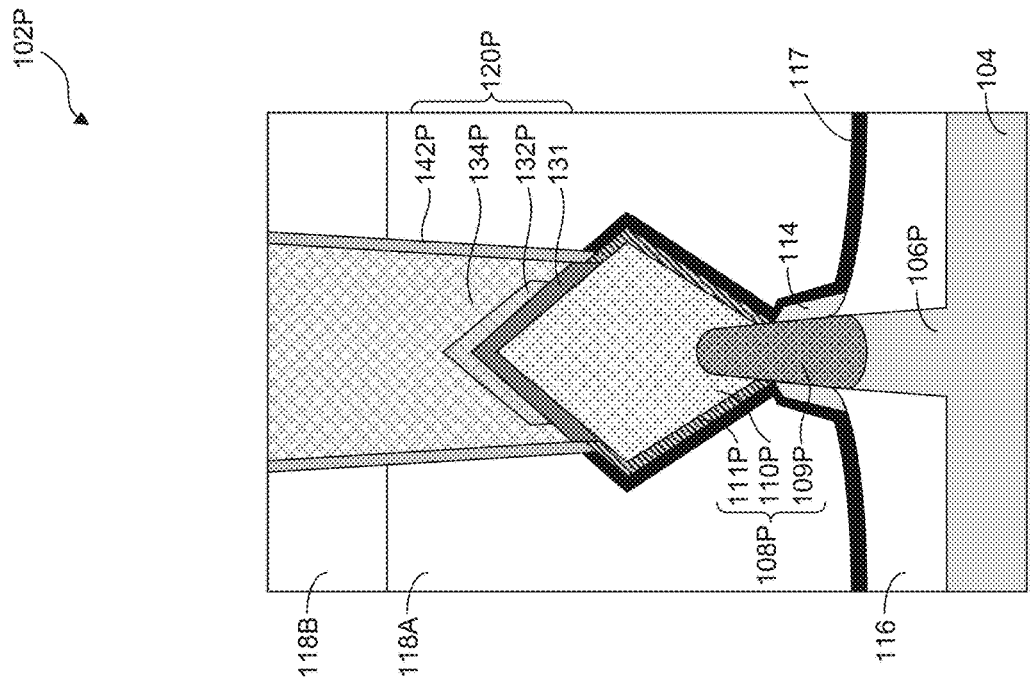
Figure 23C:
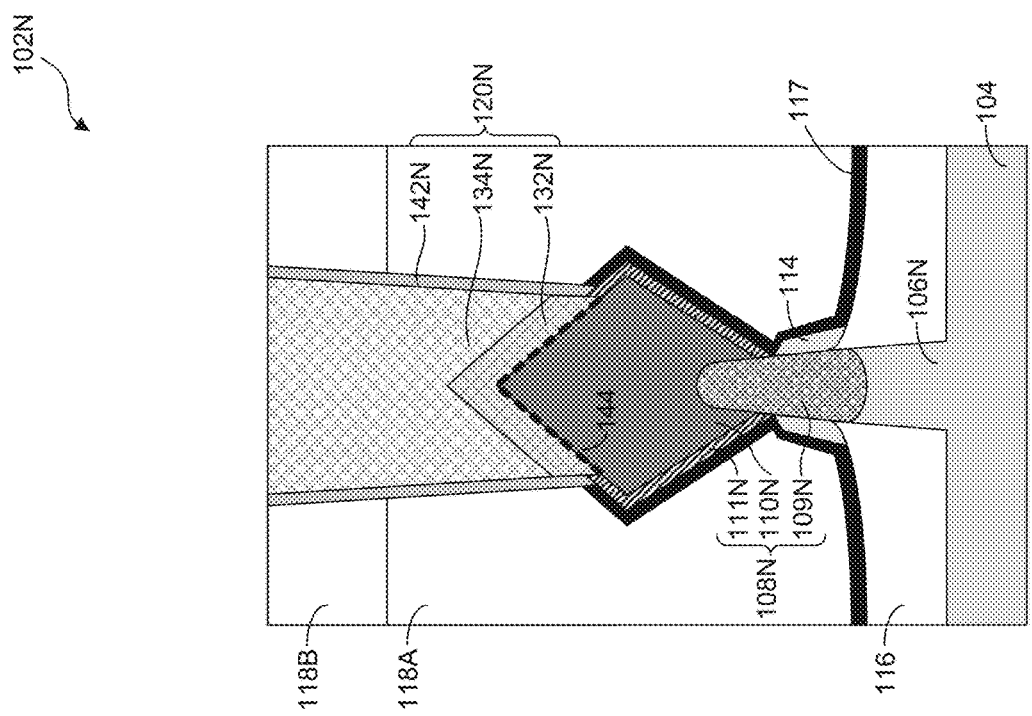

Referring back to FIGS. 2A and 2C, contact plug 134N can include conductive materials, such as cobalt (Co), tungsten (W), ruthenium (Ru), iridium (Ir), nickel (Ni), osmium (Os), rhodium (Rh), aluminum (Al), molybdenum (Mo), copper (Cu), zirconium (Zr), stannum (Sn), silver (Ag), gold (Au), zinc (Zn), cadmium (Cd), and a combination thereof. In some embodiments, stack of metal-based liners 135N can include a first liner 136N, a second liner 138N, and a third liner 140N. First liner 136N can be a portion of a source layer that is used in the formation of nWFM silicide layer 132N, as described in detail below, and can include a metal of nWFM silicide layer 132N or can include an oxide of a metal of nWFM silicide layer 132N. Second liner 138N can be a portion of a source that is used in the doping of nWFM silicide layer 132N, as described in detail below, and can include a transition metal of the dopants in nWFM silicide layer 132N or can include an oxide of the metal of the dopants. Third liner 140N can be a portion of a source layer that is used in the formation of pWFM silicide layer 132P, as described in detail below, and can include a metal of pWFM silicide layer 132P or can include an oxide of a metal of pWFM silicide layer 132P. In some embodiments, second and/or third liners 138N-140N may not be present in stack of metal-based liners 135N or stack of metal-based liners 135N may not be present in S/D contact structure 120N (shown in FIGS. 23A and 23C). Barrier layer 142N can include a nitride material and can reduce or prevent the diffusion of oxygen atoms from ILD layers 118A-118B into contact plug 134N to prevent the oxidation of the conductive material of contact plug 134N.

Referring to FIGS. 2B and 2D, S/D contact structure 120P is disposed on S/D region 108P. In some embodiments, S/D contact structure 120P can include (i) an pWFM silicide layer 131 disposed on HD p-type layer 110P, (ii) an nWFM silicide layer 132P disposed on pWFM silicide layer 131, (iii) a contact plug 134P disposed on nWFM silicide layer 132P, (iv) a stack of metal-based liners 135P with first, second, and third liners 136P, 138P, and 140P disposed on sidewalls of contact plug 134P, and (v) a barrier layer 142P disposed on stack of metal-based liners 135P. The discussion of contact plug 134N, barrier layer 142N, stack of metal-based liners 135N with first, second, and third liners 136N-140N applies to contact plug 134P, barrier layer 142P, and stack of metal-based liners 135P with first, second, and third liners 136P-140P, respectively, unless mentioned otherwise. In some embodiments, second and/or third liners 138P-140P may not be present in stack of metal-based liners 135P or stack of metal-based liners 135P may not be present in S/D contact structure 120P (shown in FIGS. 23B and 23D).

In some embodiments, top surface of pWFM silicide layer 131 can be above top surface of S/D region 108P (shown in FIGS. 2B and 2D) or can be substantially coplanar with top surface of S/D region 108P (not shown). In some embodiments, pWFM silicide layer 131 can form angles C and D with the stack of metal-based liners 135P, as shown in FIG. 2D. Angles C and D can be similar or different from each other and can range from about 45 degrees to about 60 degrees. In some embodiments, pWFM silicide layer 131 can include a metal or a metal silicide with a work function value closer to a valence band-edge energy than a conduction band-edge energy of the material of HD p-type layer 110P. For example, the metal or the metal silicide can have a work function value greater than 4.5 eV (e.g., about 4.5 eV to about 5.5 eV), which can be closer to the valence band energy (e.g., 5.2 eV of Si or 4.8 eV of SiGe) than the conduction band energy (e.g., 4.1 eV of Si or 3.8 eV of SiGe) of Si-based or SiGe-based material of HD p-type layer 110P. In some embodiments, the metal silicide of pWFM silicide layer 131 can include nickel silicide ($Ni_xSi_y$), cobalt silicide ($Co_xSi_y$), manganese silicide ($Mn_xSi_y$), tungsten silicide ($W_xSi_y$), iron silicide ($Fe_xSi_y$), rhodium silicide ($Rh_xSi_y$), palladium silicide ($Pd_xSi_y$), ruthenium silicide ($Ru_xSi_y$), platinum silicide ($Pt_xSi_y$), iridium silicide ($Ir_xSi_y$), osmium silicide ($Os_xSi_y$), or a combination thereof.

Figure 2F:
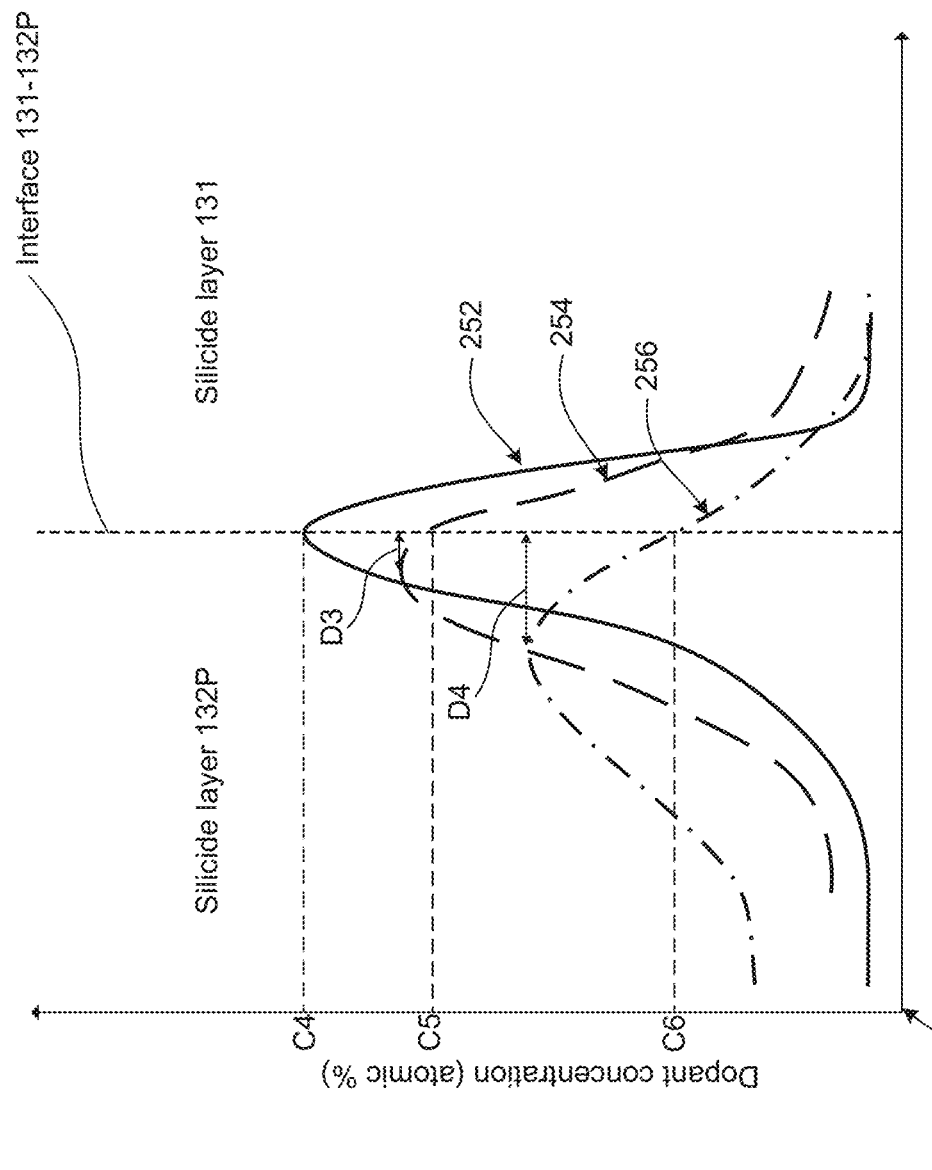

The metal silicide of pWFM silicide layer 131 is different from the metal silicide of nWFM layers 132N-132P and can have a work function value greater than the work function values of nWFM silicide layers 132N-132P. In some embodiments, nWFM silicide layer 132P can be formed at the same time as nWFM silicide layer 132N and can include a metal silicide and dopants similar to nWFM silicide layer 132N. Some of the dopants may diffuse into pWFM silicide layer 132. Similar to dopant concentration profiles 246-250, the dopant concentration across nWFM silicide layer 132P and pWFM silicide layer 131 can have profiles 252, 254, and/or 256 along lines F-F of FIGS. 2B and 2D, as shown in FIG. 2F, according to various embodiments. The dopant concentration can have profile 252 with a peak dopant concentration C4 at an interface ("interface 131-132P") between pWFM silicide layer 131 and nWFM silicide layer 132P when nWFM silicide layer 132P is doped with a transition metal (e.g., Zr, Hf, etc.) in a doping process that does not include a high temperature annealing process. The dopant concentration can have profile 254 when nWFM silicide layer 132P is doped with a non-Zr-based transition metal (e.g., Hf, Ce, Er, etc.) in a doping process that does not include a high temperature annealing process. The peak dopant concentration of profile 254 can be a distance D3 (e.g., about 0.1 nm to about 0.5 nm) away from interface 131-132P and can have a dopant concentration C5 at interface 131-132P , which is smaller than peak dopant concentration C4.

The dopant concentration can have profile 256 when nWFM silicide layer 132P is doped with a non-Zr-based transition metal (e.g., Hf, Ce, Er, etc.) in a doping process that includes a high temperature annealing process. The peak dopant concentration of profile 256 can be a distance D4 (e.g., about 0.2 nm to about 0.8 nm) away from interface 131-132P, which is greater than distance D3, and can have a dopant concentration C6 at interface 131-132P, which is smaller than dopant concentration C5. In some embodiments, dopant concentration across along lines F-F of FIGS. 2B and 2D can have profiles 252 and 254 or can have profiles 252 and 256 when nWFM silicide layer 132P is doped with a combination of Zr metal and one or more non-Zr-based transition metals. In some embodiments, unlike nWFM silicide layer 132N, nWFM silicide layer 132P can be undoped. For effective reduction of contact resistance, the thickness of pWFM silicide layer 131 along a Z-axis can range from about 1 nm to about 3 nm and the thicknesses of nWFM silicide layers 132N-132P along a Z-axis can range from about 2 nm to about 6 nm.

Figures 3A, 3B:
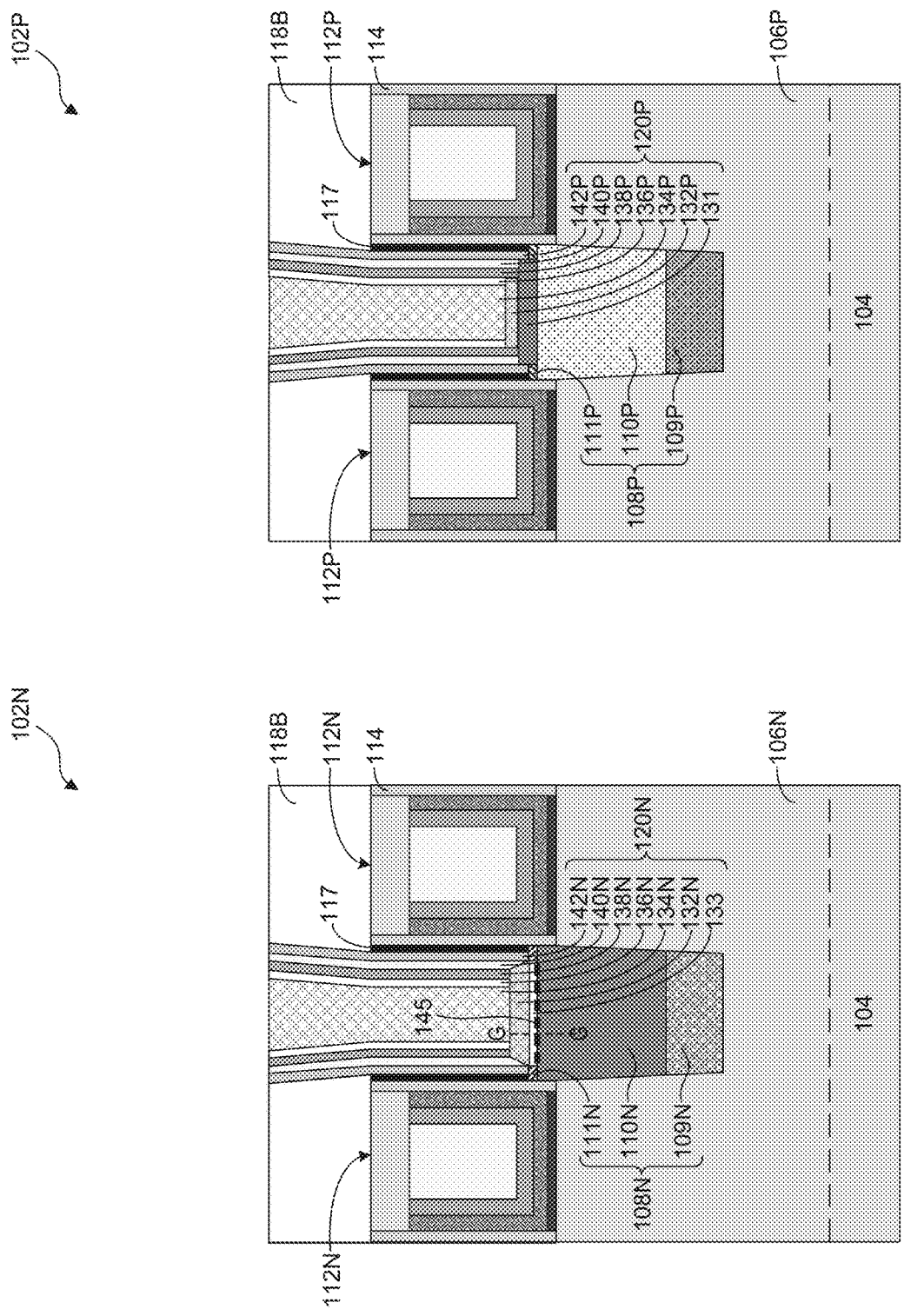
Figure 3C:
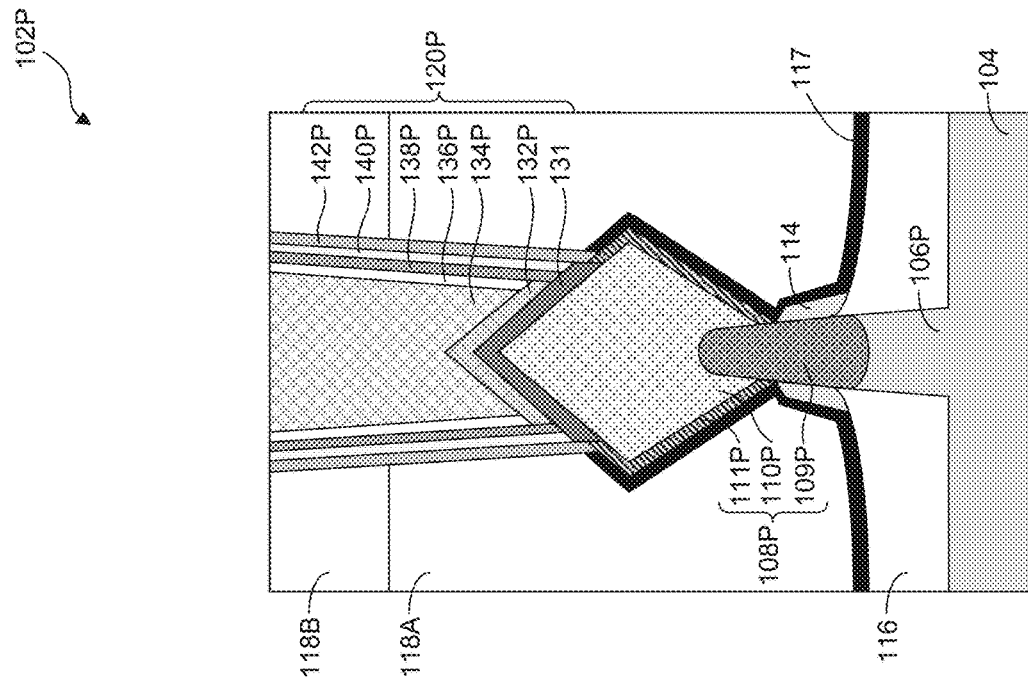

In some embodiments, S/D contact structures 120N-120P can have cross-sectional views as shown in FIGS. 3A-3D when nWFM silicide layers 132N-132P are doped with Zr metal in a doping process that includes a high temperature annealing process. Referring to FIGS. 3A and 3C, S/D contact structure 120N can include a Zr-based ternary compound (ZTC) layer 133 interposed between nWFM silicide layer 132N and HD n-type layer 110N. The Zr dopants of nWFM silicide layer 132N can interact with Si atoms of HD n-type layer 110N and metal atoms of nWFM silicide layer 132N during the high temperature annealing process to form ZTC layer 133. In some embodiments, ZTC layer 133 can include zirconium titanium silicide ($Zr_3Ti_2Si_3$) when nWFM silicide layer 132N includes $Ti_xSi_y$. ZTC layer 133 can induce the formation of dipole layer 145 at an interface ("interface 133-110N") between ZTC layer 133 and HD n-type layer 110N. In some embodiments, interface 133-110N can be within S/D region 108N and below top surface of S/D region 108N. Dipole layer 145 can include Zr—Si dipoles of Zr metal ions from ZTC layer 133 and silicon ions from HD n-type layer 110N.

Similar to dipole layer 144, the electric fields generated at interface 133-110N by dipole layer 145 can reduce the SBH by about 35% to about 70% between nWFM silicide layer 132N and HD n-type layer 110N, and consequently reduce the contact resistance between S/D contact structure 120N and S/D region 108N. The concentration of Zr atoms in ZTC layer 133 can range from about 1 atomic percent to about 10 atomic percent. In some embodiments, the Zr atoms can have a concentration profile 358 across nWFM silicide layer 132N, ZTC layer 133, and HD n-type layer 110N along lines G-G of FIGS. 3A and 3C, as shown in FIG. 3E.

Figure 3D:
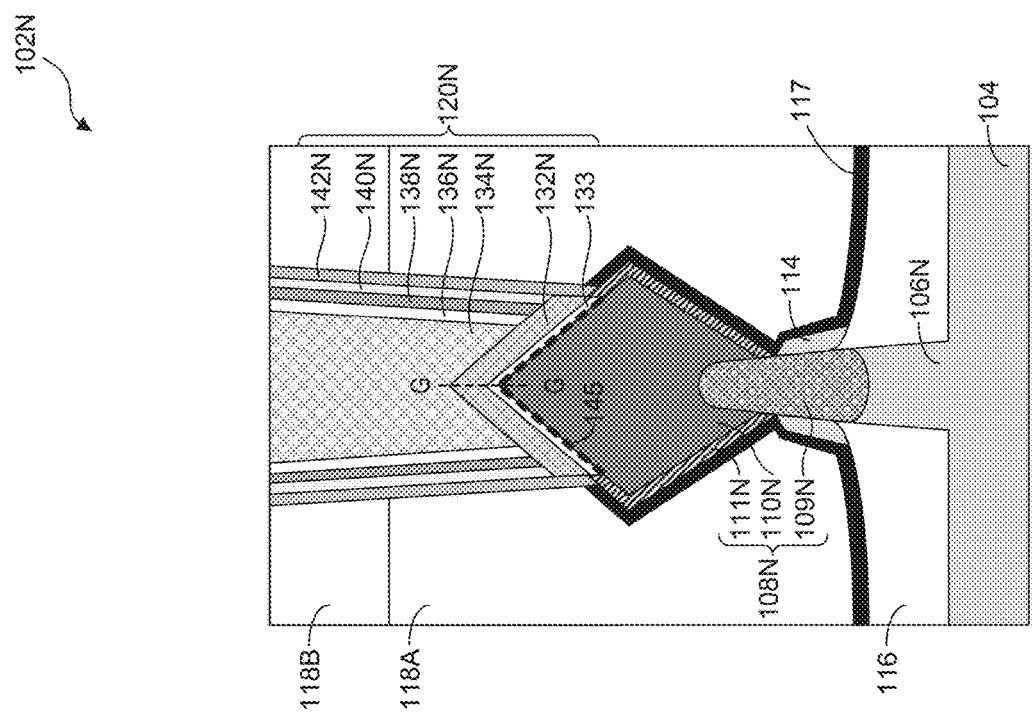
Figure 3E:
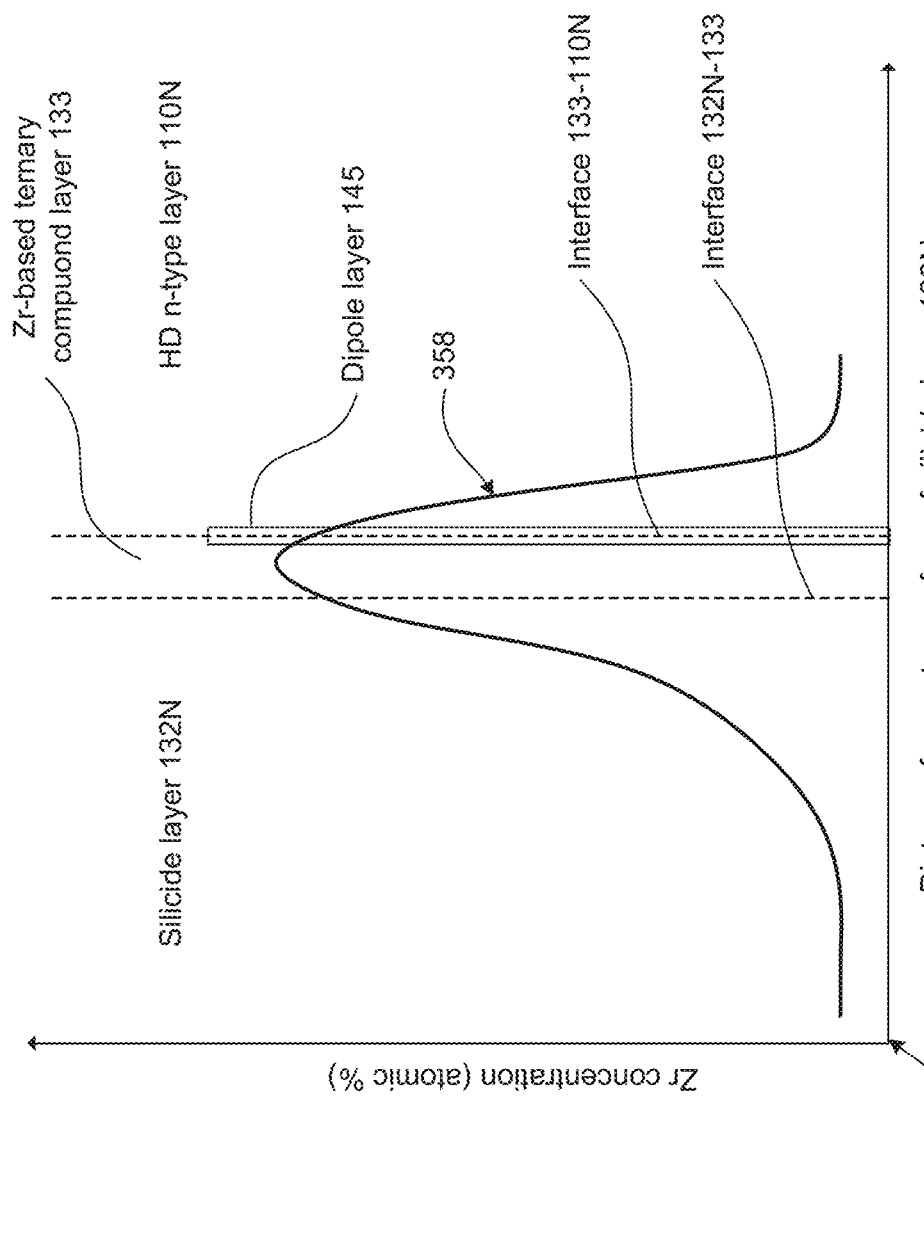
Figure 4B:
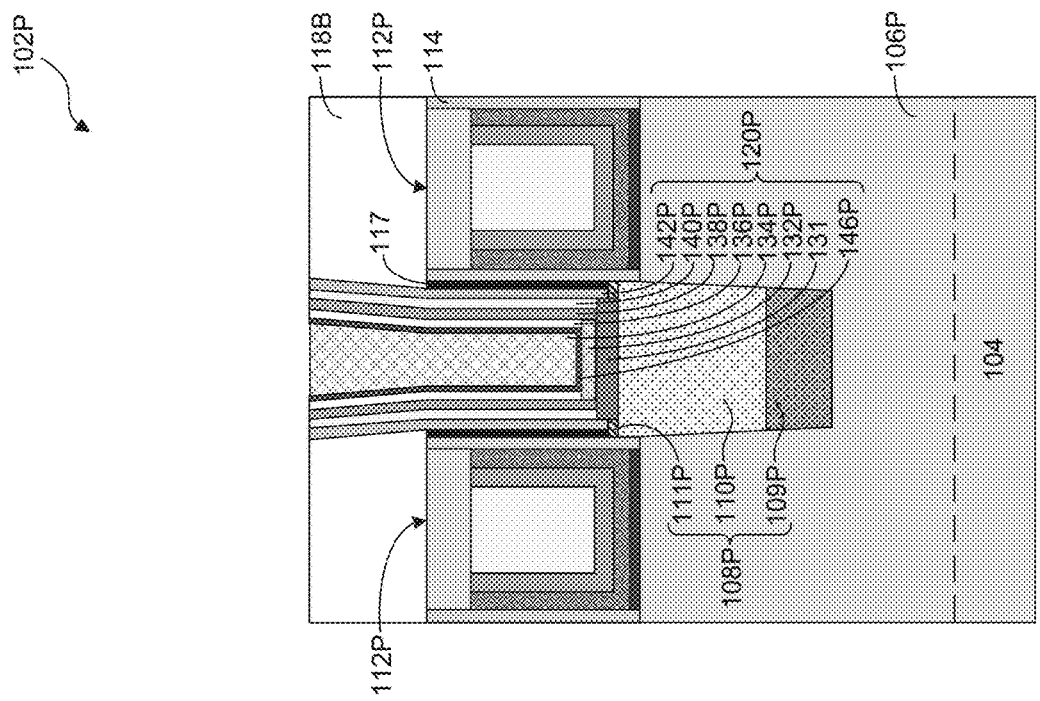
Figure 4A:
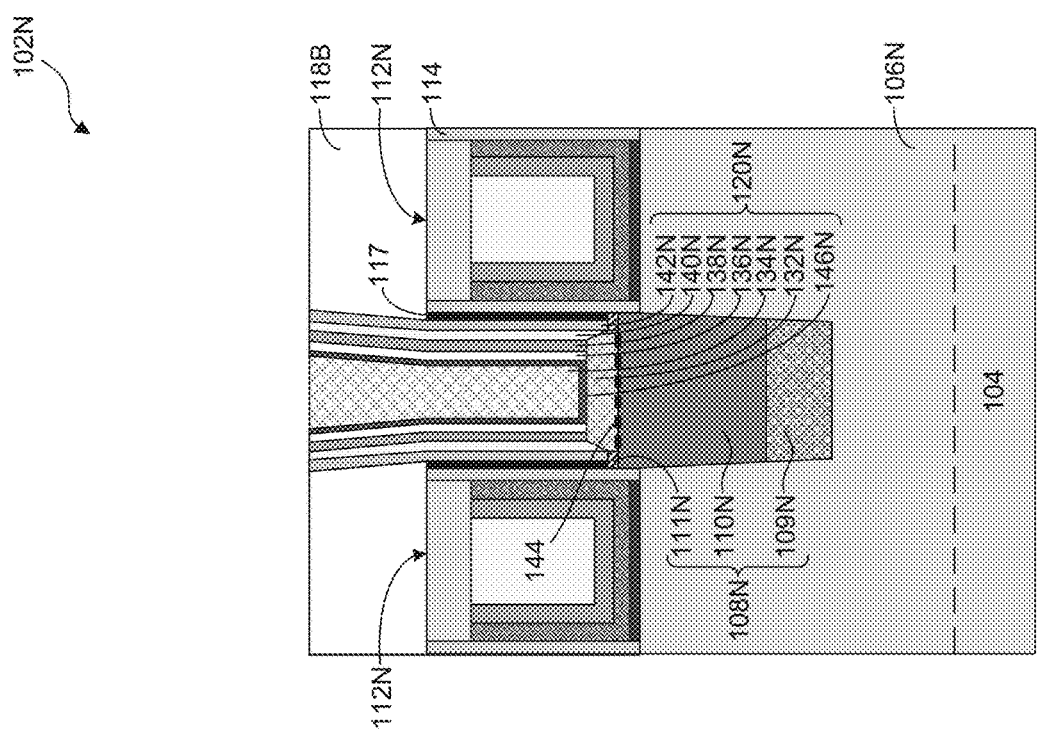

Referring to FIGS. 3B and 3D, the Zr dopants of nWFM silicide layer 132P does not form a ZTC layer in S/D contact structure 120P during the high temperature annealing process due to the interposing pWFM silicide layer 131 that can prevent Zr dopants from interacting with Si atoms of HD p-type layer 110P. The Zr dopants can have a concentration profile similar to profile 252 of FIG. 2F.

In some embodiments, S/D contact structures 120N-120P can include respective nitride capping layers 146N-146P, as shown in FIGS. 4A-4D. Nitride capping layers 146N-146P can be formed to protect the underlying layers (e.g., silicide layers 131 and 132N-132P) during subsequent processing of S/D contact structures 120N-120P.

Figure 5B:
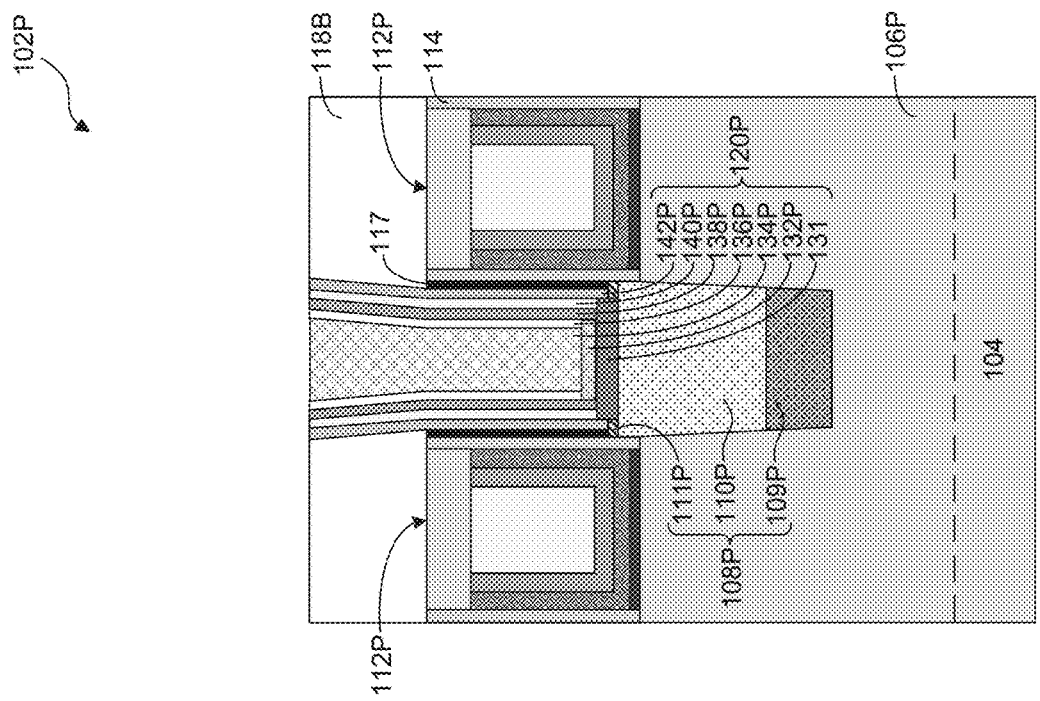
Figure 5A:
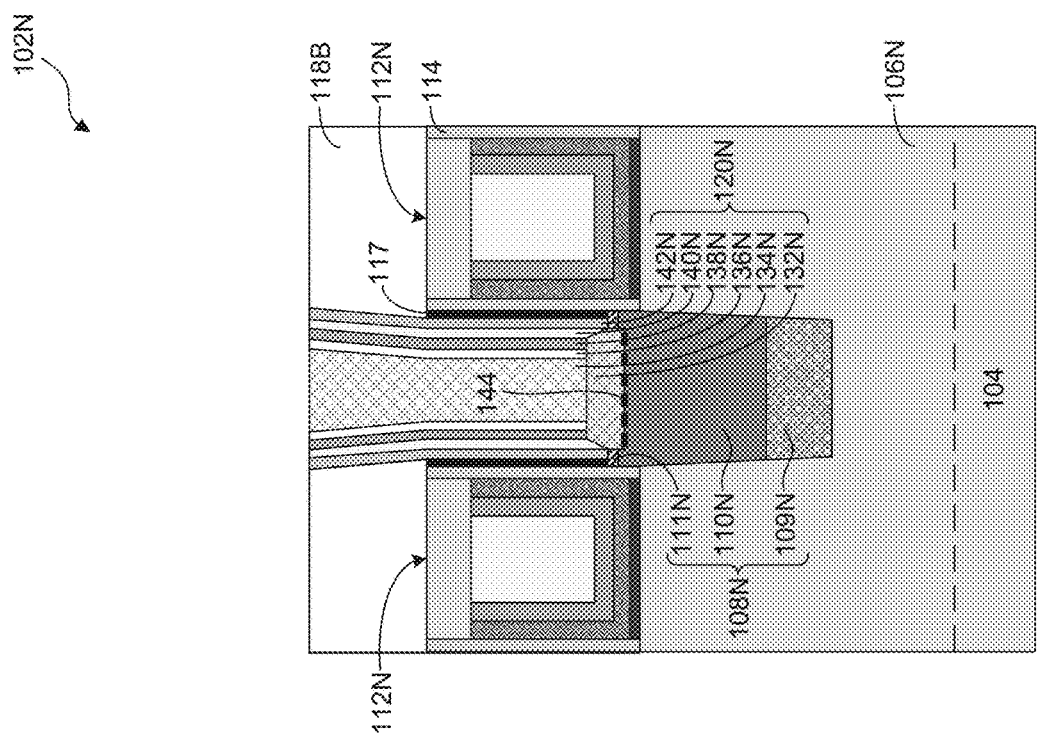

In some embodiments, instead of interface 132N-110N being substantially coplanar with the interface ("interface 111N-110N") between p-type capping layer 111N and HD n-type layer 110N, as shown in FIGS. 2A-4A and 2C-4C, interface 132N-110N can be non-coplanar with interface 111N-110N, as shown in FIGS. 5A and 5C. The non-coplanarity can occur when the silicon of p-type capping layer 111N is not used in the formation of nWFM silicide layer 132N. Instead, the silicon of HD n-type layer 110N is consumed during the formation of nWFM silicide layer 132N, and as a result, nWFM silicide layer 132N extends into HD n-type layer 110. The formation of nWFM silicide layer 132 with and without p-type capping layer 111N is described in detail below. The interface between pWFM silicide layer 131 and HD p-type layer 110N can be substantially coplanar with the interface between n-type capping layer 111P and HD p-type layer 110P, as shown in FIGS. 2B-5B and 2D-5D.

Figure 6:
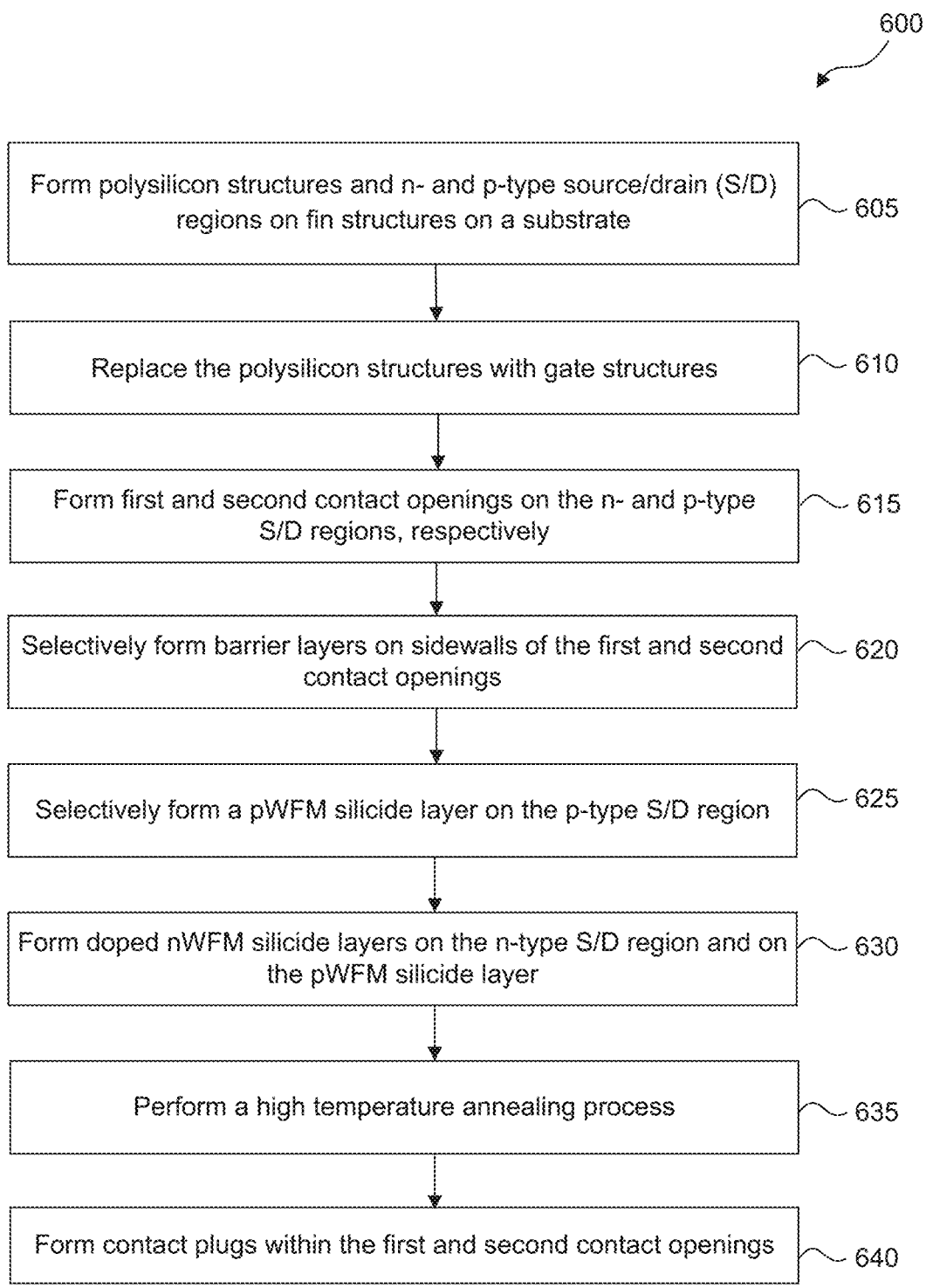
FIG. 6 is a flow diagram of a method for fabricating a semiconductor device with different contact structures, in accordance with some embodiments.

FIG. 6 is a flow diagram of an example method 600 for fabricating NFET 102N and PFET 102P of semiconductor device 100, according to some embodiments. For illustrative purposes, the operations illustrated in FIG. 6 will be described with reference to the example fabrication process for fabricating NFET 102N and PFET 102P as illustrated in FIGS. 7A-23D. FIGS. 7A-23A and 7C-23C are cross-sectional views of NFET 102N along respective lines A-A and C-C of FIG. 1 and FIGS. 7B-23B and 7D-23D are cross-sectional views of PFET 102P along respective lines B-B and D-D of FIG. 1 at various stages of fabrication, according to some embodiments. Operations can be performed in a different order or not performed depending on specific applications. It should be noted that method 600 may not produce a complete NFET 102N and PFET 102P. Accordingly, it is understood that additional processes can be provided before, during, and after method 600, and that some other processes may only be briefly described herein. Elements in FIGS. 7A-23D with the same annotations as elements in FIGS. 1 and 2A-5D are described above.

Figure 7B:
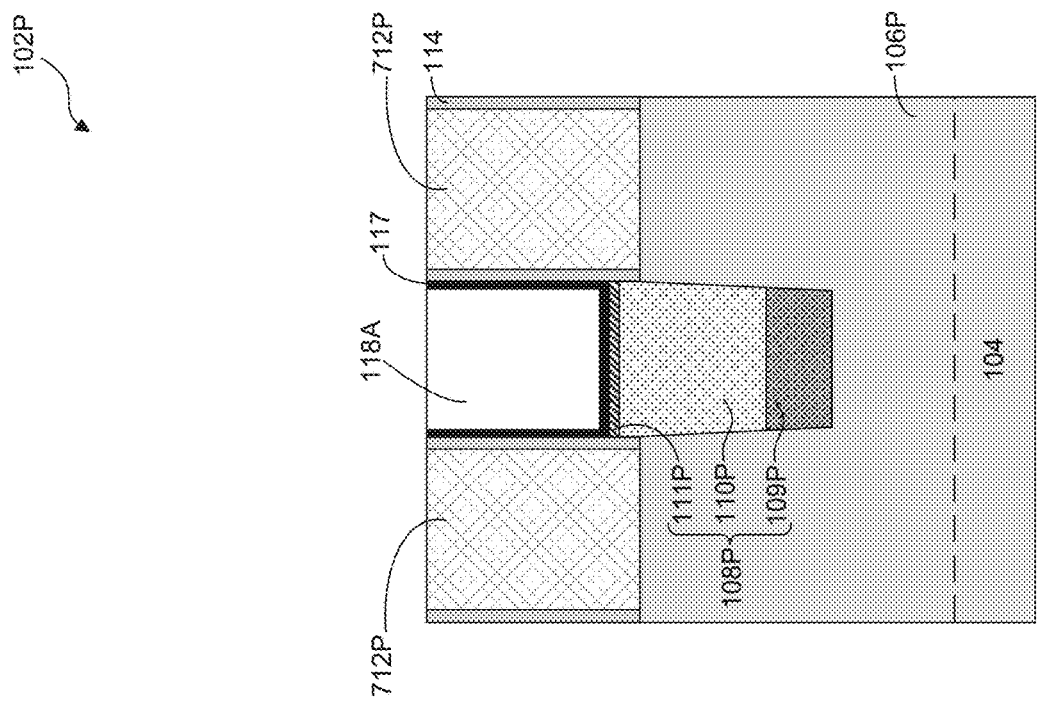
Figure 7A:
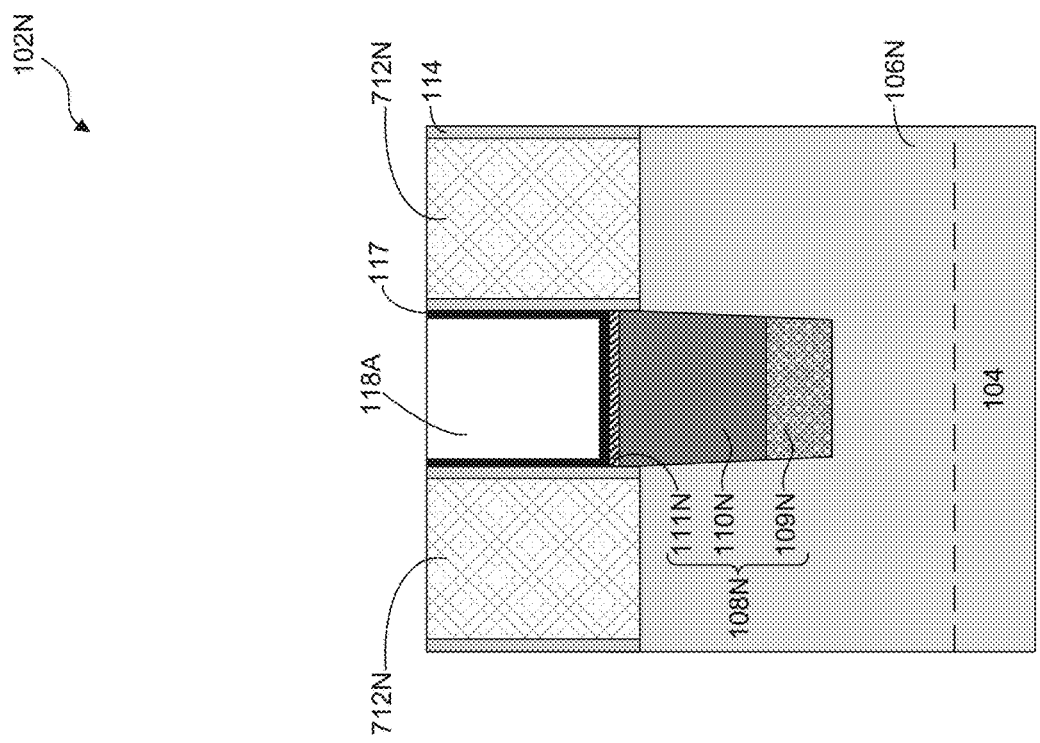
Figure 7D:
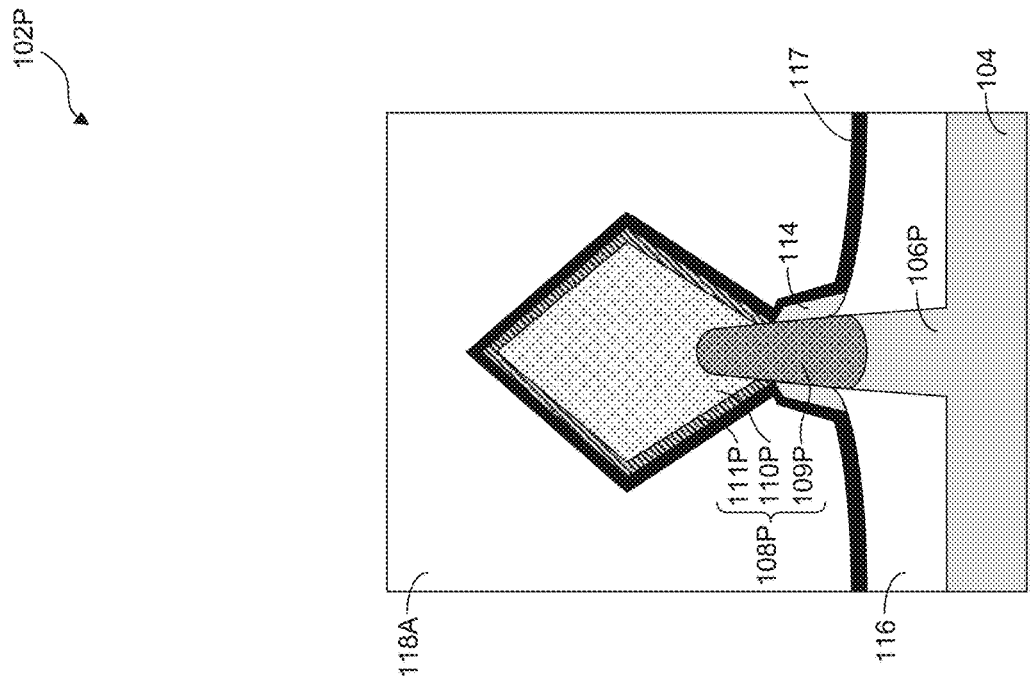
Figure 7C:
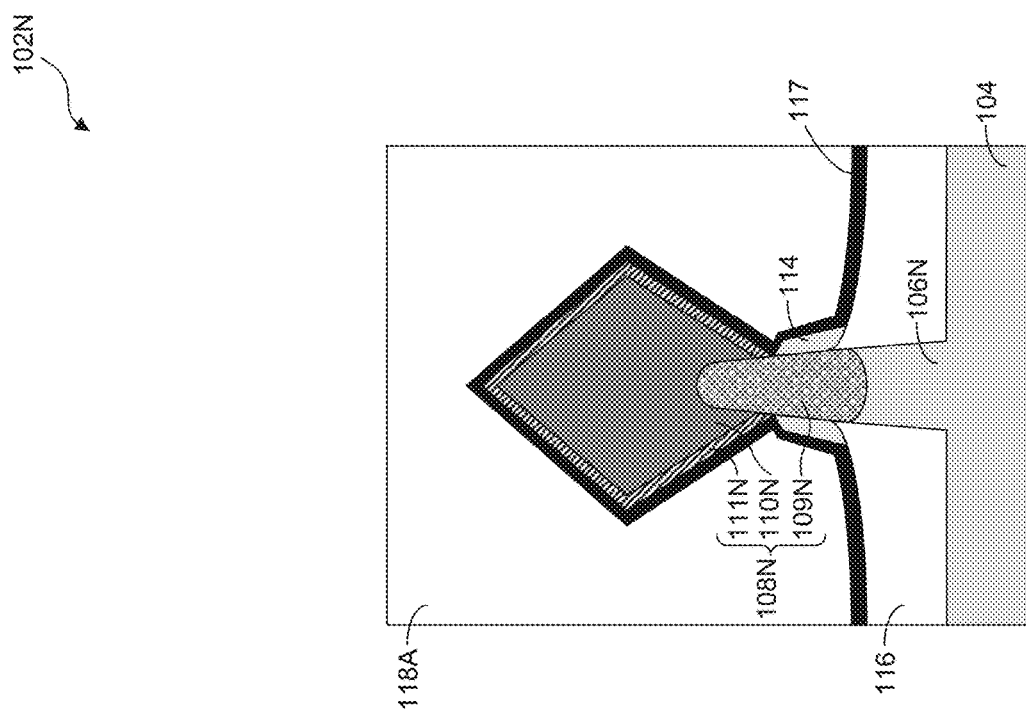

In operation 605, polysilicon structures and n- and p-type S/D regions are formed on fin structures on a substrate. For example, as shown in FIGS. 7A-7B, polysilicon structures 712N-712P and S/D regions 108N-108P are formed on fin structures 106N-106P, which are formed on substrate 104. During subsequent processing, polysilicon structures 712N-712P can be replaced in a gate replacement process to form gate structures 112N-112P. In some embodiments, the formation of S/D regions 108N-108P can include sequential operations of (i) forming S/D openings (not shown) in portions of fin structures 106N-106P that are not underlying polysilicon structures 712N-712P, (ii) patterning a masking layer (e.g., a photoresist layer; not shown) to cover the S/D opening in fin structure 106P, (iii) selectively epitaxially growing a Si layer (not shown) within S/D opening in fin structure 106N, (iv) selectively doping the Si layer with n-type dopants (e.g., phosphorus) to form LD and HD n-type layers 109N-110N, as shown in FIGS. 7A and 7C, (v) selectively epitaxially growing a SiGe layer (not shown) on HD n-type layer 110N, (vi) selectively doping the SiGe layer with p-type dopants (e.g., boron) to form p-type capping layer 111N, as shown in FIGS. 7A and 7C, (vii) removing the masking layer from the S/D opening in fin structure 106P, (viii) patterning a masking layer to cover S/D region 108N, (ix) selectively epitaxially growing a SiGe layer (not shown) within S/D opening in fin structure 106P, (x) selectively doping the SiGe layer with p-type dopants (e.g., boron) to form LD and HD p-type layers 109P-110P, as shown in FIGS. 7B and 7D, (xi) selectively epitaxially growing a Si layer (not shown) on HD p-type layer 110P, and (xii) selectively doping the Si layer with n-type dopants (e.g., phosphorus) to form n-type capping layer 111P, as shown in FIGS. 7B and 7D. After the formation of S/D regions 108N-108P, ESL 117 and ILD layer 118A can be formed to form the structures of FIGS. 7A-7D.

Figure 9B:
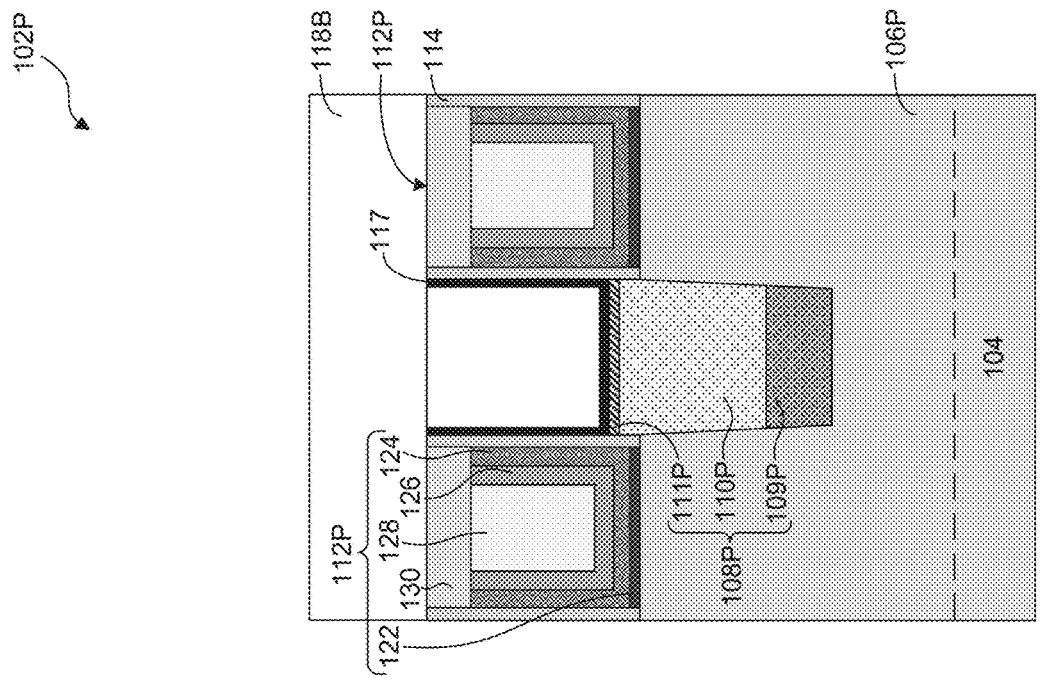
Figure 9A:
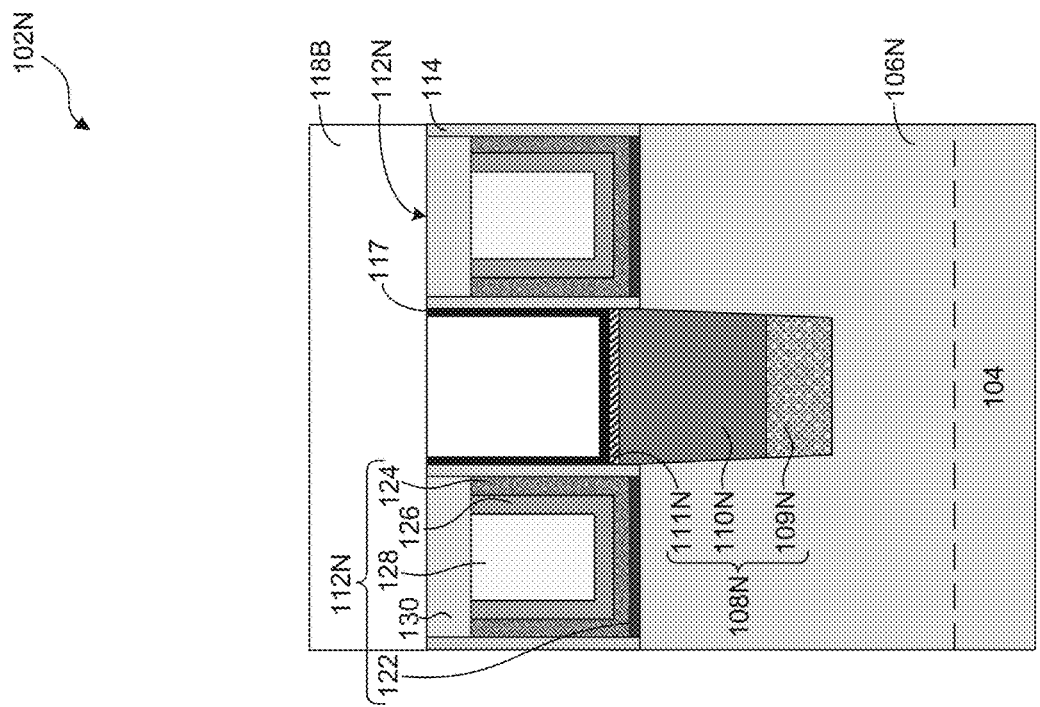
Figure 9D:
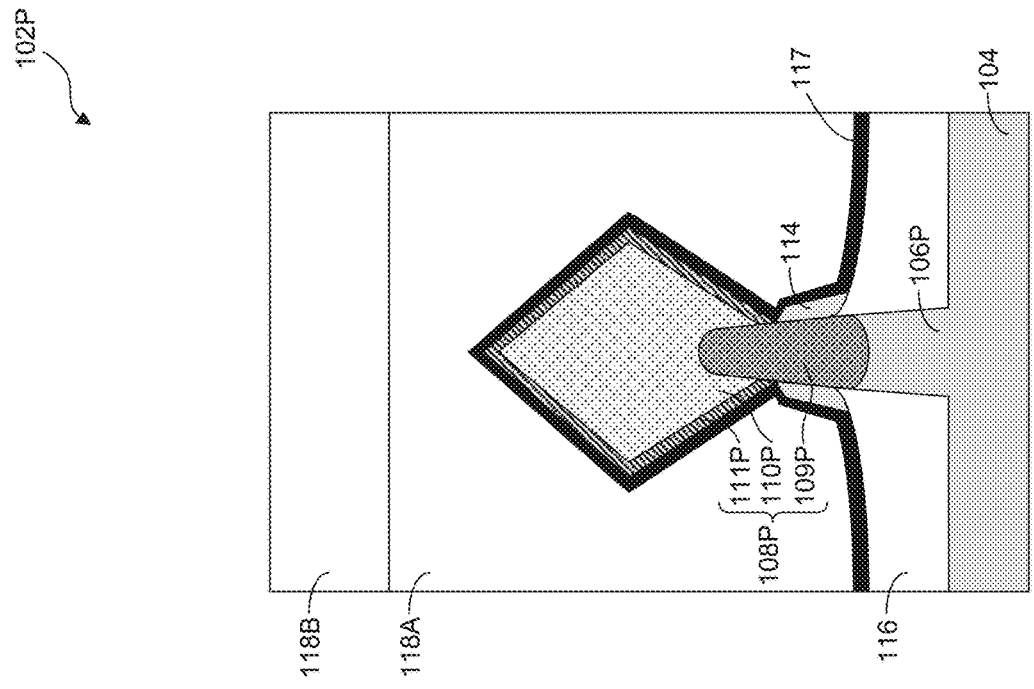
Figure 9C:
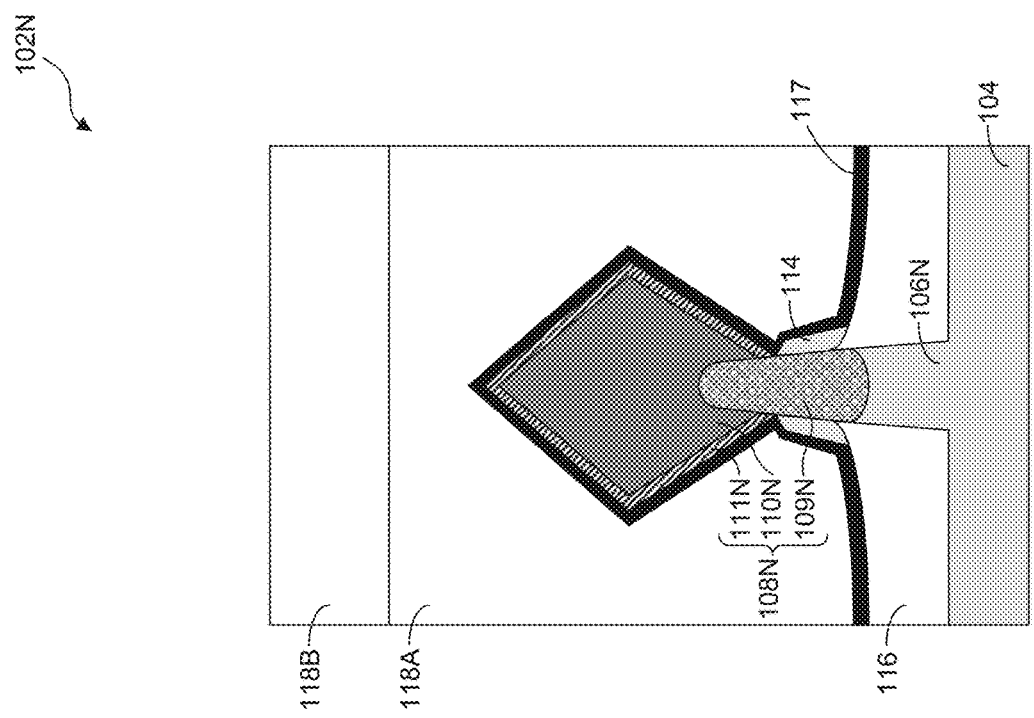
Figures 10A, 10B:
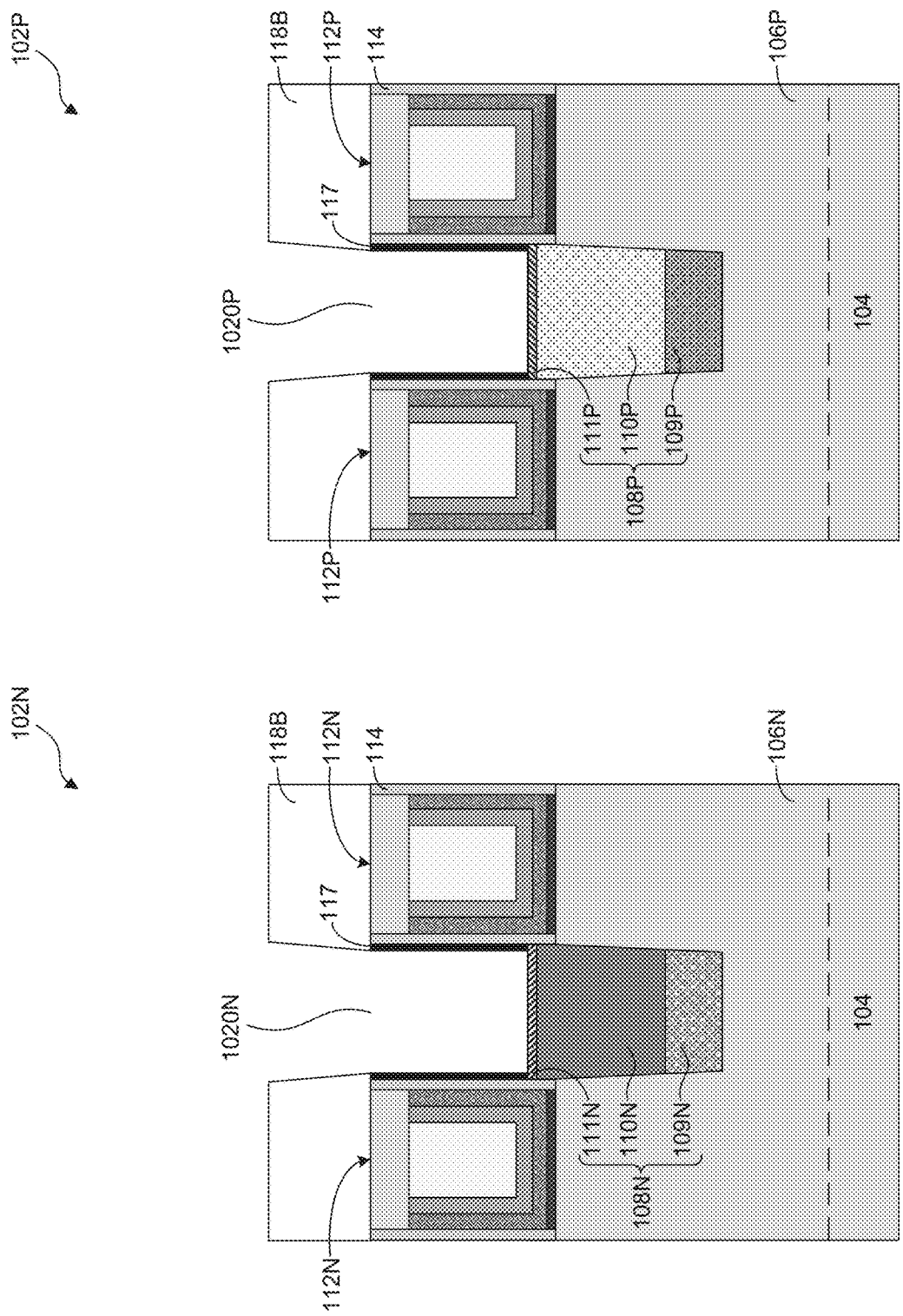
Figure 11B:
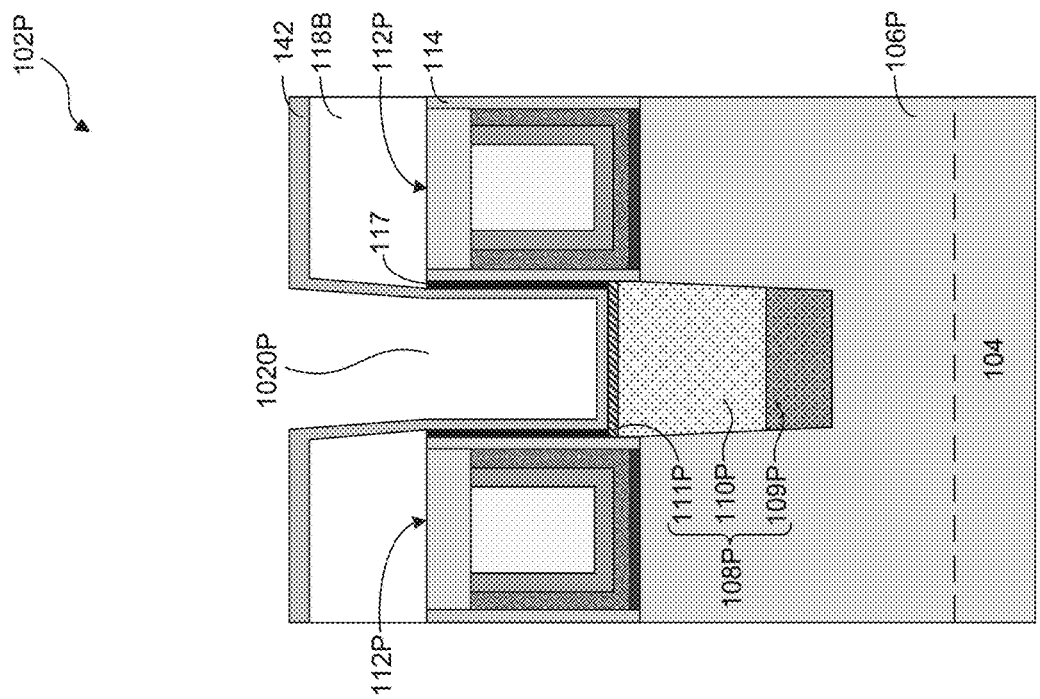
Figure 11A:
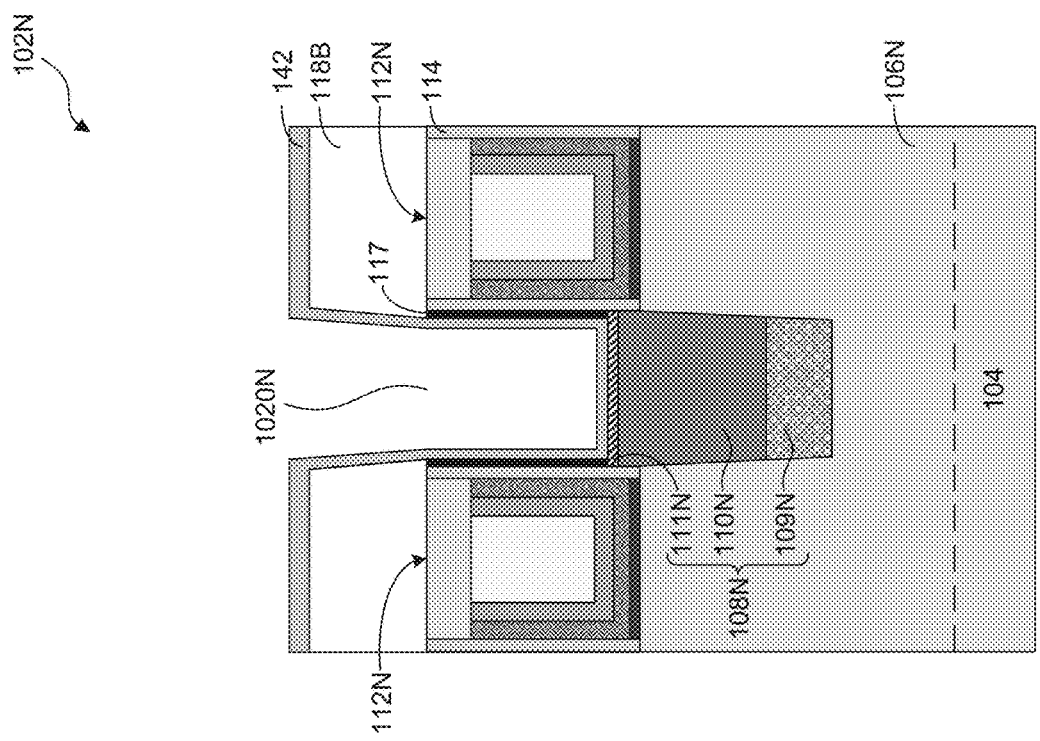
Figure 11D:
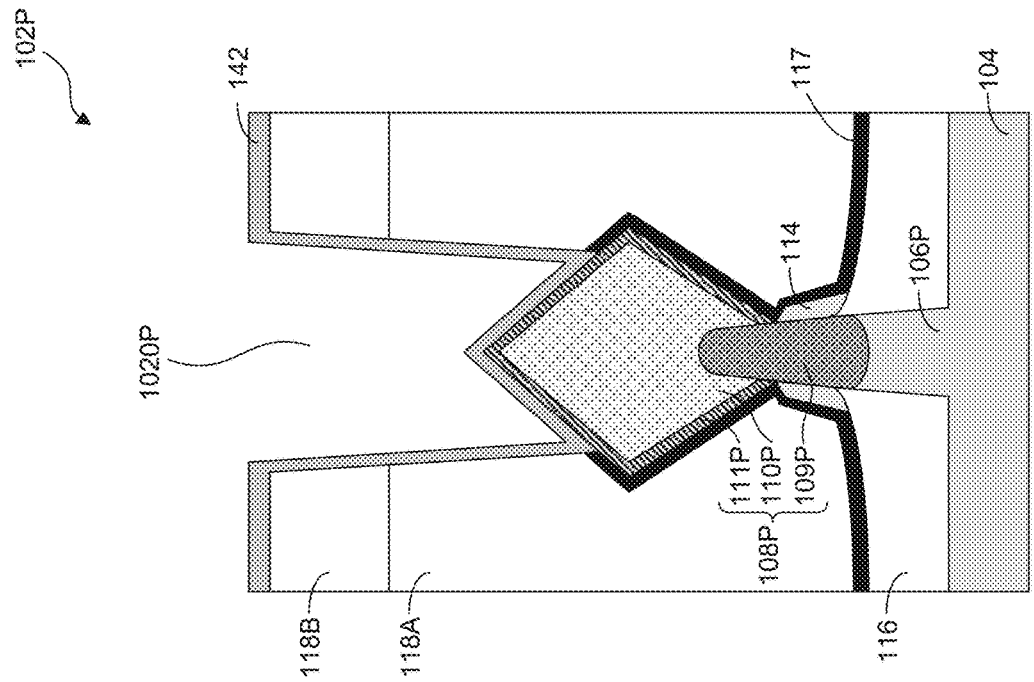
Figure 11C:
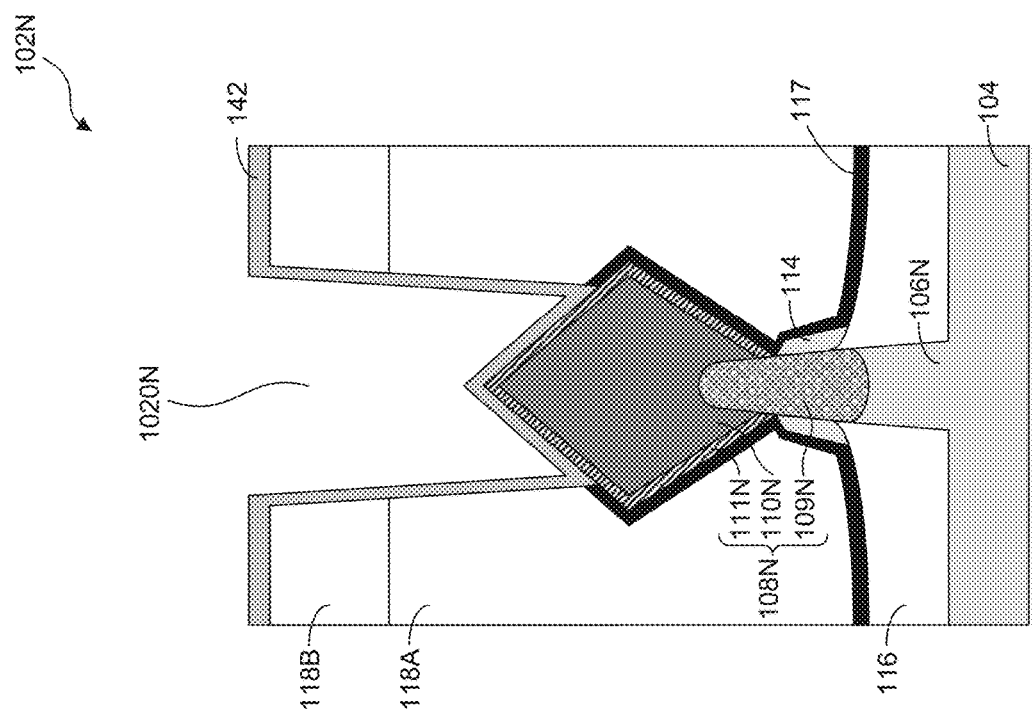
Figure 12B:
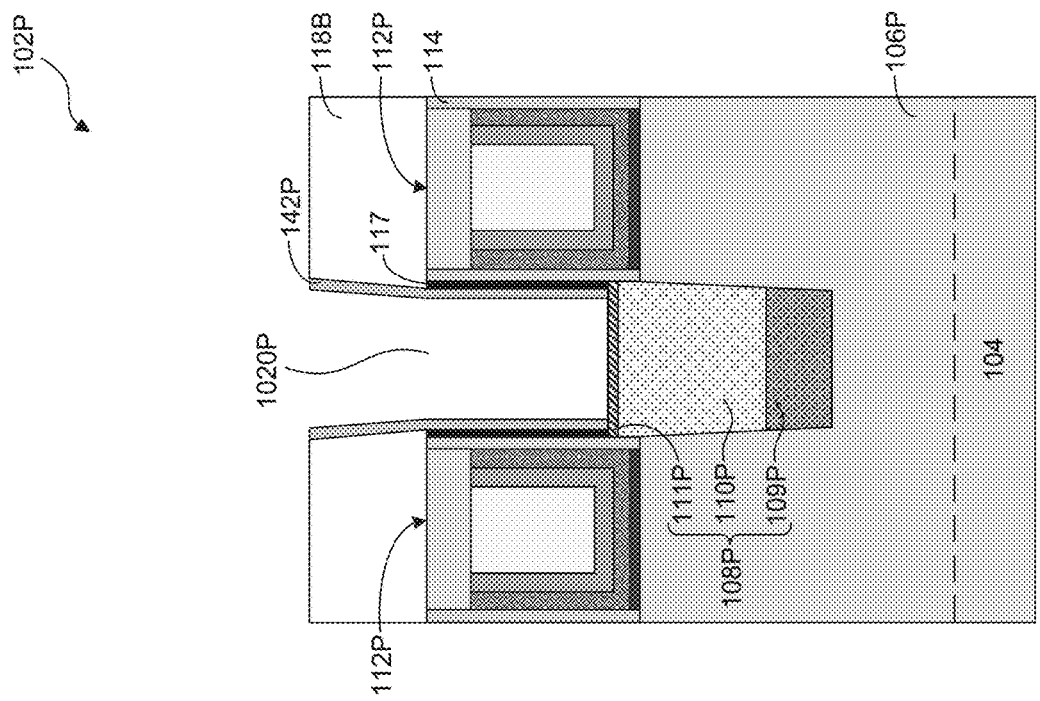
Figure 12A:
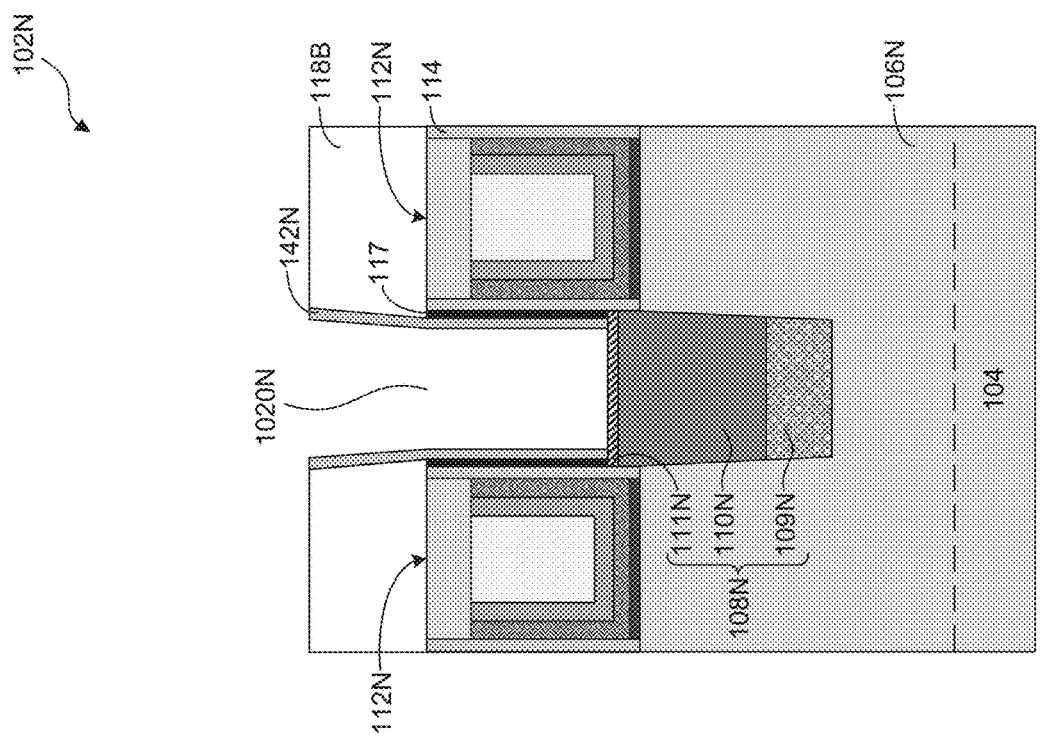
Figure 13B:
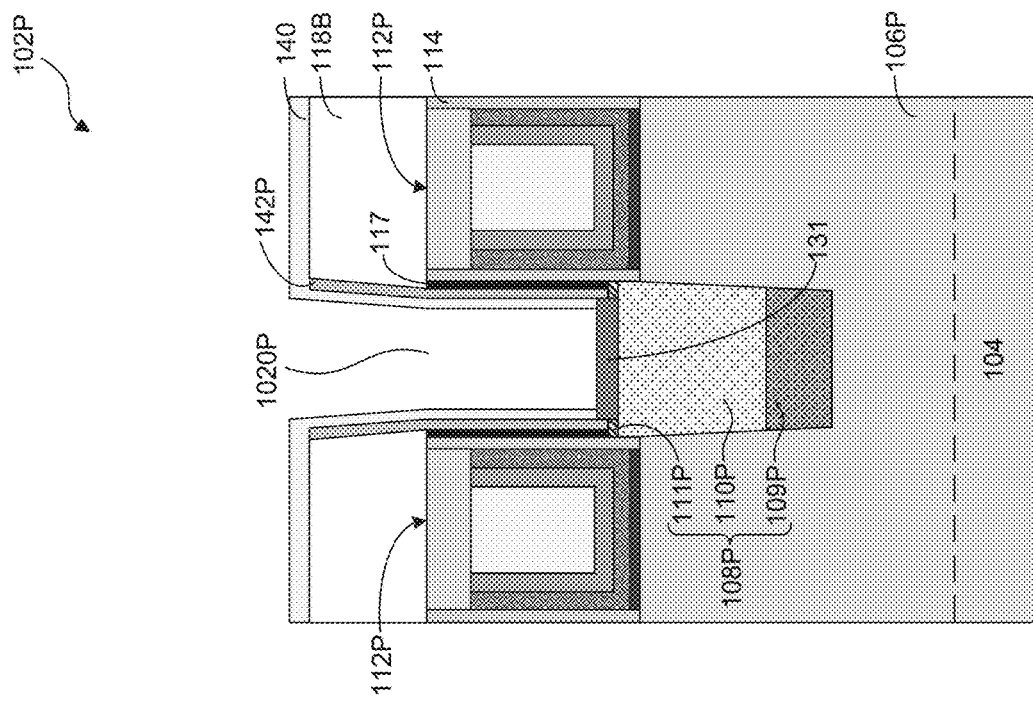
Figure 13A:
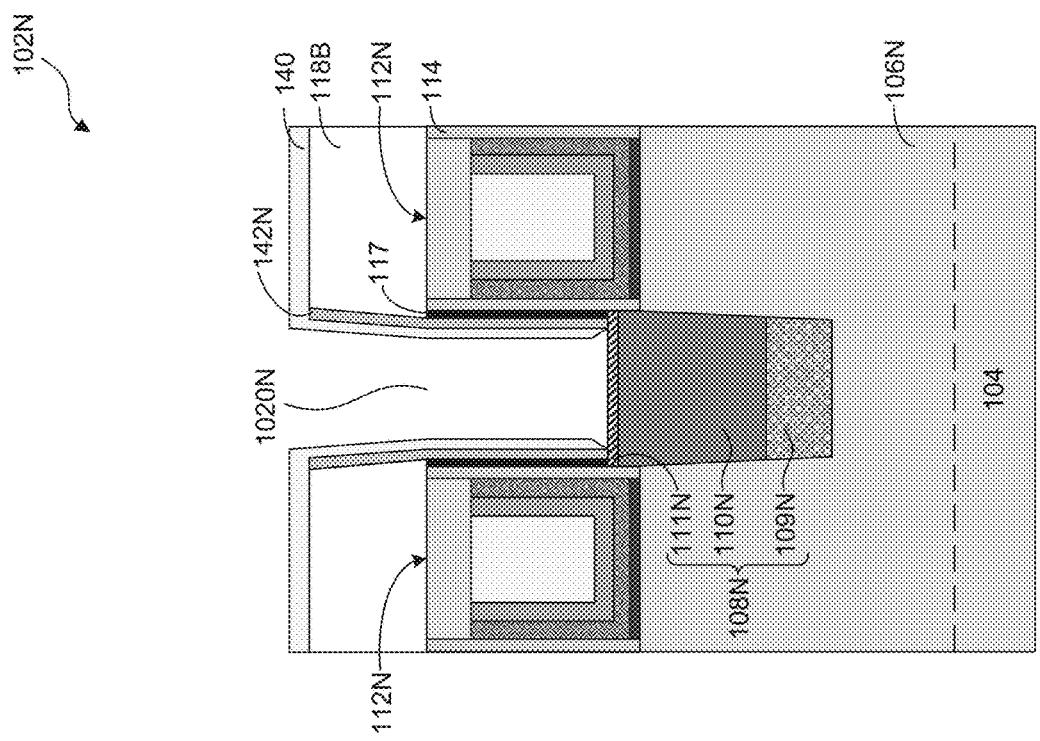
Figure 13D:
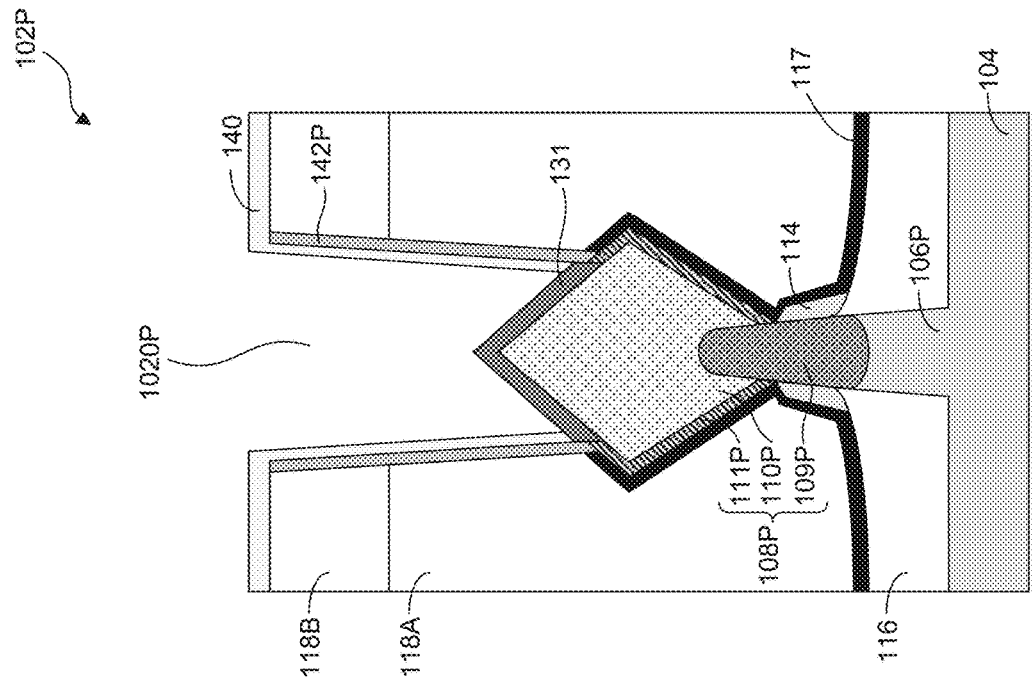
Figure 13C:
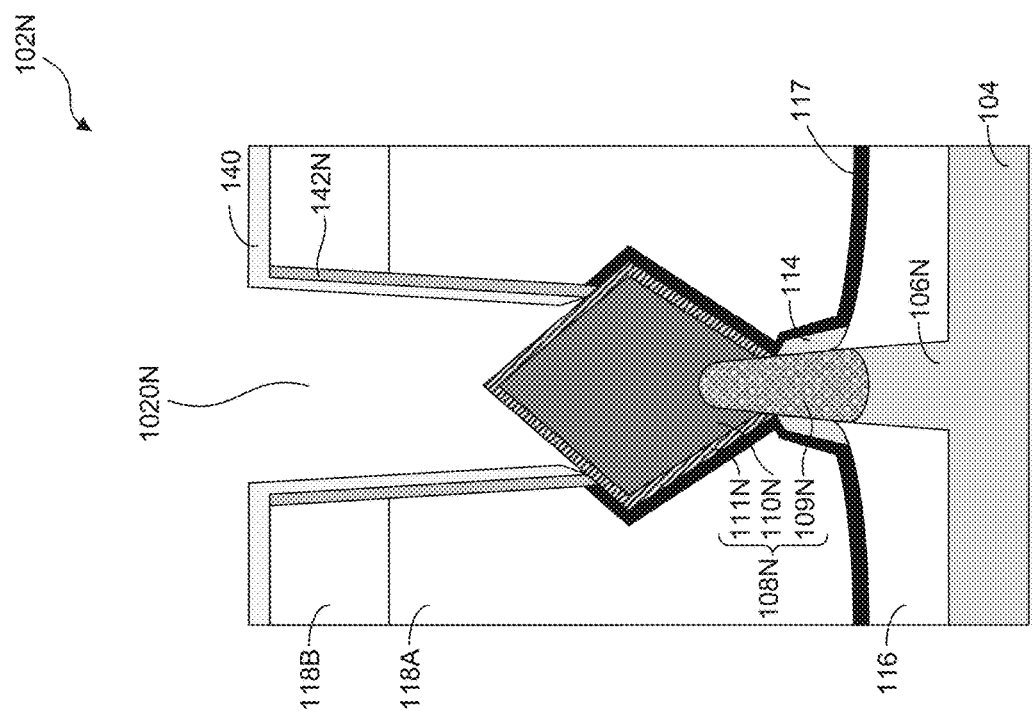
Figure 14B:
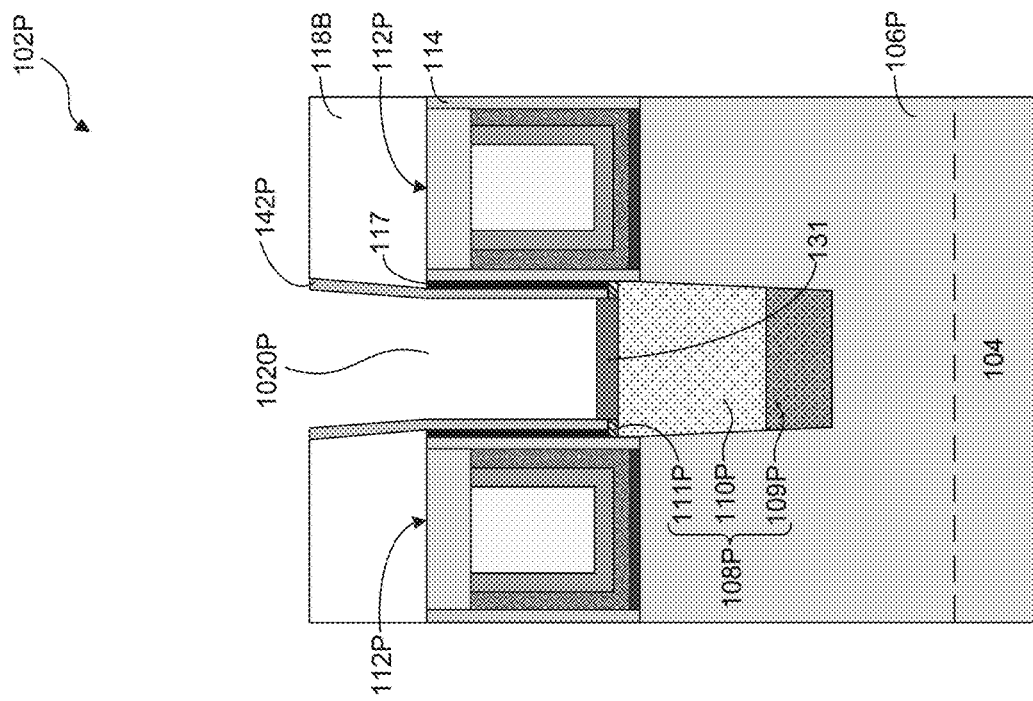
Figure 14A:
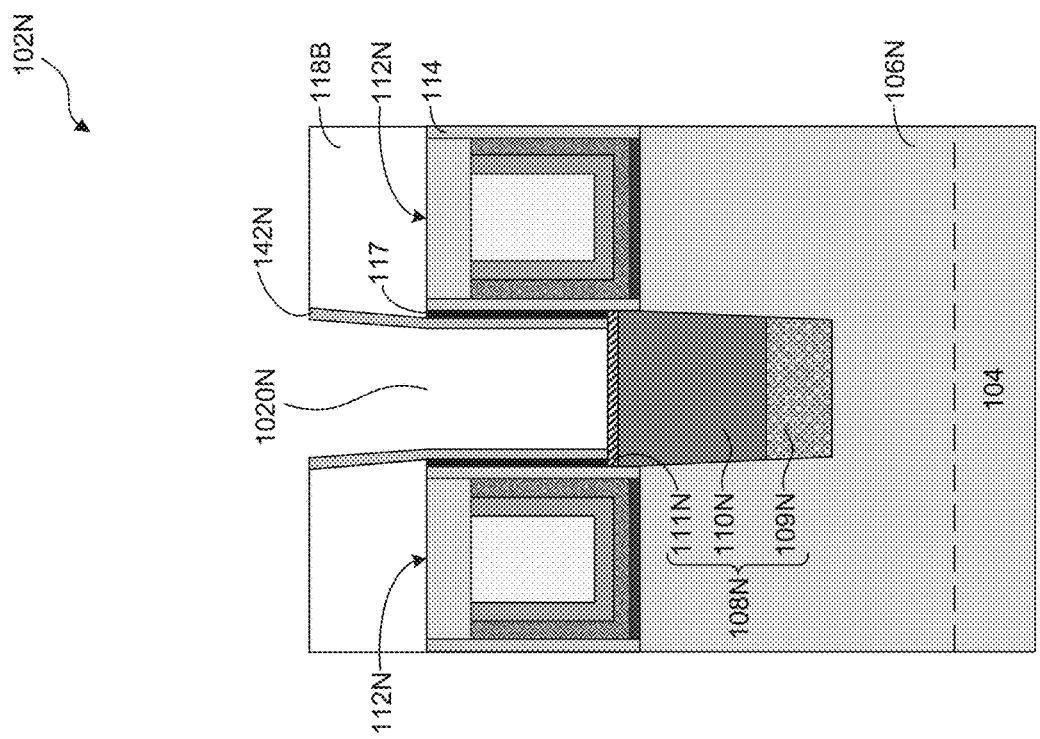
Figure 14D:
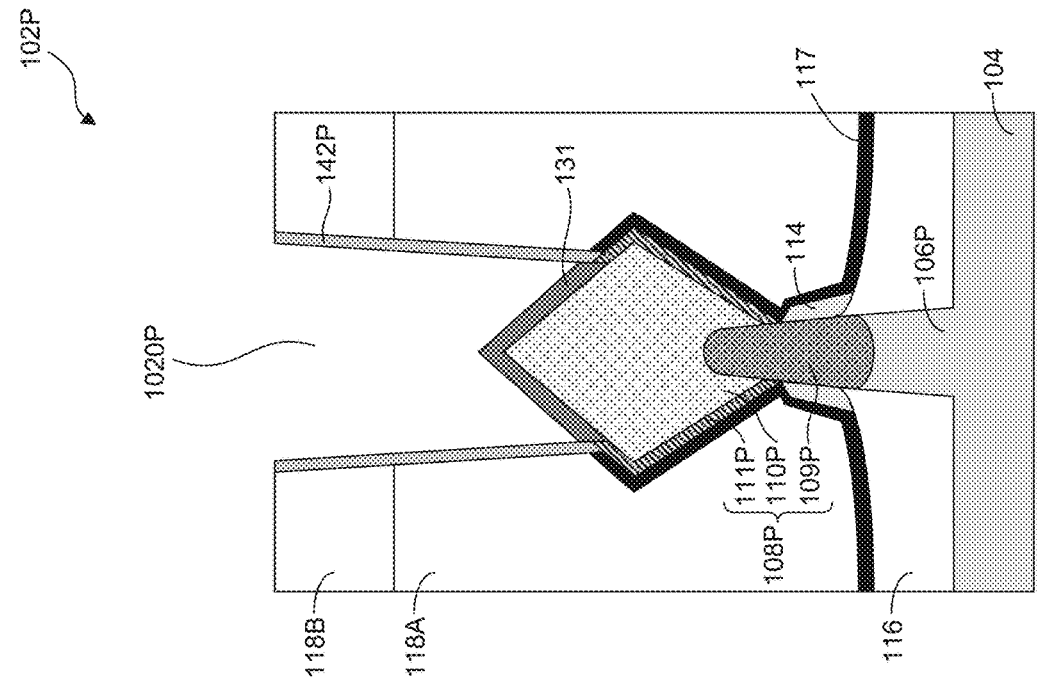
Figure 14C:
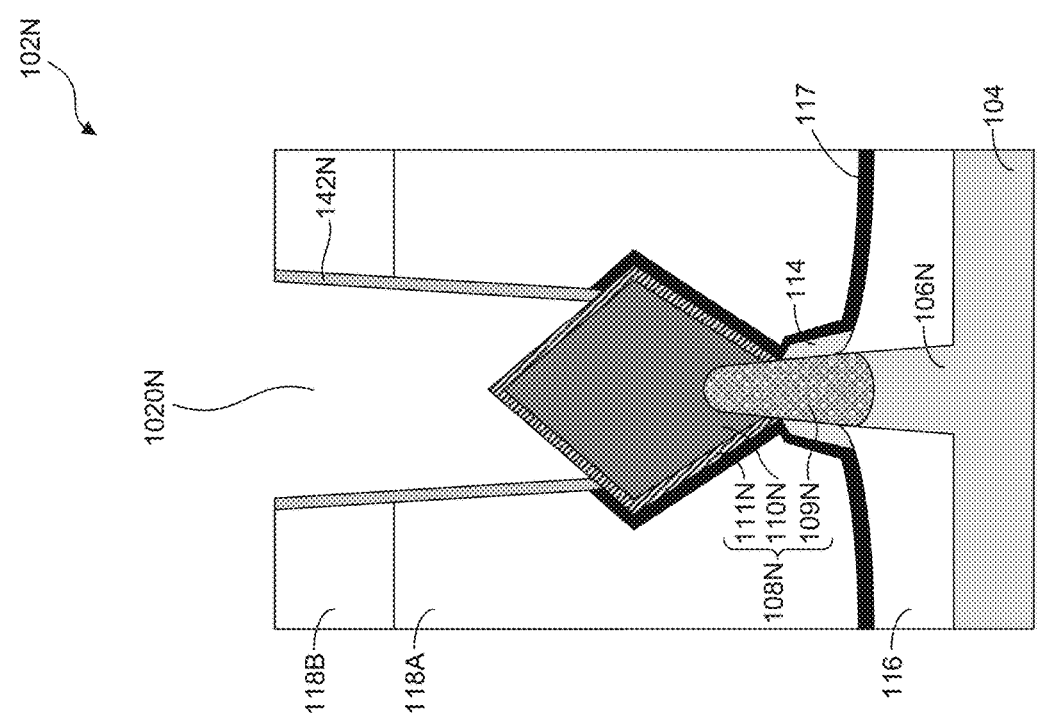
Figure 15B:
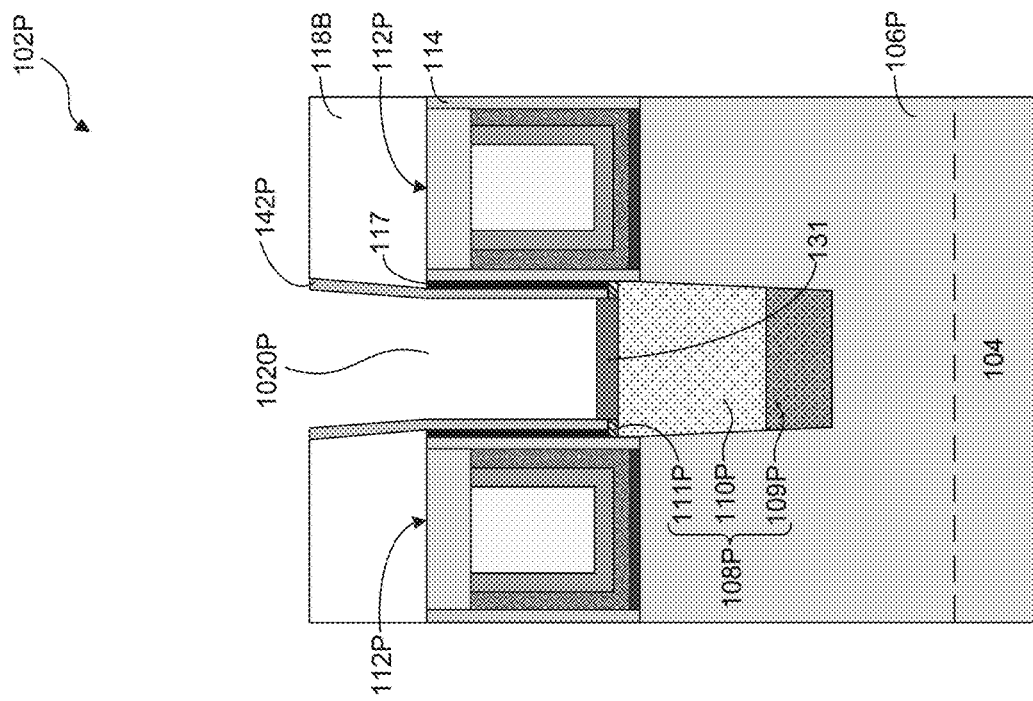
Figure 15A:
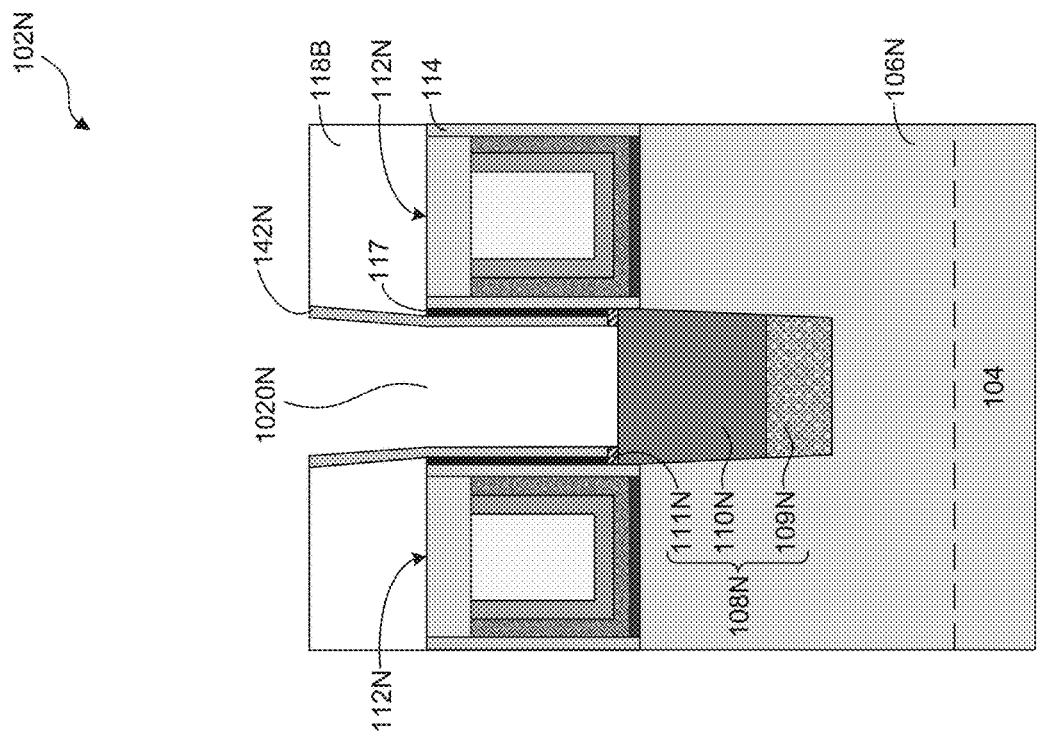
Figure 16B:
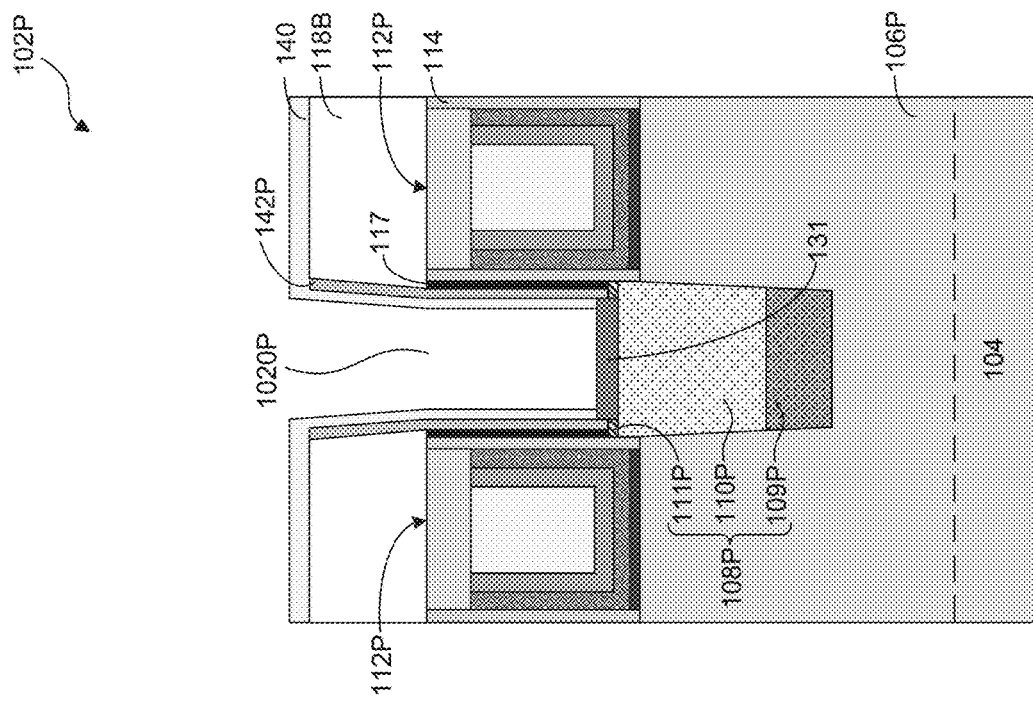
Figure 16A:
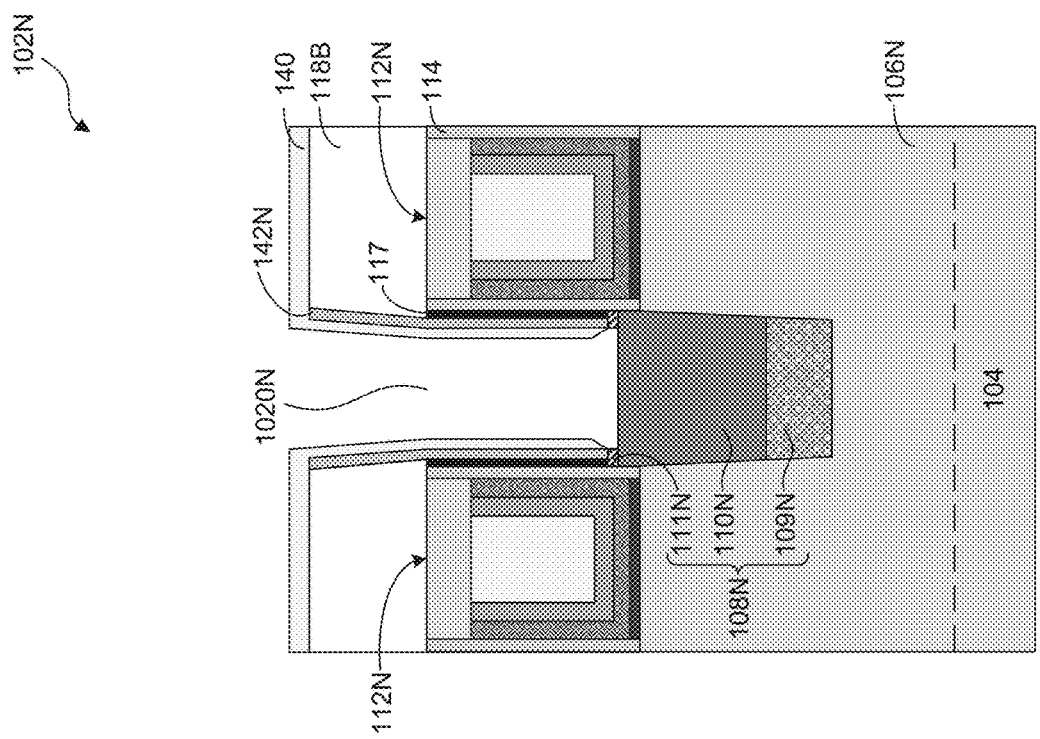
Figures 18A, 18B:
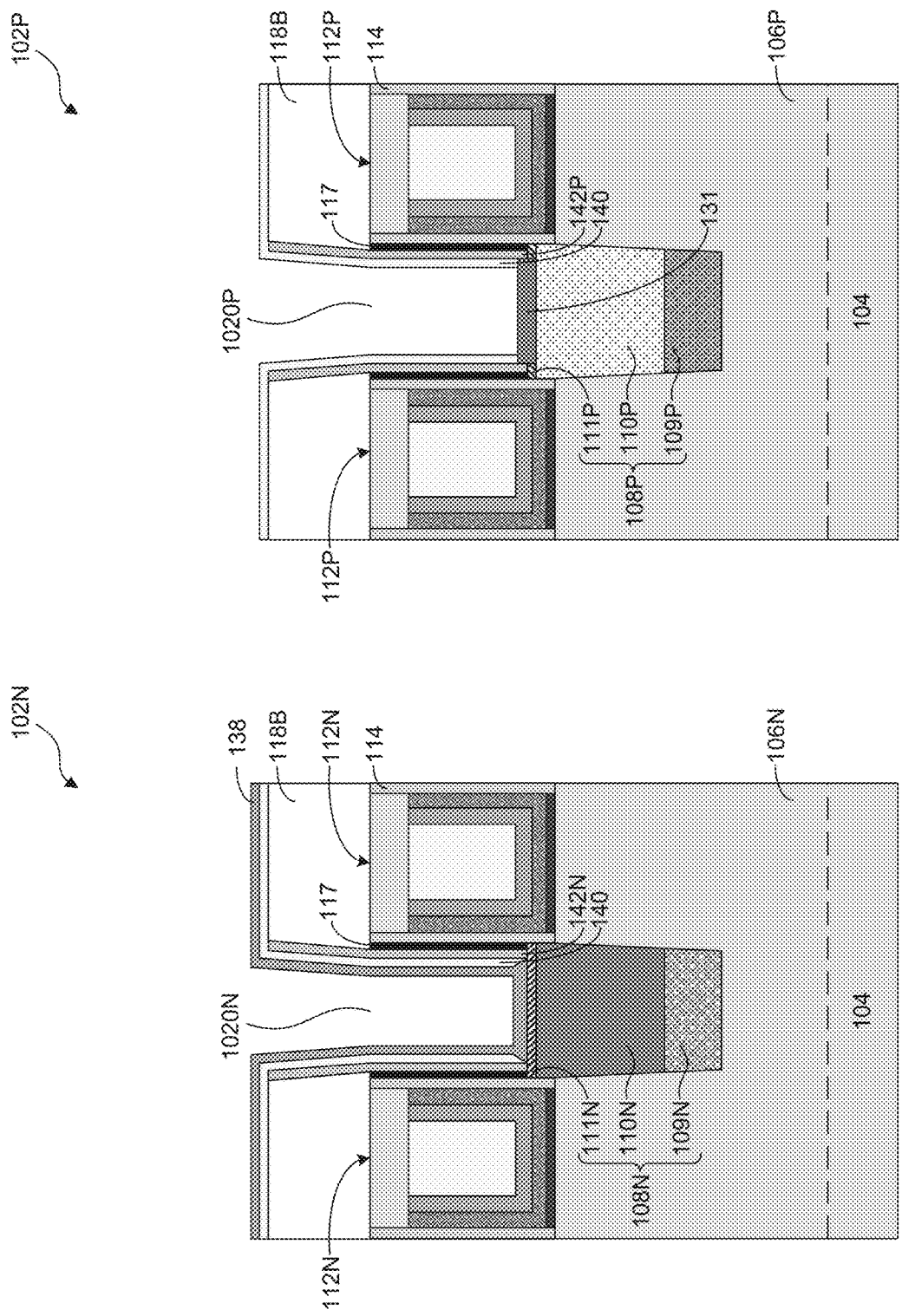
Figure 18D:
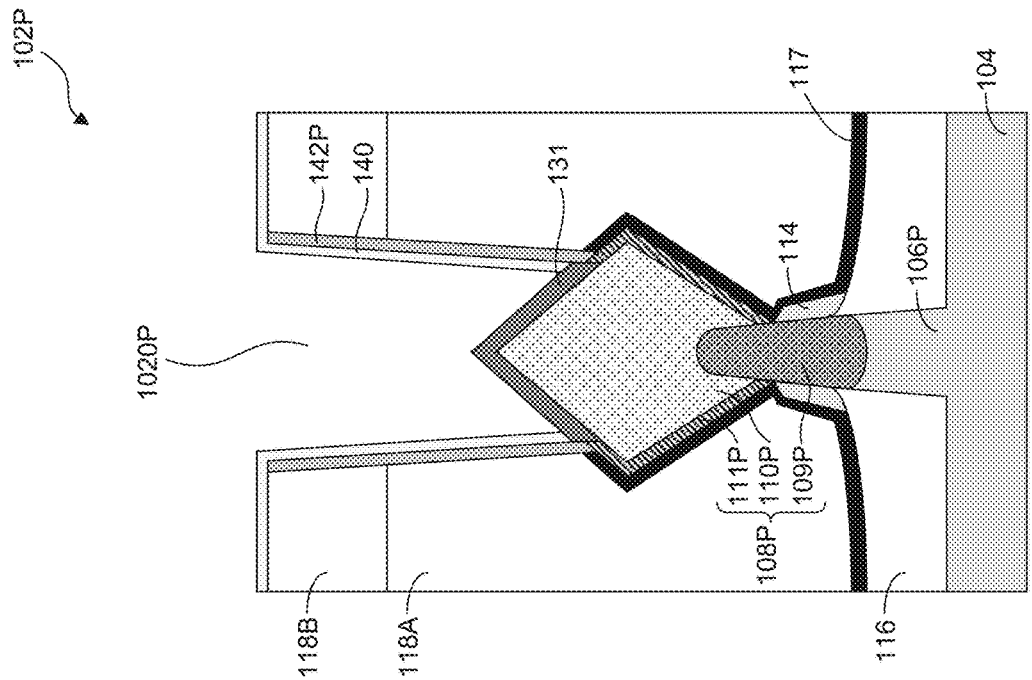
Figure 18C:
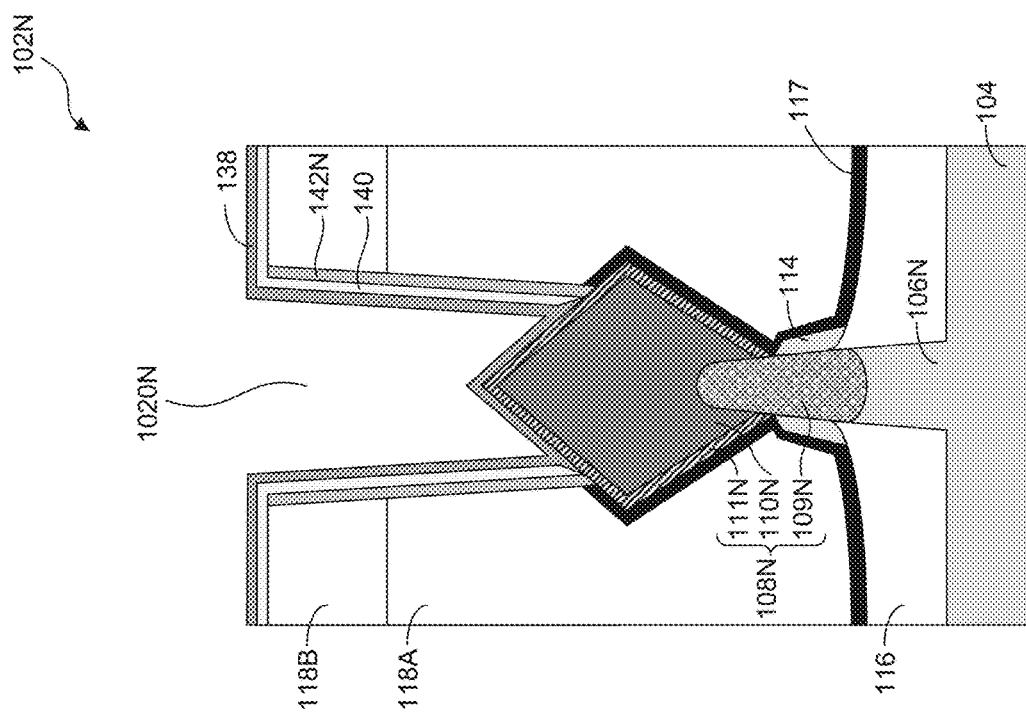

Referring to FIG. 6, in operation 610, polysilicon structures are replaced with gate structures. For example, as shown in FIGS. 8A-8B, polysilicon structures 712N-712P are replaced with gate structures 112N-112P. In some embodiments, gate structures 112N-112P can be etched back to form gate capping layers 130, as shown in FIGS. 9A-9B. After the formation of gate capping layers 130, ILD layer 118B can be formed to form the structures of FIGS. 9A-9D.

Referring to FIG. 6, in operation 615, first and second contact openings are formed on the n- and p-type source S/D regions. For example, as shown in FIGS. 10A-10D, first and second contact openings 1020N-1020P are formed on S/D regions 108N-108P by etching portions of ESL 117 and ILD layers 118A-118B on S/D regions 108N-108P.

Referring to FIG. 6, in operation 620, barrier layers are selectively formed on sidewalls of the first and second contact openings. For example, as described with respect to FIGS. 11A-12D, barrier layers 142N-142P are selectively formed on sidewalls of first and second contact openings 1020N-1020P. The formation of barrier layers 142N-142P can include sequential operations of (i) depositing a nitride layer 142 (e.g., SiN) on the structures of FIGS. 10A-10D to form the structures of FIGS. 11A-11D and (ii) performing an isotropic etch process to remove portions of nitride layer 142 from top surfaces of ILD layer 118A and p- and n-type capping layers 111N-111P to form the structures of FIGS. 12A-12D.

Referring to FIG. 6, in operation 625, a pWFM silicide layer is selectively formed on the p-type S/D region. For example, as shown in FIGS. 13A-13D, pWFM silicide layer 131 is selectively formed on S/D region 108P. The selective formation of pWFM silicide layer 131 can include depositing a pWFM layer 140 on the structures of FIGS. 12A-12D, which can initiate a silicidation reaction between n-type capping layer 111P and the bottom portion of pWFM layer 140 (not shown) deposited on n-type capping layer 111N to form the structures of FIGS. 13A-13D. In some embodiments, pWFM layer 140 can include a work function value closer to a valence band-edge energy than a conduction band-edge energy of the material of HD p-type layer 110P of S/D region 108P. For example, pWFM layer 140 can include a metal with a work function value greater than 4.5 eV (e.g., about 4.5 eV to about 5.5 eV), which can be closer to the valence band energy 5.2 eV of Si or 4.8 eV of SiGe than the conduction band energy 4.1 eV of Si or 3.8 eV of SiGe of HD p-type layer 110P. In some embodiments, pWFM layer 140 can include Ni, Co, Mn, W, Fe, Rh, Pd, Ru, Pt, Ir, Os, or a combination thereof.

The deposition of pWFM layer 140 can include depositing about 0.5 nm to about 5 nm thick pWFM layer with a chemical vapor deposition (CVD) process or an atomic layer deposition (ALD) process at a temperature ranging from about 160° C. to about 220° C. and a pressure ranging from about 5 Torr to about 10 Torr. In some embodiments, the ALD process can include about 300 cycles to about 800 cycles, where one cycle can include sequential periods of (i) metal precursor, reactant, and carrier gas mixture flow and (ii) a gas purging process for a period of about 3 seconds to about 15 seconds. In some embodiments, the reactant gas can include ammonia ($NH_3$), carrier gas can include nitrogen or argon, and purging gas can include a noble gas.

In some embodiments, the metal precursor can include metal complexes, such as Bis(1,4-di-t-butyl-1,3-diazabutadienyl)M, $M(tBuNNCHCtBuO)_2$, $M(eBuNNCHCiPrO)_2$, and $M(tBuNNCMeCMeO)_2$, where M can be Ni, Co, Mn, W, Fe, Rh, Pd, Ru, Pt, Ir, or Os. As metal complexes have a higher affinity for Si than SiGe, pWFM layer 140 deposits on n-type capping layer 111P, which includes Si and does not deposit on p-type capping layer 111N, which includes SiGe. The strained lattice structure of SiGe inhibits the adhesion of the metal complexes on p-type capping layer 111N, and as a result, prevents the formation of pWFM layer 140 on p-type capping layer 111N of NFET. Thus, the use of metal complexes as metal precursors for pWFM layer 140 reduces the number of processing steps by eliminating the use of lithography and etching process for the selective formation of pWFM silicide layer 131 in PFET 102P, and consequently reduces the device manufacturing cost.

In some embodiments, a cleaning process can be performed on the structures of FIGS. 12A-12D prior to the deposition of pWFM layer 140. The cleaning process can include a fluorine-based dry etching process to remove native oxides from top surfaces of p-type capping layer 111N and n-type capping layer 111P.

In some embodiments, after the formation of pWFM silicide layer 131, the portions of pWFM layer 140 on sidewalls of contact openings 1020N-1020P can be removed by a wet etching process to form the structures of FIGS. 14A-14D. In some embodiments, the exposed portions of p-type capping layer 111N within contact opening 1020N can be selectively removed from the NFET structure of FIGS. 13A and 13C or from the NFET structure of FIGS. 14A and 14C by a wet or dry etching process to form the NFET structure of FIGS. 16A and 16C.

Referring to FIG. 6, in operation 630, doped nWFM silicide layers are formed on the n-type S/D region and on the pWFM silicide layer. For example, as shown in FIGS. 19A-19D, doped nWFM silicide layers 132N and 132P are formed on S/D region 108N and on pWFM silicide layer 131, respectively. The formation of doped nWFM silicide layers 132N-132P can include sequential operations of (i) performing a cleaning process (e.g., fluorine-based dry etching process) on the structures of FIGS. 13A-13D to remove native oxides from top surfaces of p-type capping layer 111N and pWFM silicide layer 131, (ii) depositing a dopant source layer 138 on the cleaned structures of FIGS. 13A-13D to form the structures of FIGS. 17A-17D, and (iii)

depositing an nWFM layer 136 on the structures of FIGS. 17A-17D to form the structures of FIGS. 19A-19D.

Figure 19D:
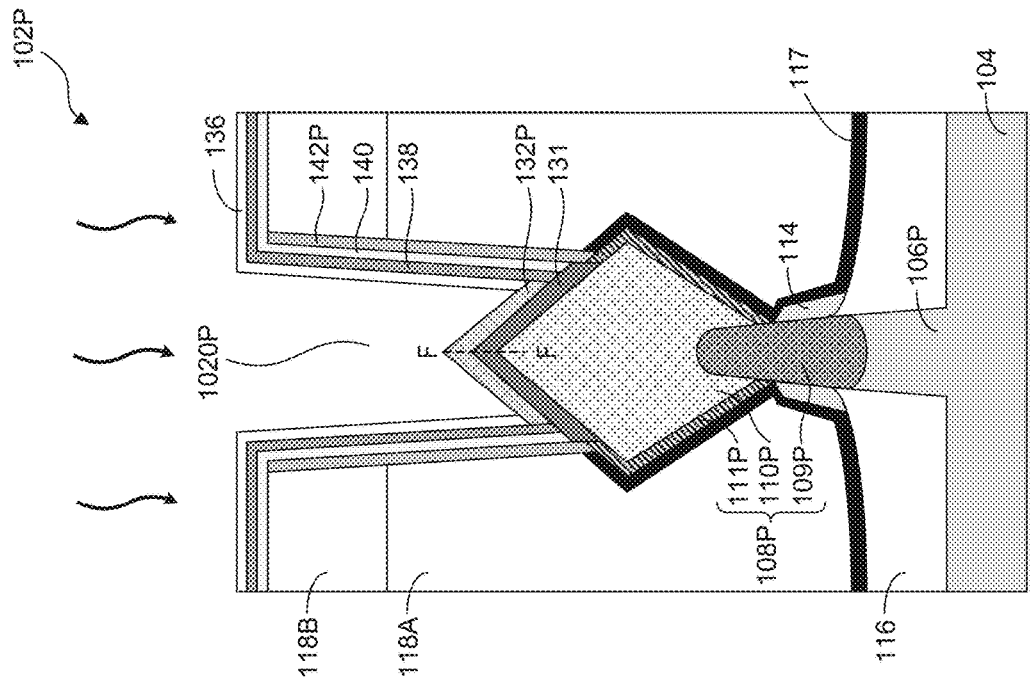
Figure 19C:
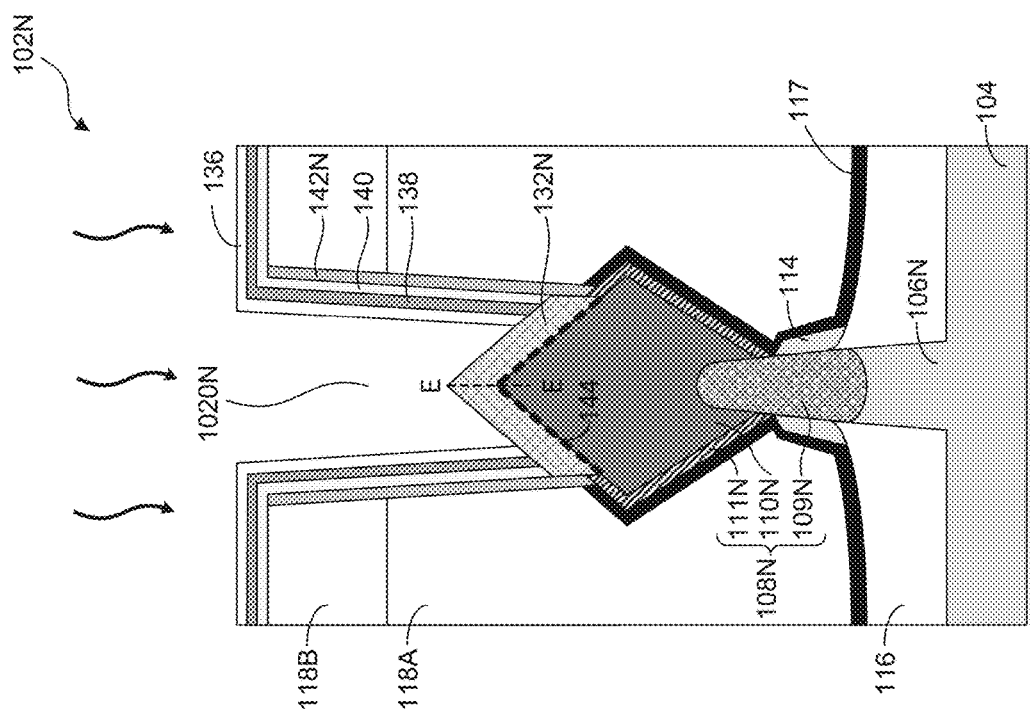
Figure 20B:
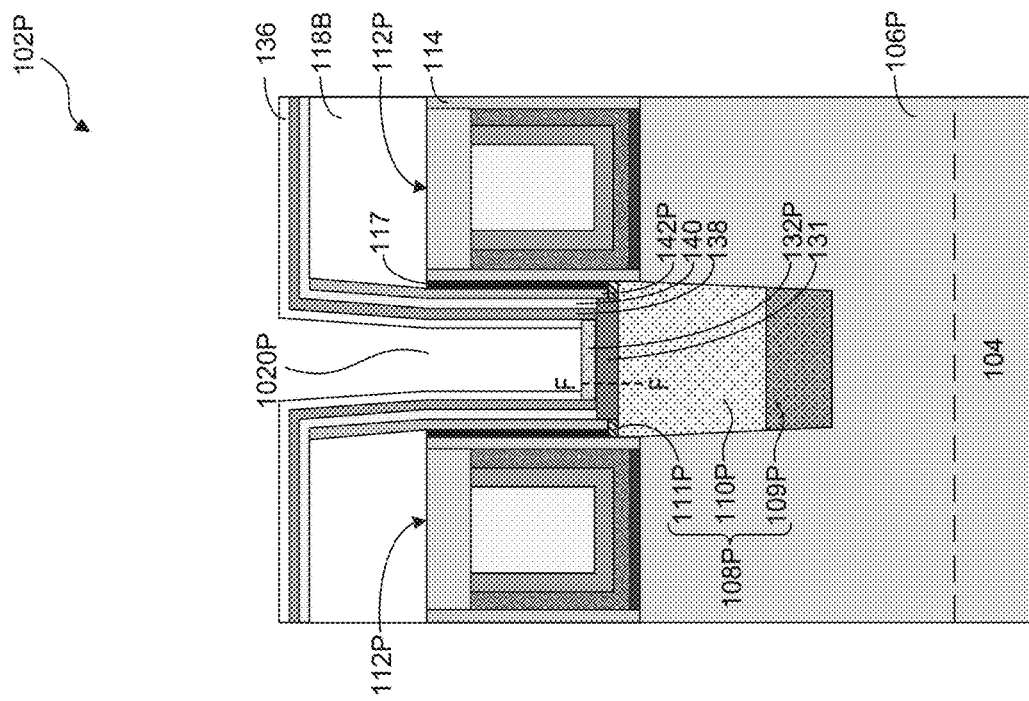
Figure 20A:
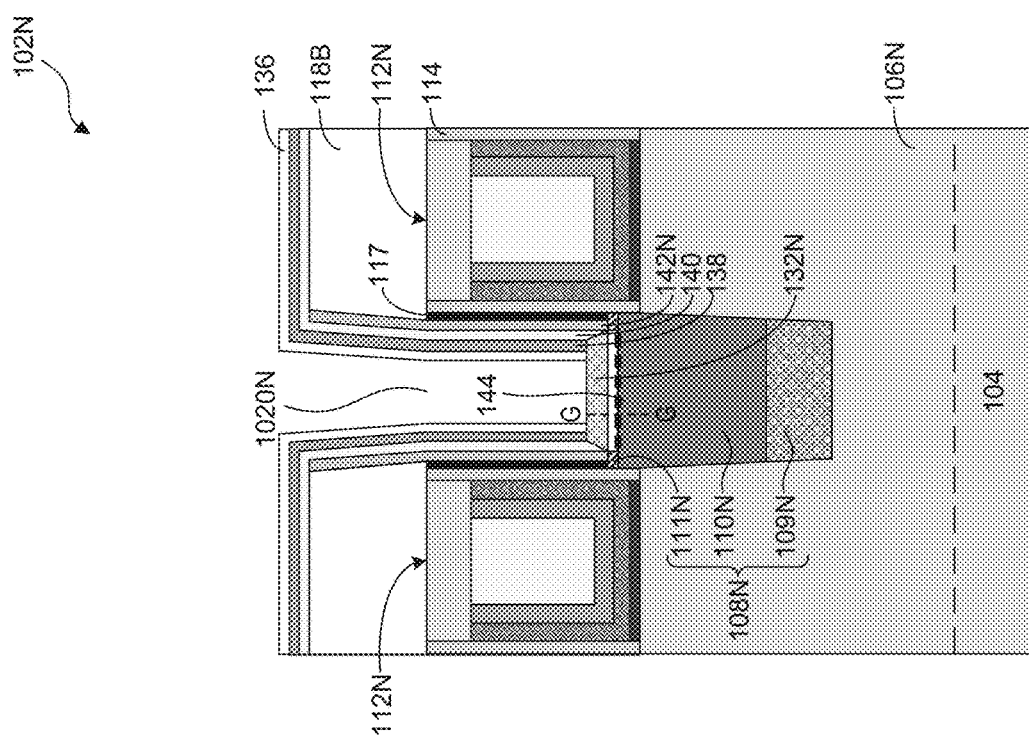
Figure 20D:
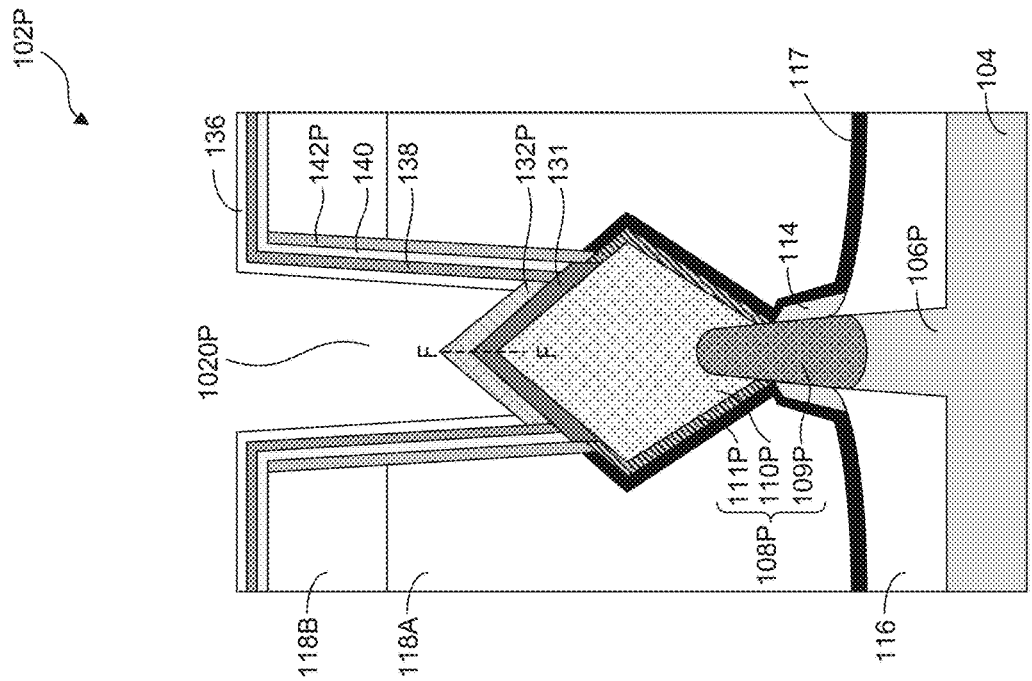
Figure 20C:
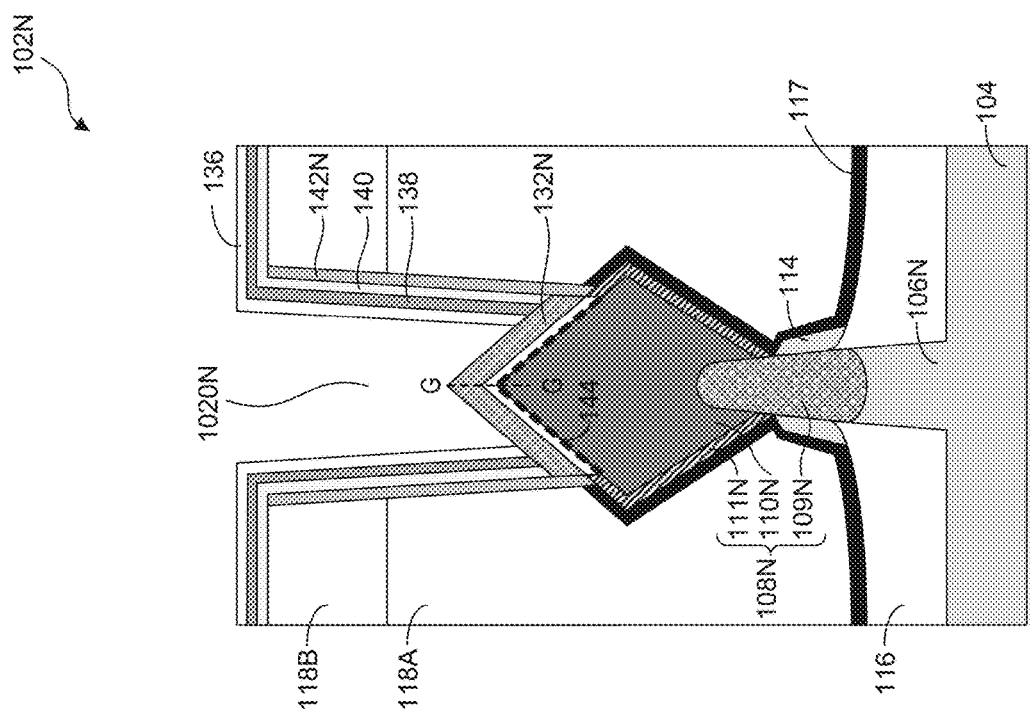
Figure 21B:
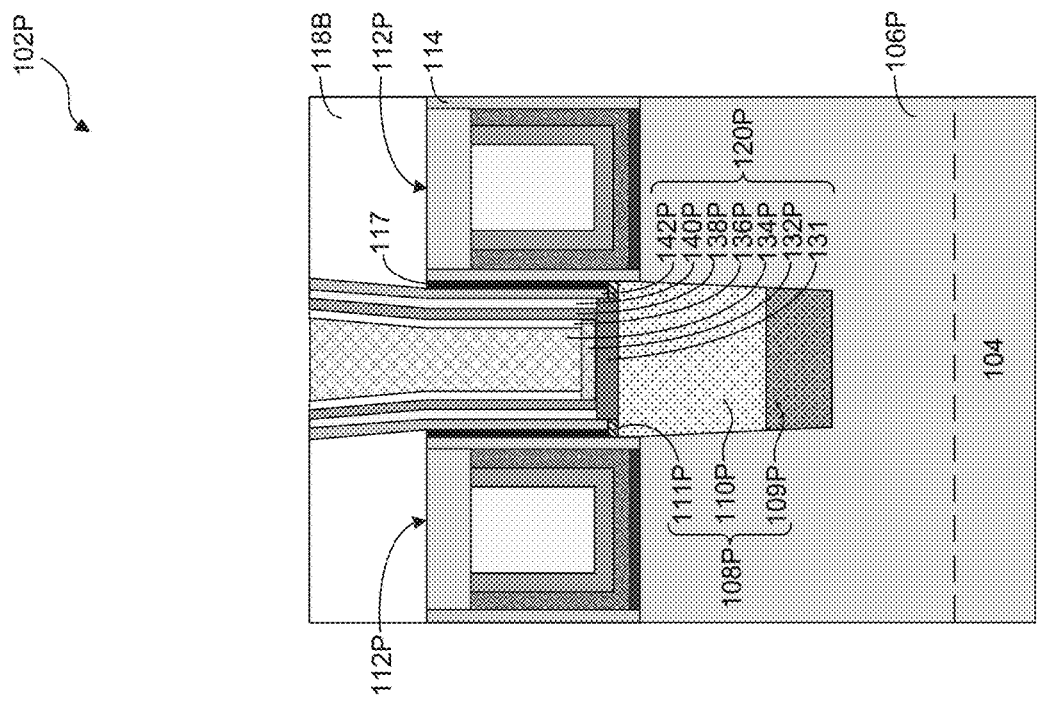
Figure 21A:
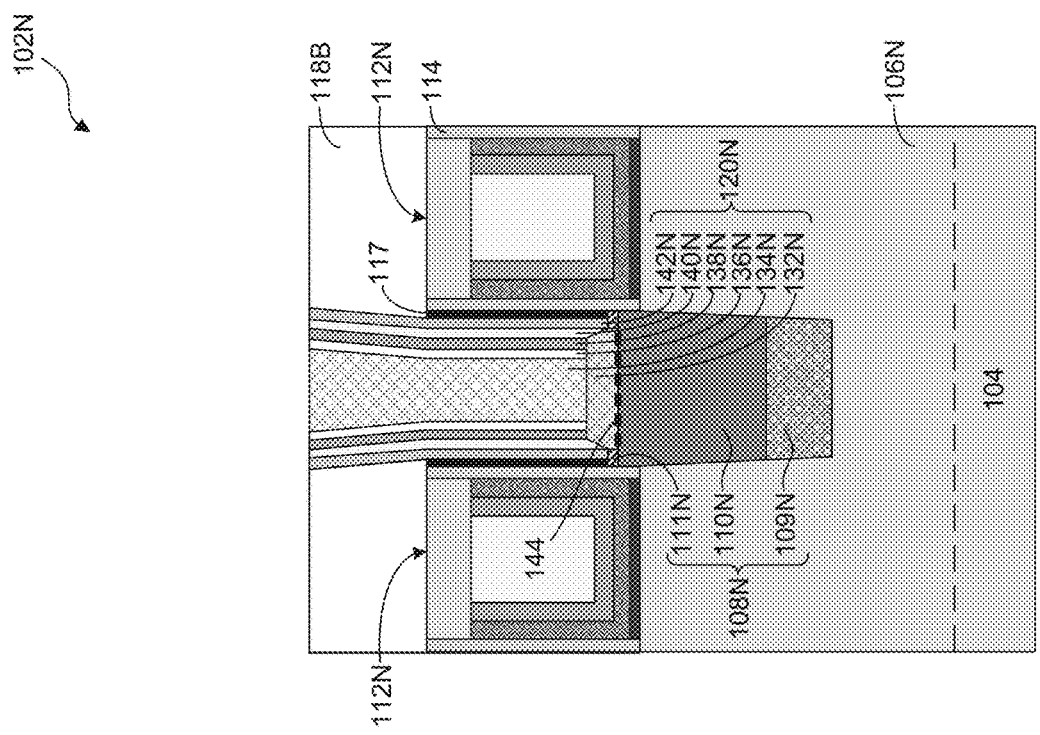
Figure 21C:
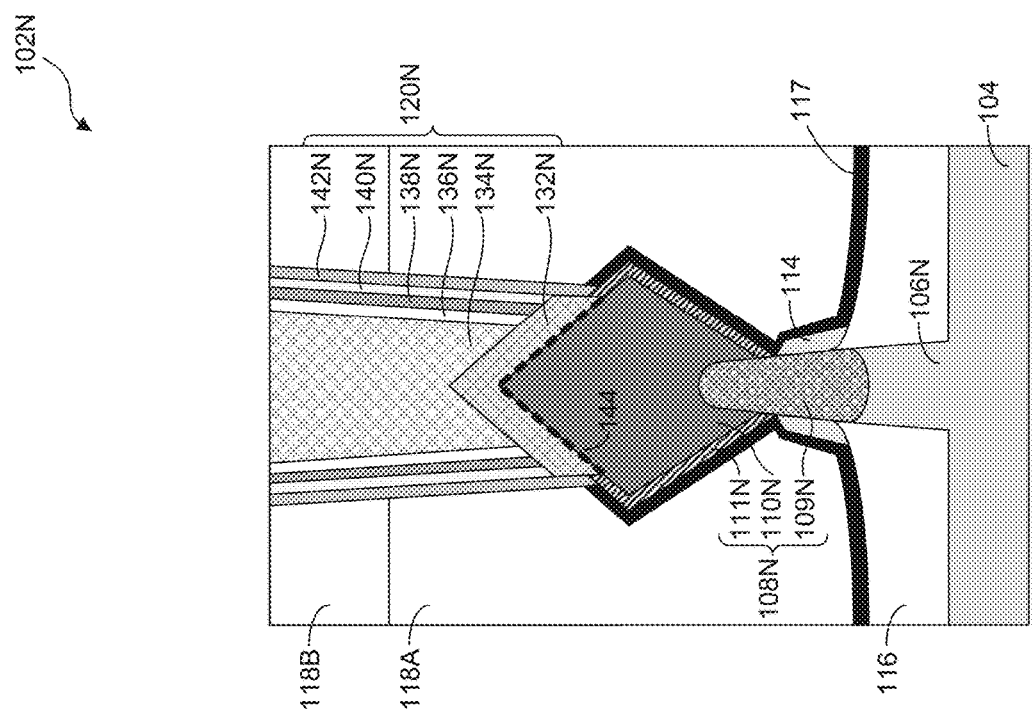
Figure 21D:
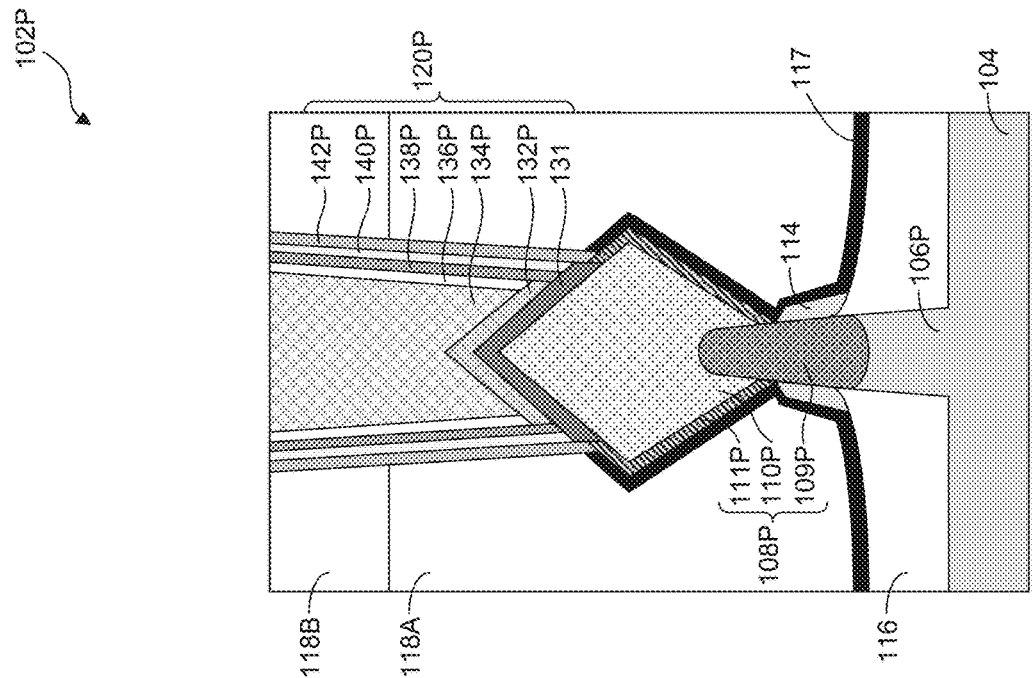

During the deposition of nWFM layer 136, the deposition temperature can cause the bottom portions 138b (shown in FIGS. 17A-17B) of dopant source layer 138 to thermally decompose and the atoms of the thermally decomposed bottom portions 138b to diffuse into the overlying nWFM layer 136 as dopant atoms. The dopant atoms can induce the formation of dipole layer 144 and can have concentration profiles 246 or 248 across lines E-E and concentration profiles 252 or 254 across lines F-F, as described with reference to FIGS. 2A-2F. The deposition temperature can also initiate silicidation reactions between (i) the doped bottom portion of nWFM layer 136 (not shown) within contact opening 1020N and p-type capping layer 111N to form nWFM silicide layer 132N, as shown in FIGS. 19A and 19C, and (ii) the doped bottom portion of nWFM layer 136 within contact opening 1020P and HD p-type layer 111P through pWFM silicide layer 131 to form nWFM silicide layer 132P, as shown in FIGS. 19B and 19D. In some embodiments, after the deposition of dopant source layer 138, the portions of dopant source layer 138 on the PFET structure of FIGS. 17B and 17D can be selectively removed, as shown in FIGS. 18A-18D, to form undoped nWFM silicide layer 132P (not shown) and doped nWFM silicide layer 132N.

In some embodiments, the deposition of dopant source layer 138 can include depositing a transition metal, which has an electronegativity value smaller than the electronegativity value of the metal of nWFM layer 136 using a CVD process or an ALD process at a temperature ranging from about 300° C. to about 500° C. In some embodiments, dopant source layer 138 can include a transition metal, such as Zr, Hf, Yb, Y, Er, Ce, Sc, and a combination thereof. For effective and complete thermal decomposition of dopant source layer 138, dopant source layer 138 can be deposited with a thickness ranging from about 0.05 nm to about 0.5 nm.

In some embodiments, the deposition of nWFM layer 136 can include depositing a metal with a work function value closer to a conduction band-edge energy than a valence band-edge energy of the material of HD n-type layer 111N of S/D region 108N using a CVD process or an ALD process at a temperature ranging from about 300° C. to about 500° C. For example, nWFM layer 136 can include a metal with a work function value less than 4.5 eV (e.g., about 3.5 eV to about 4.4 eV), which can be closer to the conduction band energy 4.1 eV of Si or 3.8 eV of SiGe than the valence band energy 5.2 eV of Si or 4.8 eV of SiGe of HD n-type layer 111N. In some embodiments, nWFM layer 136 can include Ti, Ta, Mo, Zr, Hf, Sc, Y, Ho, Tb, Gd, Lu, Dy, Er, Yb, or a combination thereof.

In some embodiments, the formation of doped nWFM silicide layers 132N-132P can include sequential operations of (i) performing a cleaning process (e.g., fluorine-based dry etching process) on the structures of FIGS. 14A-14D, 15A-15D, or 16A-16D, instead of FIGS. 13A-13D, (ii) depositing dopant source layer 138 on the cleaned structures of FIGS. 14A-14D, 15A-15D, or 16A-16D, and (iii) depositing nWFM layer 136 on dopant source layer 138. Performing these operations on (i) the structures of FIGS. 14A-14D can result in the formation of S/D contact structures 120N-120P (shown in FIGS. 2A-4D) without third liners 140N-140P, (ii) the structures of FIGS. 15A-15D can result in the formation of S/D contact structures 120N-120P (shown in FIGS. 5A-5D) without third liners 140N-140P, and (iii) the structures of FIGS. 16A-16D can result in the formation of S/D contact structures 120N-120P, as shown in FIGS. 5A-5D.

Referring to FIG. 6, in operation 635, a high temperature annealing process is performed. For example, a thermal annealing process can be performed on the structures of FIGS. 19A-19D in a $N_2$ ambient at a temperature ranging from about 500° C. to about 800° C. using a rapid thermal annealing (RTA) process, a spike annealing process, or a laser annealing process for a time period ranging from about 100 nanoseconds to about 100 microseconds. After the thermal annealing process, the dopant atoms can have concentration profile 250 across lines E-E (FIGS. 19A and 19C) and concentration profile 256 across lines F-F (FIGS. 19B and 19D) if the dopant atoms in nWFM silicide layers 132N-132P include a non-Zr-based transition metal, as described with reference to FIGS. 2A-2F. On the other hand, if the dopant atoms include Zr metal, the structures of FIGS. 20A-20D can be formed with Zr concentration profile 358 across lines G-G, as described with reference to FIGS. 3A-3E, after the thermal annealing process is performed on the structures of FIGS. 19A-19D. The thermal annealing process can improve the quality of nWFM silicide layers 132N and pWFM silicide layer 131 and interfaces 132N-110N and 131-110P, and as a result, reduce contact resistance between nWFM silicide layer 132N and S/D region 108N and between pWFM silicide layer 131 and S/D region 108P.

In some embodiments, a nitride capping layer (not shown) can be formed on the structures of FIGS. 19A-19D after the formation of nWFM silicide layers 132N-132P and prior to the thermal annealing process. The nitride capping layer can form nitride capping layers 146N-146P in subsequent processing, as shown in FIGS. 4A-4D. The formation of nitride capping layer can include depositing a layer of metal, such as Ti or Ta on the structures of FIGS. 19A-19D and performing a nitridation process using ammonia ($NH_3$) gas on the layer of metal.

Referring to FIG. 6, in operation 640, contact plugs are formed within the first and second contact openings. For example, as shown FIGS. 21A-21D, contact plugs 134N-134P are formed within contact openings 1020N-1020P. The formation of contact plugs 134N-134P can include filling contact openings 1020N-1020P in the structures of FIGS. 19A-19D with a conductive material and performing a CMP process to form the structures of FIGS. 21A-21D. The CMP process can substantially coplanarize top surfaces of contact structures 120N-120P with the top surface of ILD layer 118B.

Figure 22B:
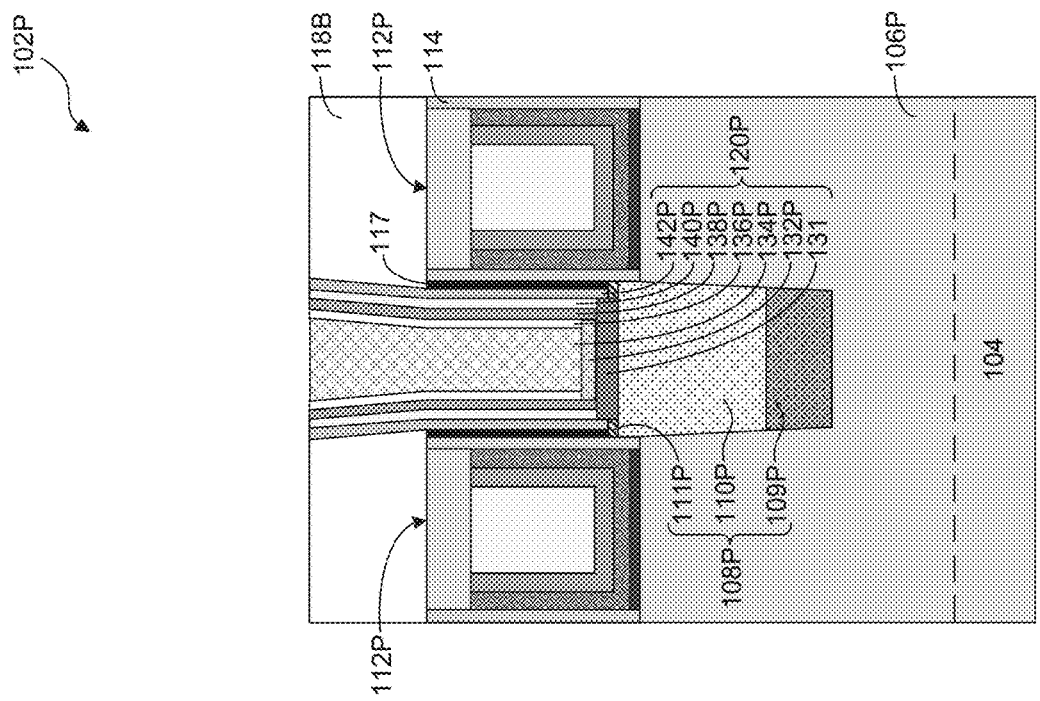
Figure 22A:
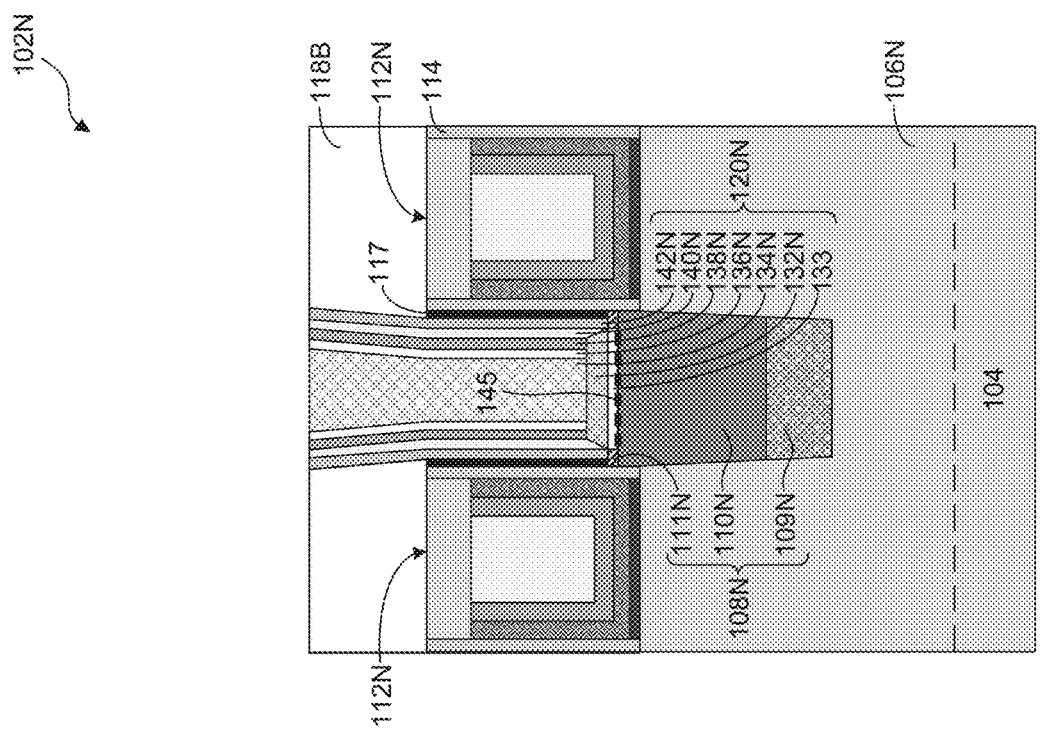

In some embodiments, contact plugs 134N-134P can be formed by filling contact openings 1020N-1020P in the structures of FIGS. 20A-20D, instead of FIGS. 19A-19D, followed by the CMP process to form the structures of FIGS. 22A-22B. In some embodiments, pWFM layer 140, dopant source layer 138, and nWFM layer 136 can be removed from the structures of FIGS. 19A-19D prior to filling contact openings 1020N-1020P with the conductive material and performing the CMP process to form the structures of FIGS. 23A-23D.

The present disclosure provides example semiconductor devices (e.g., semiconductor device 100) with NFETs (e.g., NFET 102N) and PFETs (e.g., PFET 102P) having source/drain (S/D) contact structures different from each other and provides example methods of forming such NFETs and PFETs on the same substrate with reduced contact resistance between S/D regions and S/D contact structures. The example method forms arrays of n- and p-type S/D regions on fin structures of NFETs and PFETs. In some embodiments, since the NFET and PFET S/D regions (e.g., S/D regions 108N-108P) are formed with respective n- and p-type materials, the NFET and PFET S/D contact structures (e.g., contact structures 120N-120P) are formed with silicide layers different from each other to reduce the contact resistances between the S/D contact structures and the different materials of the S/D regions.

In some embodiments, the NFET S/D contact structures are formed with nWFM silicide layers (e.g., nWFM silicide layer 132N) that have a work function value closer to a conduction band energy than a valence band energy of the n-type S/D regions. In contrast, the PFET S/D contact structures are formed with pWFM silicide layers (e.g., pWFM silicide layer 131) that have a work function value closer to a valence band energy than a conduction band energy of the p-type S/D regions. In some embodiments, dipole layers (e.g., dipole layer 144) can be selectively formed at interfaces between the S/D regions and the nWFM silicide layers of NFETs to further reduce the SBHs between the n-type S/D regions and the S/D contact structures. The dipole layers can be formed by doping the nWFM silicide layers with metals having electronegativity values lower than the metals of the nWFM silicide layers. The metal dopants can induce the formation of dipoles between the metal dopants and the semiconductor elements of the n-type S/D regions. Such selective formation of silicide layers and dipole layers in the semiconductor devices can reduce the contact resistances of the semiconductor devices by about 50% to about 70% compared to semiconductor devices with the same NFET and PFET silicide layers and without dipole layers, and consequently improve the performance of the semiconductor devices.

In some embodiments, a semiconductor device includes a substrate, first and second fin structures disposed on the substrate, first and second gate structures disposed on the first and second fin structures, respectively, first and second source/drain (S/D) regions disposed adjacent to the first and second gate structures on the first and second fin structures, respectively, first and second contact structures disposed on the first and second S/D regions, respectively, and a dipole layer disposed at an interface between the first nWFM silicide layer and the first S/D region. The first contact structure includes a first n-type work function metal (nWFM) silicide layer disposed on the first S/D region and a first contact plug disposed on the first nWFM silicide layer. The second contact structure includes a p-type work function metal (pWFM) silicide layer disposed on the second S/D region, a second nWFM silicide layer disposed on the pWFM silicide layer, and a second contact plug disposed on the pWFM silicide layer.

In some embodiments, a semiconductor device includes first and second gate structures disposed on first and second fin structures, respectively, an n-type source/drain (S/D) region and a p-type S/D region disposed on the first fin structure and the second fin structure, respectively, first and second contact structures disposed on the n-type and p-type S/D regions, respectively, and a dipole layer disposed at an interface between the ternary compound layer and the n-type S/D region. The first contact structure includes a ternary compound layer disposed on the n-type S/D region, a first n-type work function metal (nWFM) silicide layer disposed on the ternary compound layer, and a first contact plug disposed on the first nWFM silicide layer. The second contact structure includes a p-type work function metal (pWFM) silicide layer disposed on the second S/D regions, a second nWFM silicide layer disposed on the pWFM silicide layer, and a second contact plug disposed on the pWFM silicide layer.

In some embodiments, a method includes forming first and second fin structures on a substrate, forming first and second source/drain (S/D) regions on the first and second fin structures, respectively, forming first and second contact openings on the first and second S/D regions, respectively, selectively forming a p-type work function metal (pWFM) silicide layer on the second S/D region, forming a doped n-type work function metal (nWFM) silicide layer on the pWFM silicide layer and on the first S/D region, forming a ternary compound layer between the doped nWFM silicide layer and the first S/D region, and forming first and second contact plugs within the first and second contact openings.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   first and second fin structures disposed on the substrate;
   first and second gate structures disposed on the first and second fin structures, respectively;
   first and second source/drain (S/D) regions disposed adjacent to the first and second gate structures on the first and second fin structures, respectively;
   first and second contact structures disposed on the first and second S/D regions, respectively,
   wherein the first contact structure comprises a first n-type work function metal (nWFM) silicide layer disposed on the first S/D region and a first contact plug disposed on the first nWFM silicide layer, and
   wherein the second contact structure comprises a p-type work function metal (pWFM) silicide layer disposed on the second S/D region, a second nWFM silicide layer disposed on the pWFM silicide layer, and a second contact plug disposed on the pWFM silicide layer; and
   a dipole layer disposed at an interface between the first nWFM silicide layer and the first S/D region.

2. The semiconductor device of claim 1, wherein the dipole layer comprises a dopant atom of the first nWFM silicide layer and a semiconductor atom of the first S/D region.

3. The semiconductor device of claim 1, wherein the first nWFM silicide layer comprises dopants of a transition metal, and wherein the dopants have a concentration profile with a peak concentration at the interface between the first nWFM silicide layer and the first S/D region.

4. The semiconductor device of claim 1, wherein the first nWFM silicide layer comprises metal dopants with an electronegativity value smaller than an electronegativity value of a metal in a metal silicide of the first nWFM silicide layer.

5. The semiconductor device of claim 1, wherein the first and second nWFM silicide layers are doped with a transition metal.

6. The semiconductor device of claim 1, wherein the first nWFM silicide layer is doped with a transition metal and the second nWFM silicide layer is undoped.

7. The semiconductor device of claim 1, wherein the first and second contact structures further comprise first and second liners along sidewalls of the first and second contact plugs, respectively, and
wherein the first and second liners comprise a metal or an oxide of a metal of the dipole layer.

8. The semiconductor device of claim 1, wherein the first and second contact structures further comprise first and second liners along sidewalls of the first and second contact plugs, respectively, and
wherein the first and second liners comprise a metal or an oxide of a metal of the first nWFM silicide layer.

9. The semiconductor device of claim 1, wherein the first and second contact structures further comprise first and second liners along sidewalls of the first and second contact plugs, respectively, and
wherein the first and second liners comprise a metal or an oxide of a metal of the pWFM silicide layer.

10. The semiconductor device of claim 1, wherein the first and second contact structures further comprise first and second capping layers disposed on the first and second nWFM silicide layers, respectively.

11. A semiconductor device, comprising:
first and second gate structures disposed on first and second fin structures, respectively;
an n-type source/drain (S/D) region and a p-type S/D region disposed on the first fin structure and the second fin structure, respectively;
first and second contact structures disposed on the n-type and p-type S/D regions, respectively,
wherein the first contact structure comprises a ternary compound layer disposed on the n-type S/D region, a first n-type work function metal (nWFM) silicide layer disposed on the ternary compound layer, and a first contact plug disposed on the first nWFM silicide layer, and
wherein the second contact structure comprises a p-type work function metal (pWFM) silicide layer disposed on the p-type S/D regions, a second nWFM silicide layer disposed on the pWFM silicide layer, and a second contact plug disposed on the pWFM silicide layer; and
a dipole layer disposed at an interface between the ternary compound layer and the n-type S/D region.

12. The semiconductor device of claim 11, wherein the ternary compound layer comprises a zirconium-based ternary compound.

13. The semiconductor device of claim 11, wherein the dipole layer comprises a metal atom of the ternary compound layer and a semiconductor atom of the n-type S/D region.

14. The semiconductor device of claim 11, wherein the first and second nWFM silicide layers are doped with a transition metal.

15. The semiconductor device of claim 11, wherein the first nWFM silicide layer is doped with a transition metal and the second nWFM silicide layer is undoped.

16. The semiconductor device of claim 11, wherein the first and second contact structures further comprise first and second liners along sidewalls of the first and second contact plugs, respectively, and
wherein the first and second liners comprise a metal of the dipole layer, the pWFM silicide layer, or the first nWFM silicide layer.

17. A method, comprising:
forming first and second fin structures on a substrate;
forming first and second source/drain (S/D) regions on the first and second fin structures, respectively;
forming first and second contact openings on the first and second S/D regions, respectively;
selectively forming a p-type work function metal (pWFM) silicide layer on the second S/D region;
forming a doped n-type work function metal (nWFM) silicide layer on the pWFM silicide layer and on the first S/D region;
forming a ternary compound layer between the doped nWFM silicide layer and the first S/D region; and
forming first and second contact plugs within the first and second contact openings.

18. The method of claim 17, wherein the forming the doped nWFM silicide layer comprises depositing a dopant source layer on the first S/D region and on the pWFM silicide layer, and
wherein the dopant source layer comprises a metal with an electronegativity value smaller than an electronegativity value of a metal in a metal silicide of the doped nWFM silicide layer.

19. The method of claim 17, wherein the forming the ternary compound layer comprises:
depositing a zirconium-based dopant source layer on the first S/D region and on the pWFM silicide layer;
depositing an nWFM layer on the dopant source layer; and
performing an annealing process.

20. The method of claim 17, further comprising depositing a nitride capping layer on the doped nWFM silicide layer.

* * * * *